United States Patent
Chen et al.

(10) Patent No.: US 11,705,511 B2
(45) Date of Patent: Jul. 18, 2023

(54) METAL-INSULATOR-SEMICONDUCTOR TRANSISTORS WITH GATE-DIELECTRIC/SEMICONDUCTOR INTERFACIAL PROTECTION LAYER

(71) Applicant: The Hong Kong University of Science and Technology, Hong Kong (CN)

(72) Inventors: Jing Chen, Hong Kong (CN); Mengyuan Hua, Hong Kong (CN)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 1157 days.

(21) Appl. No.: 16/325,711

(22) PCT Filed: Aug. 16, 2017

(86) PCT No.: PCT/CN2017/097646
§ 371 (c)(1),
(2) Date: Feb. 14, 2019

(87) PCT Pub. No.: WO2018/036413
PCT Pub. Date: Mar. 1, 2018

(65) Prior Publication Data
US 2021/0351287 A1    Nov. 11, 2021

Related U.S. Application Data

(60) Provisional application No. 62/494,813, filed on Aug. 22, 2016.

(51) Int. Cl.
*H01L 29/778*    (2006.01)
*H01L 29/40*    (2006.01)
(Continued)

(52) U.S. Cl.
CPC ........ *H01L 29/7786* (2013.01); *H01L 29/401* (2013.01); *H01L 29/4236* (2013.01);
(Continued)

(58) Field of Classification Search
CPC .................. H01L 29/7786; H01L 29/7787
See application file for complete search history.

(56) References Cited

U.S. PATENT DOCUMENTS 8,987,091 B2    3/2015    Then et al.
9,214,539 B2    12/2015    Chiu et al.
(Continued)

FOREIGN PATENT DOCUMENTS

| CN | 104011867 A | 8/2014 |
| CN | 104051458 A | 9/2014 |
| CN | 104078505 A | 10/2014 |

OTHER PUBLICATIONS

Liu, S. "Al2O3/AlN/GaN MOS-Channel-HEMTs With an AlN Interfacial Layer" IEEE Electron Dev. Let. vol. 35, No. 7, Jul. 2014 pp. 723-725 (Year: 2014).*
(Continued)

*Primary Examiner* — Grant S Withers
(74) *Attorney, Agent, or Firm* — Amin, Turocy & Watson, LLP

(57) ABSTRACT

Structures, devices and methods are provided for forming an interface protection layer (204) adjacent to a fully or partially recessed gate structure (202) of a group III nitride, a metal-insulator-semiconductor high-electron-mobility transistor (MIS-HEMT) device or a metal-insulator-semiconductor field-effect transistor (MIS-FET) device, and forming agate dielectric (114) disposed the interface protection layer (204).

29 Claims, 40 Drawing Sheets

(51) Int. Cl.
*H01L 29/423* (2006.01)
*H01L 29/66* (2006.01)

(52) U.S. Cl.
CPC .. *H01L 29/42356* (2013.01); *H01L 29/42364* (2013.01); *H01L 29/66462* (2013.01)

(56) References Cited

U.S. PATENT DOCUMENTS

| | | | |
|---|---|---|---|
| 9,508,822 | B2 | 11/2016 | Oka et al. |
| 9,530,878 | B2 | 12/2016 | Then et al. |
| 2004/0021152 | A1 | 2/2004 | Nguyen et al. |
| 2012/0161153 | A1* | 6/2012 | Yumoto .............. H01L 29/4236 438/589 |
| 2014/0077266 | A1 | 3/2014 | Ramdani et al. |
| 2014/0291775 | A1* | 10/2014 | Oka .................... H01L 29/7835 257/411 |
| 2015/0171205 | A1 | 6/2015 | Then et al. |
| 2015/0279982 | A1* | 10/2015 | Yamamoto ........ H01L 29/42368 438/172 |
| 2016/0133738 | A1 | 5/2016 | Chang et al. |
| 2016/0293596 | A1 | 10/2016 | Fareed et al. |
| 2017/0047409 | A1* | 2/2017 | Iizuka ................... H01L 29/778 |

OTHER PUBLICATIONS

Leskla, M. "Atomic layer deposition (ALD): from precursors to thin film structures" Thin Solid Films 409, Issue 1, Apr. 22, 2002, pp. 138-146 (Year: 2002).*
Wei, J. "Enhancement-Mode GaN Double-Channel MOS-HEMT with Low On-Resistance and Robust Gate Recess" 2015 IEEE Int. Elect. Dev. Meeting (IEDM) Feb. 18, 2016 pp. 225-228 (Year: 2015).*
Liu, S. "Al2O3/AlN/GaN MOS-Channel-HEMTs with an AlN Interfacial Layer" IEEE Elec. Dev. Lett. vol. 35, No. 7 May 29, 2014 pp. 723-725 (Year: 2014).*
International Search Report for PCT Application No. PCT/CN2017/097646, dated Nov. 17, 2017, 2 pages.
Oka et al., "AlGaN/GaN Recessed MIS-Gate HFET With High-Threshold-Voltage Normally-Off Operation for Power Electronics Applications", IEEE Electron Device Letters, vol. 29,No. 7, Jul. 7, 2008, pp. 668-670.
Kashiwagi et al., "Recessed-Gate Enhancement-Mode GaN MOSFETs With a Double-Insulator Gate Providing 10-MHz Switching Operation", IEEE Electron Device Lett., vol. 34, No. 9, Sep. 2013, pp. 1109-1111.
Balogh, Laszlo, "Design and Application Guide for High Speed MOSFET Gate Drive Circuits", presented at the Texas Instruments/Unitrode Corporation, PowerSupply Design Seminar, SEM, 2001, 37 Pages.
Wu et al.,"Forward Bias Gate Breakdown Mechanism in Enhancement-Mode p-GaN Gate AlGaN/GaN High-Electron Mobility Transistors", IEEE Electron Device Letters, Oct. 2015, 3 pages.
"650V enhancement mode GaN transistor Preliminary Datasheet", GS66508P,2009-2015, 8 Pages.

"Enhancement Mode Power Transistor", EPC2015, Jan. 2013, 6 Pages.
Hua et al., "GaN-Based Metal-lnsulator-Semiconductor High-Electron-Mobility Transistors Using Low-Pressure Chemical Vapor Deposition SiNx as Gate Dielectric",IEEE Electron Device Letters., vol. 36, No. 5, May 2015, pp. 448-450.
Rossetto et al., "Time-Dependent Failure of GaN-on-Si Power HEMTs With p-GaN Gate", IEEE Trans. Electron Devices, vol. 63, No. 6, Jun. 2016 pp. 2334-2339.
Zhang et al., "Fabrication of normally-off AlGaN/GaN metal-insulator-semiconductor high-electron-mobility transistors by photo-electrochemical gate recess etching in ionic liquid", Appl. Phys. Express, vol. 9, No. 8, Aug. 2016, 4 pages.
Shi et al., "Normally OFF GaN-on-Si MIS-HEMTs Fabricated With LPCVD-SiNx Passivation and High-Temperature Gate Recess", IEEE Transactions on Electron Devices, vol. 63, No. 2, Feb. 2016, pp. 614-619.
Lin et al. "A GaN HEMT Structure Allowing Self-Terminated, Plasma-Free Etching for High-Uniformity, High-Mobility Enhancement-Mode Devices", IEEE Electron Device Lett., vol. 37, No. 4, Apr. 2016, pp. 377-380.
Choi et al., "High-Voltage and Low-Leakage-Current Gate Recessed Normally-Off GaN MIS-HEMTs With Dual Gate Insulator Employing PEALD-/RF-Sputtered-HfO2", IEEE Electron Device Lett., vol. 35, No. 2, Feb. 2014, pp. 175-177.
Wu et al., "The Impact of the gate Dielectric Quality in Developing Au-free D-mode and E-mode Recessed Gate AlGaN/GaN Transistors on a 200mm Si Substrate", in 2015 IEEE 27th International Symposium on Power Semiconductor Devices IC's (ISPSD), 2015, pp. 225-228.
Huang et al., "High Uniformity Normally-OFF GaN MIS-HEMTs Fabricated on Ultra-Thin-Barrier AlGaN/GaN Heterostructure", IEEE Electron Device Lett., vol. 37, No. 12, Dec. 2016, pp. 1617-1620.
Hua et al., "Integration of LPCVD-SiNx Gate Dielectric with Recessed-gate E-mode GaN MIS-FETs: Toward High Performance, High Stability and Long TDDB Lifetime", 2016, 4 pages.
Hua et al., "TDDB and PBTI Characterizations of Fully-recessed E-mode GaN MIS-FETs with LPCVD-SiNx/PECVD-SiNx Gate Dielectric Stack", CS MANTECH 2017, USA, May 2017, 4 Pages.
Hua et al., "High-Performance Fully-recessed Enhancement-recessed Enhancement-Mode GaN MIS-FETs with Crystalline Oxide Interlayer", Int. Symp. on Power Semiconductor Devices and Ics, May 2017, 4 Pages.
Hua et al., "Normally-Off LPCVD-SiNx GaN MIS-FET with Crystalline Oxidation Interlayer", IEEE Electron Device Letter, May 2017, 4 pages.
Miao et al., "Oxidation and the origin of the two-dimensional electron gas in AlGaN/GaN heterostructures", Journal of applied Physics, vol. 107, 123713, 2010, 11 Pages.
Wu et al., Time Dependent Dielectric Breakdown (TDDB) Evaluation of PE-ALD SiN gate dielectrics on AlGaN/GaN recessed gate D-mode MIS-HEMTs and E-mode MIS-FETs, 6 pages, published Jun. 1, 2015.
"Enhancement Mode Power Transistor", EPC8004, 2015, 6 Pages.

* cited by examiner

METAL-INSULATOR-SEMICONDUCTOR TRANSISTORS WITH GATE-DIELECTRIC/SEMICONDUCTOR INTERFACIAL PROTECTION LAYER

RELATED APPLICATION

This application is a U.S. National Stage filing under 35 U.S.C. § 371 of international patent cooperation treaty (PCT) application No. PCT/CN2017/097646, filed Aug. 16, 2017, and entitled "METAL-INSULATOR-SEMICONDUCTOR TRANSISTORS WITH GATE-DIELECTRIC/SEMICONDUCTOR INTERFACIAL PROTECTION LAYER", which applications claim priority to U.S. Provisional Patent Application Ser. No. 62/494,813, filed on Aug. 22, 2016, and entitled INTERFACIAL PROTECTION TECHNIQUES FOR GAN POWER METAL-INSULATOR-SEMICONDUCTOR FIELD-EFFECT TRANSISTORS, the entireties of which applications are hereby incorporated by reference herein.

TECHNICAL FIELD

The subject disclosure is directed to metal-insulator-semiconductor transistors and, more specifically, to structures, devices, and methods for creating an interfacial protection layer in metal-insulator-semiconductor transistors.

BACKGROUND

Group III-nitride (III-N) compound semiconductor materials, (e.g., GaN, etc.) comprise wide energy bandgap, high breakdown electrical field, and high thermal conductivity. In addition, typical wide-bandgap heterostructure systems, such as those incorporating AlGaN/GaN heterostructures, enhanced by the spontaneous and piezoelectric polarization effects, yield two-dimensional electron gas (2DEG) channels with a high sheet charge concentration and high electron mobility. Accordingly, group III-N-based devices, such as GaN-based devices, for example, can provide enhancement-mode metal-insulator-semiconductor (MIS-) field-effect transistors (FETs) for high-performance power conversion systems.

GaN metal-insulator-semiconductor (MIS-) field-effect transistor (FET) with fully recessed gate (e.g., with the barrier layer completely removed) shows promise for high-frequency power switching applications for its enhancement-mode (E-mode) operation, and its capability in providing large forward gate voltage swing, which enables strong immunity to large positive voltage overshoot spikes. By partially recessing the barrier layer at the gate foot area of a recessed gate structure a conventional GaN MIS-HEMTs (high-electron-mobility transistors) can be transformed from depletion-mode to enhancement-mode (E-mode), which is preferred for fail-safe operation and simpler gate control and driver configuration. To suppress gate leakage current, a gate dielectric can be formed between the gate electrode and the semiconductor or channel layer under gate electrode, and a large conduction band offset between gate dielectric and the semiconductor or channel layer can suppress gate leakage.

However, despite desirable enhanced gate swing and lower gate leakage, commercialization of recessed-gate E-mode III-N MIS-FET has been hindered due to concerns over complications regarding voltage stability and gate dielectric reliability. It is difficult for conventional gate dielectric deposition processes such as plasma-enhanced atomic layer deposition (PEALD) or plasma-enhanced chemical vapor deposition (PECVD) to pass reliability tests and qualifications.

Conventional commercialized enhancement-mode GaN devices features p-type GaN layer on top of AlGaN/GaN heterojunction. The p-GaN layer can effectively raise the energy band of the heterojunction and deplete the 2DEG channel at zero gate bias, leading to E-mode operation. In high-frequency power switching circuits, the gate voltage could easily exceed the critical safe operating bias (determined by specific gate technology) in the form of gate ringing due to parasitic inductance and capacitance in the gate control loop. For p-GaN E-mode power transistors, gate stress over 10 V can result in easy gate breakdown and the safe operating gate bias range of commercial E-mode GaN power devices has been specified at 7 V, or less. Such low gate voltage headroom has imposed significant burden upon gate drive design when the switching speed is often compromised.

Typically, to provide adequate gate over-drive to overcome the positive threshold voltage shift and resultant on-resistance degradation, a relatively high forward gate bias (e.g., 5-6 V) is required. Thus, the p-GaN gate E-mode devices exhibit a small safe operating gate bias range.

The above-described deficiencies of conventional group III-N-based devices are merely intended to provide an overview of some of the problems of conventional systems and methods, and are not intended to be exhaustive. Other problems with conventional systems and corresponding benefits of the various non-limiting embodiments described herein may become further apparent upon review of the various non-limiting embodiments of the following description.

SUMMARY

The following presents a simplified summary of the specification in order to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

Various non-limiting embodiments described herein employing an exemplary gate interface protection layer and high-temperature gate dielectric can provide exemplary metal-insulator-semiconductor (MIS-) field-effect transistors (FETs) or MIS-HEMTs (high electron mobility transistors) with low on-resistance, small hysteresis, high threshold voltage stability, and/or high gate dielectric reliability.

For example, in various embodiments, enhancement-mode group-III-nitride (III-N) (e.g., GaN, etc.) metal-insulator-semiconductor devices, such as, for example, MIS-FETs or MIS-HEMTs, incorporating a recessed gate structure (e.g., fully recessed or partially recessed) and a gate dielectric deposited at high temperature and gate interface protection methods are disclosed herein. In non-limiting aspects, by recessing the barrier layer at the gate region, exemplary MIS-FETs and/or MIS-HEMTs can be transformed from depletion-mode to enhancement-mode, which is preferred for the fail-safe operation and simpler gate control and driver configuration. In further non-limiting aspects, a high temperature gate dielectric can be formed between the gate electrode and the semiconductor under gate electrode to suppress the gate leakage current. In addition, a gate dielectric and semiconductor or channel layer having a large conduction band offset can be employed to suppress gate leakage, whereas exemplary gate interface protection methods can ensure high threshold voltage stability and high gate dielectric reliability.

Accordingly, various embodiments described herein can provide enhancement-mode III-N MIS-FET or MIS-HEMT devices with high performance, high stability, and high reliability.

In one non-limiting embodiment, the subject disclosure provides methods comprising forming an interface protection layer adjacent to a recessed gate structure (e.g., fully recessed) of a group III nitride, metal-insulator-semiconductor field-effect transistor (MIS-FET) device, and forming a gate dielectric layer disposed on the interface protection layer. In another non-limiting embodiment, the subject disclosure provides methods comprising forming an interface protection layer adjacent to a recessed gate structure (e.g., partially recessed) of a group III nitride, metal-insulator-semiconductor high-electron-mobility transistor (MIS-HEMT) device, and forming a gate dielectric layer disposed on the interface protection layer.

In other embodiments, the subject disclosure provides metal-insulator-semiconductor devices comprising a recessed gate structure (e.g., fully recessed or partially recessed), an interface protection layer (e.g., gate interface connection layer) adjacent to the recessed gate structure, and a gate dielectric layer (e.g., gate dielectric) disposed on the interface protection layer.

Further, one or more embodiments of the subject disclosure provides a semiconductor device comprising a substrate (e.g., a semiconductor substrate, a heterostructure, etc.), a buffer layer comprising a channel layer, a recessed gate (e.g., fully recessed or partially recessed) recessed into a portion of a barrier layer and the channel layer of the semiconductor device, a gate interface protection layer adjacent to the channel layer, and a gate dielectric layer disposed between gate interface protection layer and a gate electrode formed in the recessed gate.

These and other additional features of the disclosed subject matter are described in more detail below.

BRIEF DESCRIPTION OF THE DRAWINGS

The devices, structures, and methodologies of the disclosed subject matter are further described with reference to the accompanying drawings in which.

DETAILED DESCRIPTION

Overview

As used herein, acronyms are used to denote the following: Source (S), Drain (D), Gate (G), Current (I or C), Volts or Voltage (V), Resistance (R), Breakdown Voltage (BV), Transconductance ($G_m$), Length, Width, Distance, or Spacing (L or W), Relative Position or Number (X), Ohmic Contact (O), Anode or Amperes (A), Cathode, Capacitance, Celsius, etc. (C), Seconds (s), Energy or Electric Field Strength (E), Temperature (T), Time (t), as is apparent from the context. In addition, as used herein, various chemical symbols are used refer to their elements or components of a compound, including, but not limited to, aluminum nitride (AlN), gallium nitride (GaN), indium nitride (InN), silicon carbide (SiC), silicon nitrides (SiN$_x$), silicon dioxide (SiO$_2$), silicon oxynitrides (SiN$_x$O$_y$), etc.

As described above, group III-nitride (III-N) compound semiconductor materials, (e.g., GaN, etc.) comprise wide energy bandgap, high breakdown electrical field, and high thermal conductivity. In addition, typical wide-bandgap heterostructure systems, such as those incorporating AlGaN/GaN heterostructures, enhanced by the spontaneous and piezoelectric polarization effects, yields two-dimensional electron gas (2DEG) channels with a high sheet charge concentration and high electron mobility. Accordingly, group III-N-based devices, such as GaN-based devices, for example, can provide enhancement-mode metal-insulator-semiconductor (MIS-) field-effect transistors (FETs) and/or metal-insulator-semiconductor high-electron-mobility transistor (MIS-HEMT) for high-performance power conversion systems.

Figure 1:
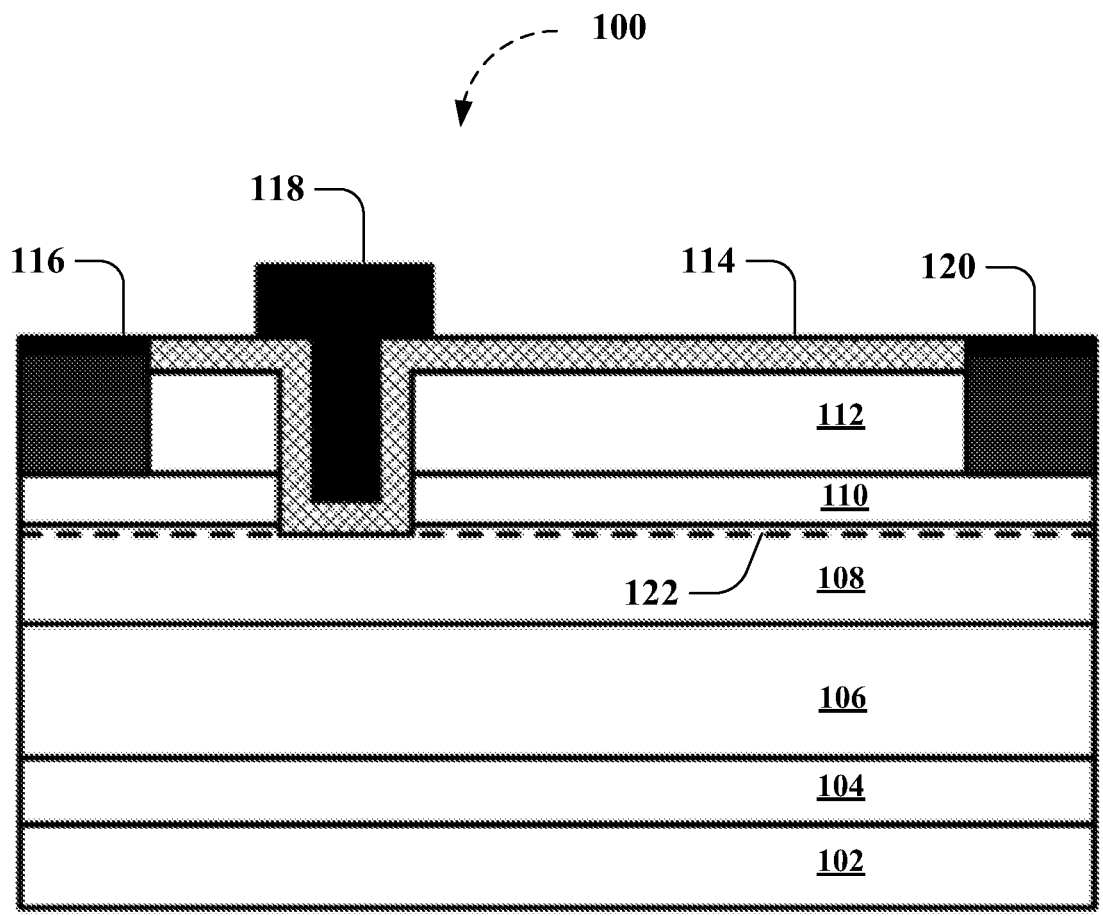
FIG. 1 depicts a conventional III-nitride enhancement mode (E-mode), low-pressure chemical vapor disposition, (LPCVD)-silicon nitride ($SiN_x$) metal-insulator-semiconductor, field effect transistor (MIS-FET) having an exemplary recessed barrier under the gate, without an interfacial protection layer, in which various aspects described herein can be implemented.

For example, FIG. 1 depicts a conventional III-nitride E-mode LPCVD-SiN$_x$ MIS-FET 100 having an exemplary recessed barrier under the gate, without an interfacial protection layer, in which various aspects described herein can be implemented. Exemplary devices 100 can comprise a substrate 102, a nucleation layer 104, a buffer layer 106, a semiconductor or channel layer 108, a barrier layer 110, a passivation layer 112, and a gate dielectric 114, according to various non-limiting aspects. In addition, exemplary devices 100 can comprise a gate electrode 118 formed on the gate dielectric 114, an exemplary source electrode 116 and a drain electrode 120.

As further described herein, by recessing barrier layer 110 at the gate foot area of a recessed gate structure (e.g., fully recessed) of semiconductor or channel layer 108, as shown in FIG. 1, conventional GaN MIS-FETs (field-effect transistors) can facilitate enhancement-mode operation, which is preferred for fail-safe operation and simpler gate control and driver configuration. To suppress gate leakage current, a gate dielectric 114 can be formed between the gate electrode 118 and the semiconductor or channel layer 108 under gate electrode, in a non-limiting aspect. In a further non-limiting aspect, a large conduction band offset between gate dielectric 114 and the semiconductor or channel layer 108 can suppress gate leakage.

In depletion mode (D-mode) MIS-HEMT devices, it has been shown that the GaN surface can still maintain excellent morphology after the deposition of low-pressure chemical vapor deposition (LPCVD)-SiN$_x$. However, combining highly reliable LPCVD-SiN$_x$ with recessed-gate structure (e.g., partially recessed) for E-mode GaN MIS-FET has been much more challenging. The etched GaN surface (with weakened chemical bonds at the surface) experiences stronger Ga and N out-diffusion in high-temperature ambient at the start of the LPCVD process, and suffers from significant degradation. Thus, the high-performance LPCVD-SiN$_x$ gate dielectric has not been successfully deployed in recessed-gate GaN MIS-FET devices with satisfactory performance and reliability. However, these MIS-FETs exhibit higher gate breakdown voltage (e.g., greater than 20 V) compared to ~10 V in p-GaN power devices. In addition, a high gate bias of +11 V was revealed from time-dependent dielectric breakdown (TDDB) tests for a 10-year lifetime, which is much higher than the reported value of p-GaN power transistors (e.g., less than 6.5 V).

However, despite desirable enhanced gate swing and lower gate leakage, commercialization of recessed-gate E-mode III-N MIS-FET has been hindered due to concerns over complications regarding voltage stability and gate dielectric reliability. Despite the gate leakage issue, gate swing, threshold voltage stability and gate dielectric reliability are also critical concerns for the commercialization of MIS-FETs. It is difficult for conventional gate dielectric 114 deposition processes (e.g., Al$_2$O$_3$, SiN$_x$, SiO$_2$, etc. prepared by atomic layer deposition (ALD) or plasma-enhanced atomic layer deposition (PEALD) and plasma-enhanced chemical vapor deposition (PECVD) to pass reliability test and qualifications due to relatively low film quality as a result of low deposition temperature (e.g., 300° C.)). As described herein, conventional gate dielectric deposition processes provide relatively low film quality as a result of low deposition temperature (e.g., 300 degrees Celsius (° C.)). As further described herein, high deposition temperature can provide a gate dielectric 114 with reduced trap density and high film quality. Despite a smaller band gap (5.2 electron volts (eV)) than Al$_2$O$_3$ (7 eV), SiN$_x$ has a type-II alignment with GaN that yields a conduction band offset of 2.3 eV (larger than 2.1 eV for Al$_2$O$_3$) and is a promising dielectric for n-channel GaN MIS-FET. SiN$_x$ deposited by LPCVD has shown superior performance in terms of low leakage, high breakdown electric field and long TDDB lifetime, mainly because of its high film quality as a result of its high deposition temperature (e.g., 780° C.).

Accordingly, various embodiments as described herein can employ high deposition temperature to facilitate provided gate dielectric 114 with reduced trap density and enhanced film quality. In various embodiments, exemplary gate dielectric 114 can comprise a silicon nitride film deposited using LPCVD at high temperature such as, for example, 780° C., as further described herein. However, in high-temperature ambient environments, an etched semiconductor surface (e.g., an etched GaN surface, etc.) could experience out-diffusion of atoms and suffer from significant surface degradation, leading to a rough semiconductor/gate dielectric 114 interface with high trap density. That is, in a high-temperature ambient environment, surface of the gate foot area of a recessed gate structure of semiconductor or channel layer 108 (e.g., having weakened chemical bonds at the surface) can experience stronger atomic out-diffusion and significant surface degradation.

To overcome this issue, various non-limiting embodiments of interface protection methods can provide exemplary gate interface protection layers, which can facilitate providing enhancement-mode III-N MIS-FET or MIS-HEMT devices with high performance, high stability and high reliability. Accordingly, various non-limiting embodiments of the disclosed subject matter can employ a gate interface protection layer between an exemplary gate dielectric 114, which, when deposited at high-temperature can prevent semiconductor or channel layer 108 surface roughness, as further described herein. As a result, charge carriers at this interface that would otherwise exhibit low mobility with threshold voltage instability due to the high interface trap density can be prevented. For example, without employing an exemplary gate interface protection layer as described herein, a conventional LPCVD-SiN$_x$ film employed as a gate dielectric 114 for an enhancement-mode GaN MIS-HEMT device with a partially recessed gate structure can result in large hysteresis in the threshold voltage.

Accordingly, various non-limiting embodiments described herein employing an exemplary gate interface protection layer and high-temperature gate dielectric 114 can provide exemplary MIS-FET or MIS-HEMT devices with low on-resistance, small hysteresis, high threshold voltage stability, and/or high gate dielectric reliability, while high-temperature gate dielectric 114 can facilitate providing devices with low gate leakage, high breakdown electric field, low defect density, and long time to breakdown lifetime, and while enabling seamless process integration of the high-temperature gate dielectric 114 in GaN devices having an exemplary recessed gate structure (e.g., fully recessed or partially recessed) for manufacturing enhancement-mode GaN power MIS-FETs or MIS-HEMTs. Thus, various embodiments described herein facilitate fabrication of enhancement-mode GaN power MIS-FET or MIS-HEMT devices that offer unique advantages over the current p-GaN gate devices, including improved immunity of gate ringing and simplified gate driver circuits. As a non-limiting example, exemplary GaN MIS-FET devices as described herein can facilitate providing devices having relatively lower gate leakage, larger gate swing, and higher gate dielectric reliability, compared to conventional devices.

Figure 2:
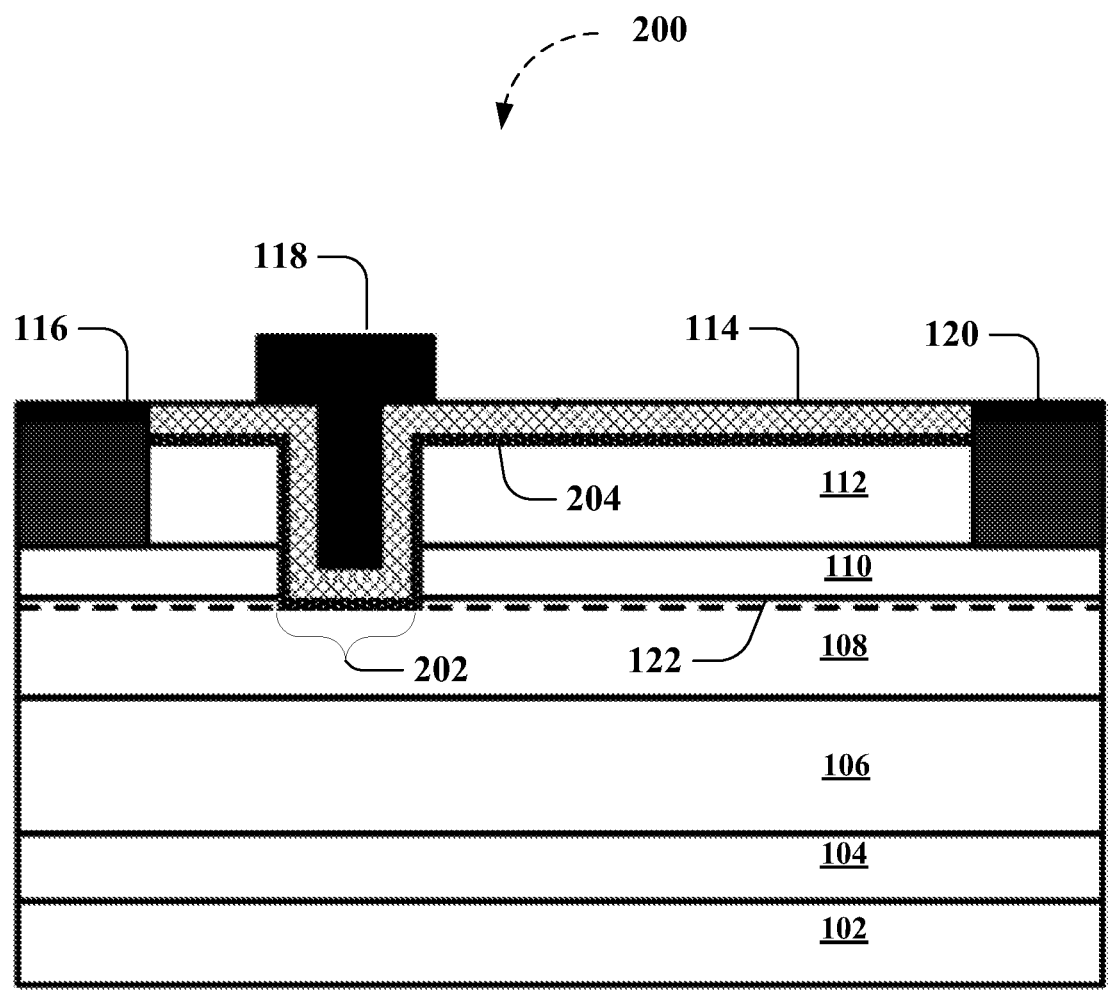
FIG. 2 depicts exemplary schematic cross section of a non-limiting LPCVD-$SiN_x$ MIS-FET comprising an exemplary first embodiment of a gate interface protection layer, having an exemplary 2 nanometer (nm), plasma-enhanced chemical vapor deposition (PECVD)-$SiN_x$ gate interface protection layer, according to various non-limiting aspects described herein.
Figure 4:
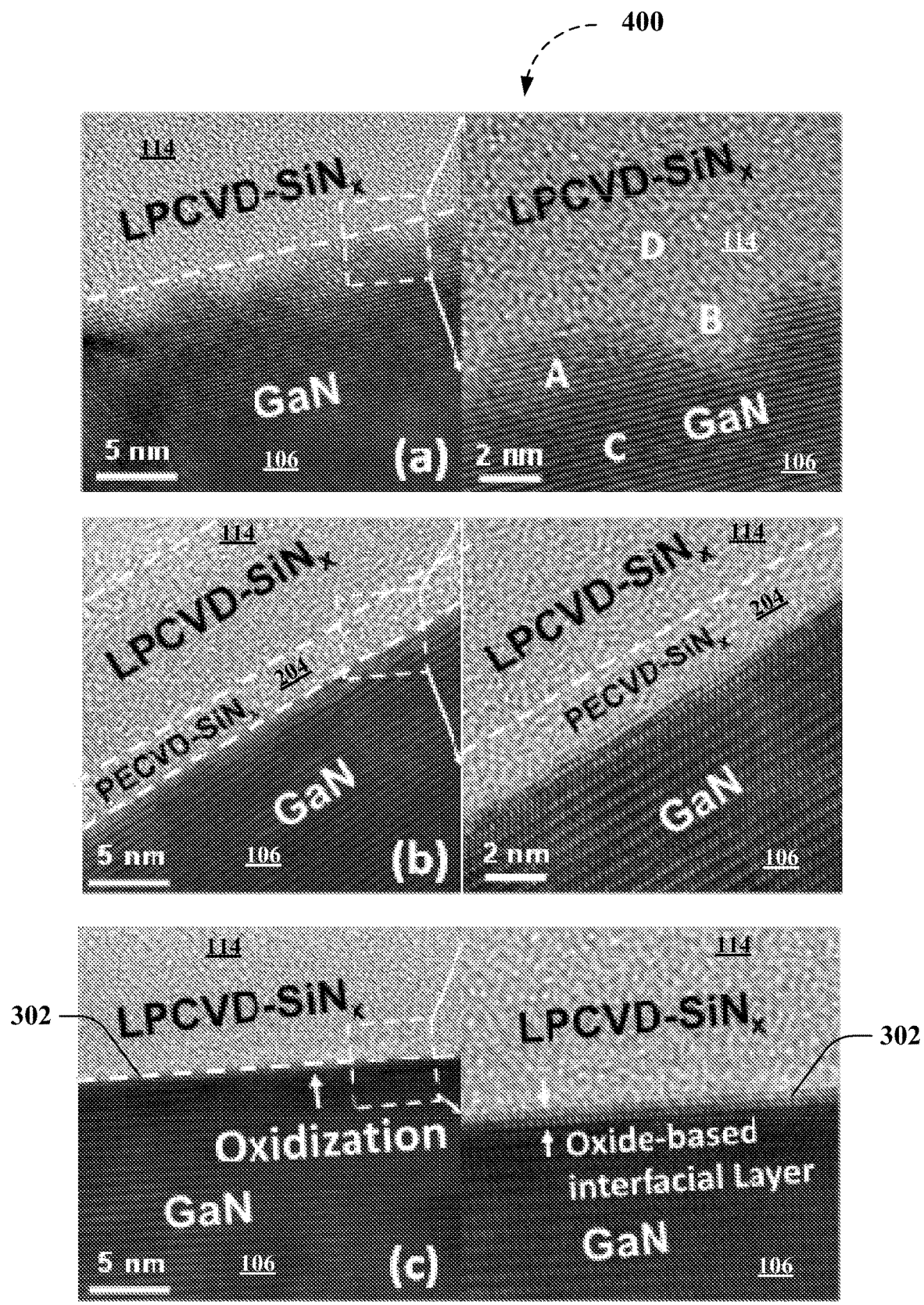
FIG. 4 depicts exemplary cross-sectional high-resolution transmission electron microscope (TEM) micrographs of gate dielectric and semiconductor structure of the exemplary LPCVD-$SiN_x$/GaN MIS-structure, without an exemplary gate interface protection layer, with an exemplary 2-nm PECVD-$SiN_x$ gate interface protection layer, and with an exemplary oxide-based gate interface protection layer, wherein an enlarged micrograph of the interface at the $SiN_x$/GaN boundary is depicted, according to further non-limiting aspects.

Thus, various disclosed embodiments can employ a gate interface protection layer as further described herein, which can protect the semiconductor or channel layer 108 from degradation at high temperature during the fabrication process. While various embodiments describe or depict recessed gate structures (e.g., fully recessed) of exemplary MIS-FET devices for the purposes of illustration, and not limitation, it is understood that disclosed techniques can be incorporated into other devices, such as for example recessed gate structures (e.g., partially recessed) of exemplary MIS-HEMT devices, as further described herein. As a non-limiting example, an exemplary starting epitaxial substrate can be employed in exemplary HEMT structures (e.g., with GaN(cap)/AlGaN/GaN heterojunction) as for MIS-FET structure, where an exemplary MIS-HEMT device can refer to a device structure with a partially recessed gate structure (e.g., a non-recessed or a partially recessed gate structure, for example, with a thin barrier layer remaining, etc.) and with a MIS-gate, while an exemplary MIS-FET device can refer to a device structure with a fully recessed gate structure (e.g., with the GaN(cap)/AlGaN removed, for example, by etching) and with a MIS-gate. Thus, various embodiments as described herein can employ an exemplary gate interface protection layer in both exemplary MIS-FET and MIS-HEMT devices. Thus, as used herein, exemplary metal-insulator-semiconductor devices can refer to exemplary MIS-FET and/or MIS-HEMT devices. For example, FIG. 2 depicts a first exemplary embodiment of a gate interface protection layer, wherein a dielectric stack under the gate electrode 118 includes forming a gate interface protection layer comprising a dielectric layer and forming a second gate dielectric 114 at high temperature. An exemplary gate interface protection layer can comprise a dielectric layer prepared in low temperature such as, for example, 300° C., to form a high quality interface (e.g., silicon nitride, etc.) prepared using plasma-enhanced chemical vapor deposition. During subsequent high-temperature processing, a gate interface protection layer comprising a dielectric layer can protect the etched surface of semiconductor or channel layer 108 from degradation. As a result, a sharp interface between a gate interface protection layer comprising a dielectric layer and semiconductor or channel layer 108 is well maintained, as depicted in FIG. 4. Note that an exemplary gate interface protection layer comprising a dielectric layer can also be further densified during the high-temperature process, according to a further non-limiting aspect.

Figure 3:
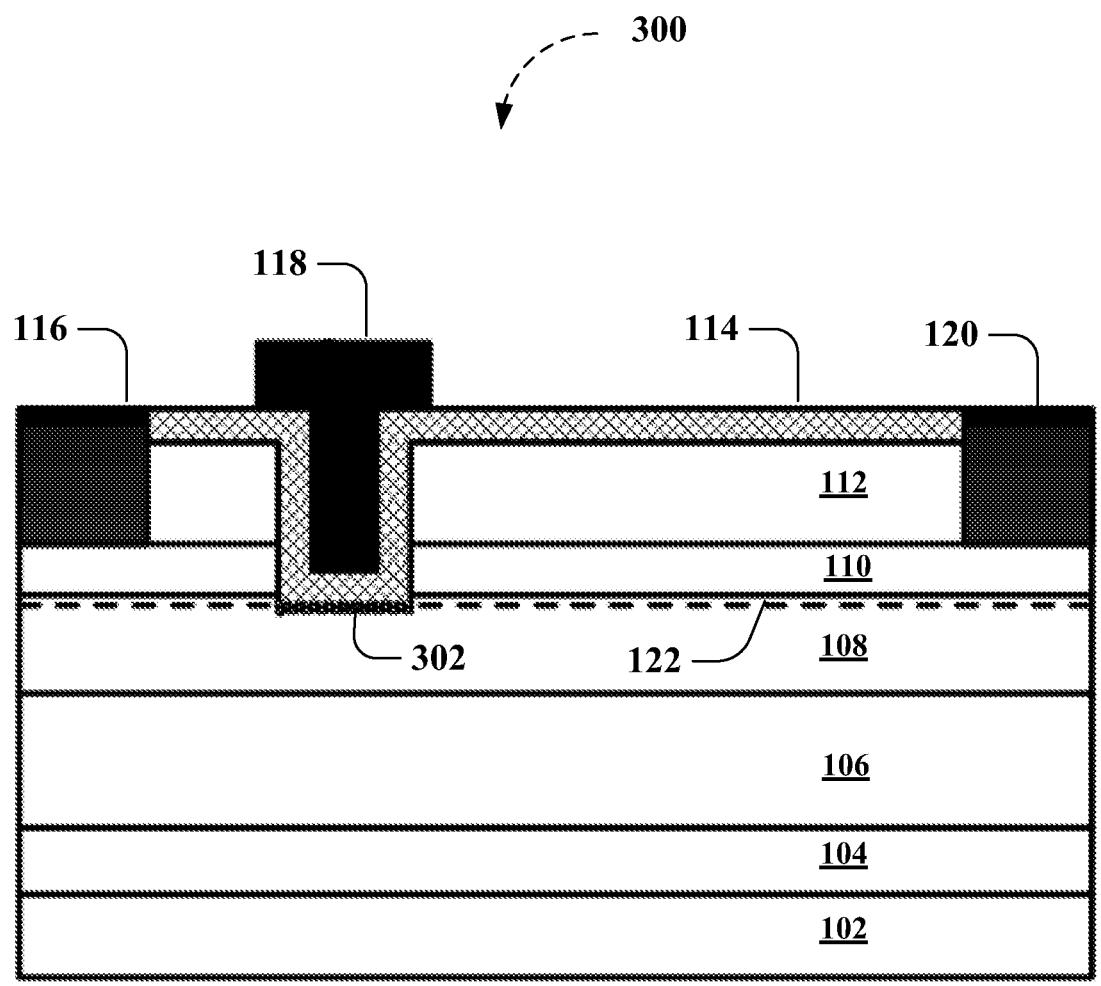
FIG. 3 depicts exemplary schematic cross section of a non-limiting LPCVD-$SiN_x$ MIS-FET comprising an exemplary second embodiment of a gate interface protection layer, having an exemplary oxide-based gate interface protection layer, according to various non-limiting aspects described herein.

As a further example, FIG. 3 depicts a second exemplary embodiment of a gate interface protection layer, wherein an exemplary dielectric stack under the gate electrode 118 can comprise a surface treatment of semiconductor or channel layer 108, annealing at high temperature, and forming gate dielectric 114. In a non-limiting aspect, a surface of the semiconductor or channel layer 108 can be oxidized by exposure to an oxygen containing gas plasma or an oxygen containing gas. During an exemplary annealing process, re-configuration near the surface of semiconductor or channel layer 108 can be facilitated by high temperature. As further described herein, an exemplary annealing process can be performed in situ (e.g., during a deposition process for gate dielectric 114 at high temperature). As a result, a stable gate interface protection layer can be formed before deposition of gate dielectric 114, which can protect semiconductor or channel layer 108 surface from decomposition.

FIG. 4 demonstrates improved interface morphology with the gate interface protection layer.

Additionally, variations of the disclosed embodiments as suggested by the disclosed structures and methodologies are intended to be encompassed within the scope of the subject matter disclosed herein. Furthermore, the various embodiments of the structures, devices, and methodologies of the disclosed subject matter can include variations in the device type, location, configuration, process, and/or process variables associated with the recessed gate structure or region (e.g., fully recessed or partially recessed), and/or location, configuration, process, and/or process variables associated with the gate interface protection layer, etc.

Exemplary Devices

FIG. 2 depicts exemplary schematic cross section of a non-limiting LPCVD-SiN$_x$ MIS-FET 200 comprising an exemplary first embodiment of a gate interface protection layer, having an exemplary 2 nanometer (nm), plasma-enhanced chemical vapor deposition (PECVD)-SiN$_x$ gate interface protection layer, according to various non-limiting aspects described herein. Exemplary devices 200 as described herein can comprise a substrate 102, a nucleation layer 104, a buffer layer 106, a semiconductor or channel layer 108, a barrier layer 110, a passivation layer 112, a gate interface protection layer 204 and a gate dielectric 114, according to various non-limiting aspects.

Exemplary substrate 102 can comprise silicon, sapphire, diamond, SiC, AlN, GaN, etc., in further non-limiting aspects. In addition, an exemplary nucleation layer 104 can comprise AlN, GaN, InN, and/or their alloys, etc. In further non-limiting aspects, an exemplary buffer layer 106 can comprise AlN, GaN, InN, and/or their alloys, etc. In still other non-limiting aspects, an exemplary semiconductor or channel layer 108 can comprise GaN, AlN, InN, and/or their alloys, etc. In non-limiting embodiments, exemplary barrier layer 110 can comprise one or more layers. For example, the barrier layer 110 can comprise AlN, GaN, InN, and/or their alloys, etc., and exemplary barrier layer 110 can comprise a stack of these layers. In yet another non-limiting aspect, one or more layer in the barrier layer 110 has a bandgap larger than the semiconductor or channel layer 108. In various non-limiting embodiments, an exemplary channel 122 can be formed at an interface between the barrier layer 110 and semiconductor or channel layer 108. Furthermore, a gate recess can be formed at the gate foot area of a recessed gate structure 202 (e.g., fully recessed or partially recessed), in various embodiments as described herein.

At the gate foot area of a recessed gate structure 202 (e.g., fully recessed or partially recessed), the barrier layer 110 can be removed, in a non-limiting aspect. In a further non-limiting aspect, a portion of the semiconductor or channel layer 108 can also be removed. Accordingly, exemplary channel 122 at the gate foot area of a recessed gate structure 202 (e.g., fully recessed or partially recessed) can comprise a metal-insulator-semiconductor channel located at the MIS interface, e.g., the interface between the gate dielectric 114 and the underlying semiconductor or channel layer 108. Gate interface protection layer 204 is formed before the formation of gate dielectric 114.

In particular, an exemplary gate interface protection layer 204 as described herein comprising a dielectric layer can be formed at a relatively low temperature, at which the surface of semiconductor or channel layer 108 has no degradation such that an interface with low trap density can be formed, in various non-limiting aspect. In addition, an exemplary gate dielectric 114 can be formed at high temperature, such as, for example, 780° C., in further non-limiting aspects. In further embodiments, an exemplary gate dielectric 114 can comprise silicon nitride deposited using low-pressure chemical vapor deposition.

In addition, an exemplary gate electrode 118 can be formed on the gate dielectric 114, such that gate electrode 118 is placed with the gate foot area of a recessed gate structure 202 (e.g., fully recessed or partially recessed) covered by the gate electrode 118. In further non-limiting aspects, an exemplary source electrode 116 and a drain electrode 120 can be formed (e.g., at opposite sides of gate electrode 118, etc.). The various embodiments of the disclosed subject matter can comprise a dielectric stack at the gate foot area of a recessed gate structure 202 (e.g., fully recessed or partially recessed) according to further non-limiting aspects. Thus, in various embodiments described herein, the interface between the gate interface protection layer 204 comprising a dielectric layer and semiconductor or channel layer 108 is protected from degradation during high temperature processing. Therefore, the electron mobility in the gate region is high and concentration of traps at the interface is low in various non-limiting embodiments described herein. As a result, the various embodiments of the disclosed subject matter can include normally off operation, low on-resistance, stable threshold voltage and a reliable gate dielectric 114.

In a further non-limiting embodiment, an exemplary device comprising an exemplary first embodiment of a gate interface protection layer 204 can comprise a 0.5 millimeter (mm) Si (111) substrate 102, a 4 micrometer (μm) GaN buffer layer 108, an AlGaN barrier layer 110, a passivation layer 112, a LPCVD-SiN$_x$ gate dielectric 114, and a 2 nm PECVD-SiN$_x$ gate interface protection layer 204.

FIG. 3 depicts exemplary schematic cross section of a non-limiting LPCVD-SiN$_x$ MIS-FET 300 comprising an exemplary second embodiment of a gate interface protection layer, having an exemplary oxide-based gate interface protection layer, according to various non-limiting aspects described herein. Exemplary devices 300 as described herein can comprise a substrate 102, a nucleation layer 104, a buffer layer 106, a semiconductor or channel layer 108, a barrier layer 110, a passivation layer 112, a gate interface protection layer 302 and a gate dielectric 114, according to various non-limiting aspects.

Exemplary substrate 102 can comprise silicon, sapphire, diamond, SiC, AlN, GaN, etc., in further non-limiting aspects. In addition, an exemplary nucleation layer 104 can comprise AlN, GaN, InN, and/or their alloys, etc. In further non-limiting aspects, an exemplary buffer layer 106 can comprise AlN, GaN, InN, and/or their alloys, etc. In still other non-limiting aspects, an exemplary semiconductor or channel layer 108 can comprise GaN, AlN, InN, and/or their alloys, etc. In non-limiting embodiments, exemplary barrier layer 110 can comprise one or more layers. For example, the barrier layer 110 can comprise AlN, GaN, InN, and/or their alloys, etc., and exemplary barrier layer 110 can comprise a stack of these layers. In yet another non-limiting aspect, one or more layer in the barrier layer 110 has a bandgap larger than the semiconductor or channel layer 108. In various non-limiting embodiments, an exemplary channel 122 can be formed at an interface between the barrier layer 110 and semiconductor or channel layer 108. Furthermore, a gate recess can be formed at the gate foot area of a recessed gate structure 202 (e.g., fully recessed or partially recessed), in various embodiments as described herein.

At the gate foot area of a recessed gate structure 202 (e.g., fully recessed or partially recessed), the barrier layer 110 can be removed, in a non-limiting aspect. In a further non-limiting aspect, a portion of the semiconductor or channel layer 108 can also be removed. Accordingly, exemplary channel 122 at the gate foot area of a recessed gate structure 202 (e.g., fully recessed or partially recessed) can comprise a metal-insulator-semiconductor channel located at the MIS interface, e.g., the interface between the gate dielectric 114 and the underlying semiconductor or channel layer 108.

In further non-limiting aspects, an exemplary gate interface protection layer 302 can be formed by surface treatment of semiconductor or channel layer 108 and/or annealing at high temperature. In non-limiting embodiments, a surface of the semiconductor or channel layer 108 in the gate foot area of a recessed gate structure 202 (e.g., fully recessed or partially recessed) can be oxidized by exposure to an oxygen containing gas plasma, an oxygen containing gas, etc. to form an oxide-based gate interface protection layer 302. In further non-limiting embodiments, after annealing, re-configuration near the surface of semiconductor or channel layer 108 can be facilitated by high temperature. As a result, a stable gate interface protection layer 302 can be formed before deposition of gate dielectric 114, which can protect the semiconductor or channel layer 108 surface from decomposition prior to gate dielectric 114 deposition. In a non-limiting aspect, an exemplary annealing process can be performed in situ, such as, for example, during a process of gate dielectric 114 formation or deposition at high temperature, e.g., 780° C. In further embodiments, an exemplary gate dielectric 114 can comprise silicon nitride deposited using low-pressure chemical vapor deposition.

In addition, an exemplary gate electrode 118 can be formed on the gate dielectric 114, such that gate electrode 118 is placed with the gate foot area of a recessed gate structure 202 (e.g., fully recessed or partially recessed) covered by the gate electrode 118. In further non-limiting aspects, an exemplary source electrode 116 and a drain electrode 120 can be formed (e.g., at opposite sides of gate electrode 118, etc.). Thus, in various embodiments described herein, the interface between the gate interface protection layer 302 and semiconductor or channel layer 108 is protected from degradation during high temperature processing. Therefore, the electron mobility in the gate region is high and concentration of traps at the interface is low in various non-limiting embodiments described herein. As a result, the various embodiments of the disclosed subject matter can include normally off operation, low on-resistance, stable threshold voltage and a reliable gate dielectric 114.

In a further non-limiting embodiment, an exemplary device comprising an exemplary second embodiment of a gate interface protection layer 302 can comprise a 0.5 millimeter (mm) Si (111) substrate 102, a 4 micrometer (μm) GaN buffer layer 108, an AlGaN barrier layer 110, a passivation layer 112, a LPCVD-SiN$_x$ gate dielectric 114, and an oxide or oxide-based interface protection layer 302.

Figure 5:
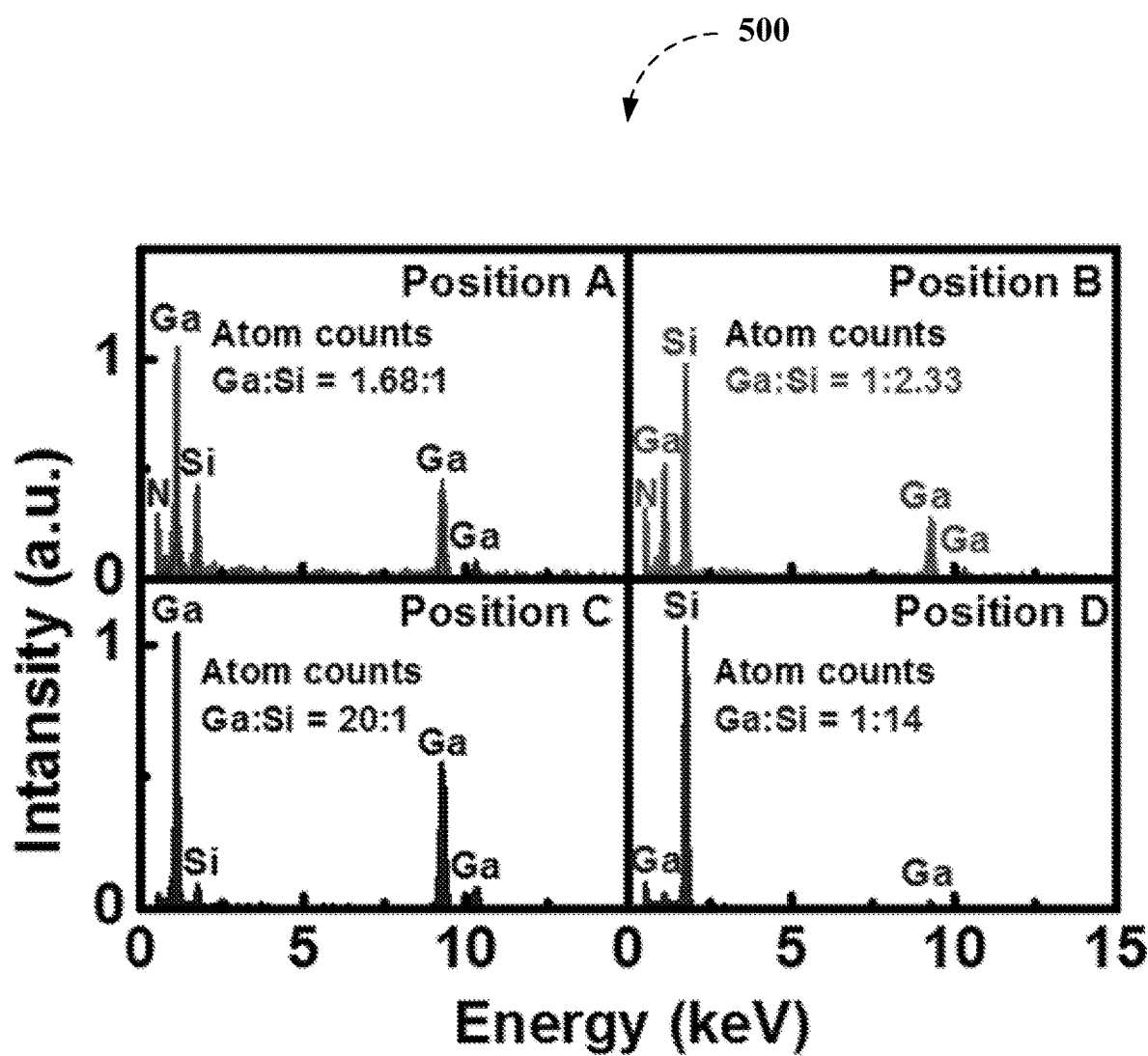
FIG. 5 depicts an exemplary energy-dispersive X-ray spectroscopy plot at position A, B, C and D shown in FIG. 4.

FIG. 4 depicts exemplary cross-sectional high-resolution transmission electron microscope (TEM) micrographs 400 of gate dielectric 114 and semiconductor structure of an exemplary LPCVD-SiN$_x$/GaN MIS-structure, without an exemplary gate interface protection layer (e.g., without exemplary gate interface protection layer 204, 302, etc.), with an exemplary 2-nm PECVD-SiN$_x$ gate interface protection layer (e.g., with exemplary gate interface protection layer 204, etc.), and with an exemplary oxide-based gate interface protection layer (e.g., with exemplary gate interface protection layer 302, etc.), wherein an enlarged micrograph of the interface at the SiN$_x$/GaN boundary is depicted, according to further non-limiting aspects. Note that the seemingly different atomic arrangement in GaN layer in panel (a) compared to (b) and (c) is due to different sidewall orientations in sample preparations. FIG. 5 depicts an exemplary energy-dispersive X-ray spectroscopy plot 500 at position A, B, C and D shown in FIG. 4.

Figure 6:
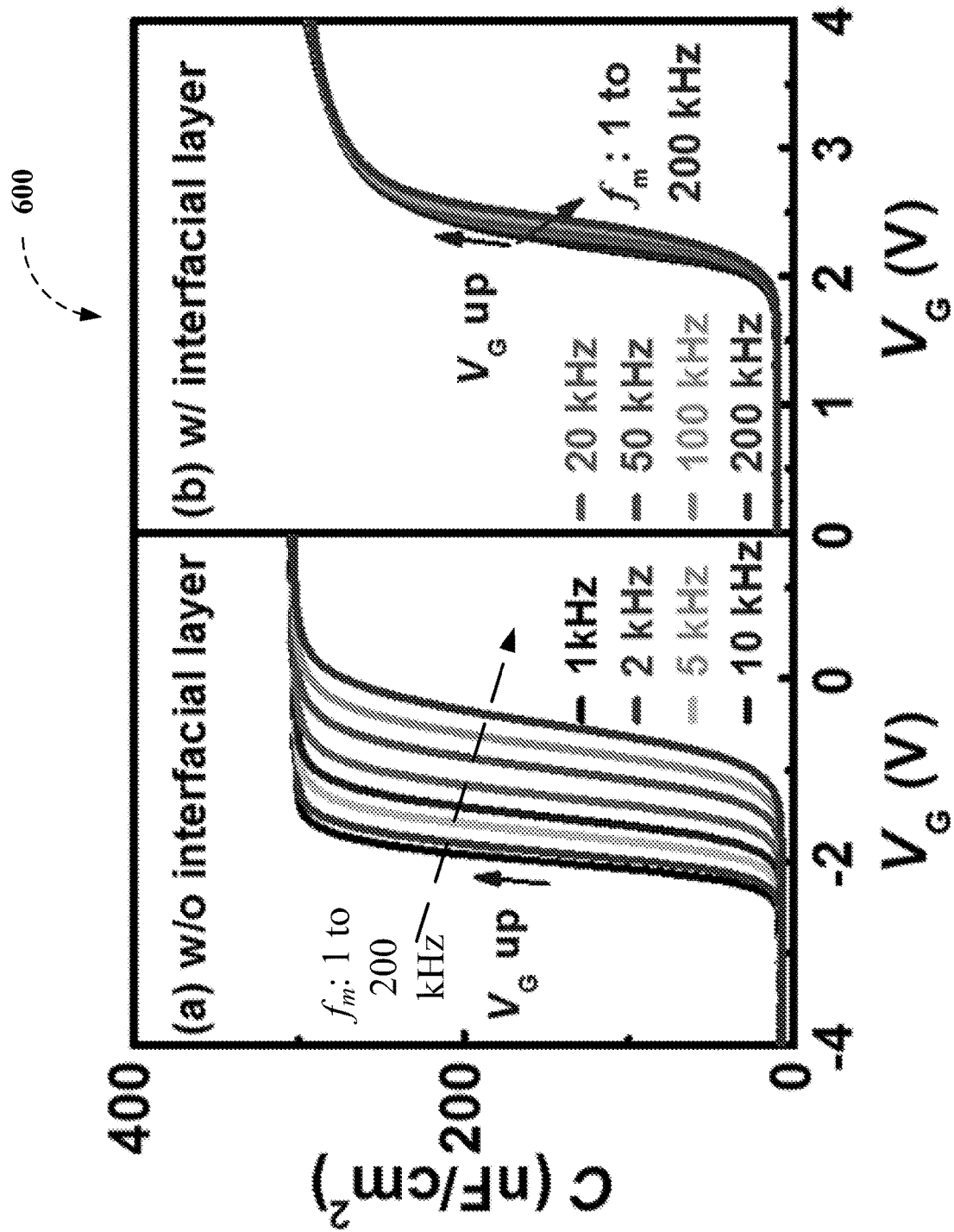
FIG. 6 demonstrates exemplary measured frequency ($f_m$)-dependent current–voltage (C–V) characteristics of LPCVD-$SiN_x$ MIS-diodes with and without an exemplary gate interface protection layer, according to various non-limiting embodiments described herein.
Figure 7:
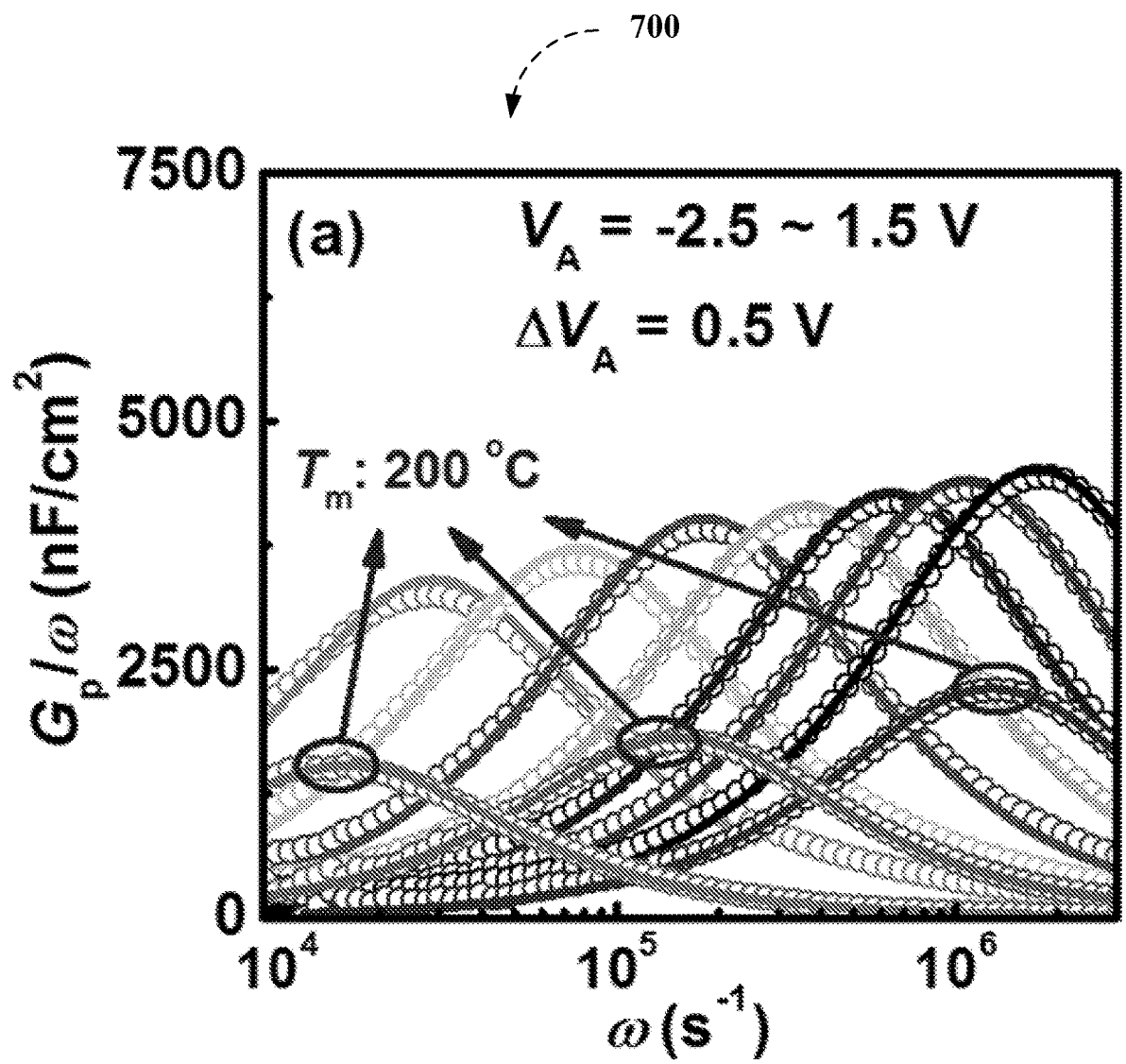
FIG. 7 demonstrates exemplary measured $G_p/\omega$-f characteristics of LPCVD-$SiN_x$ MIS-diodes without an exemplary gate interface protection layer, according to various non-limiting embodiments described herein, at measurement temperature ($T_m$)=25 degrees Celsius (° C.) and 200° C.
Figure 8:
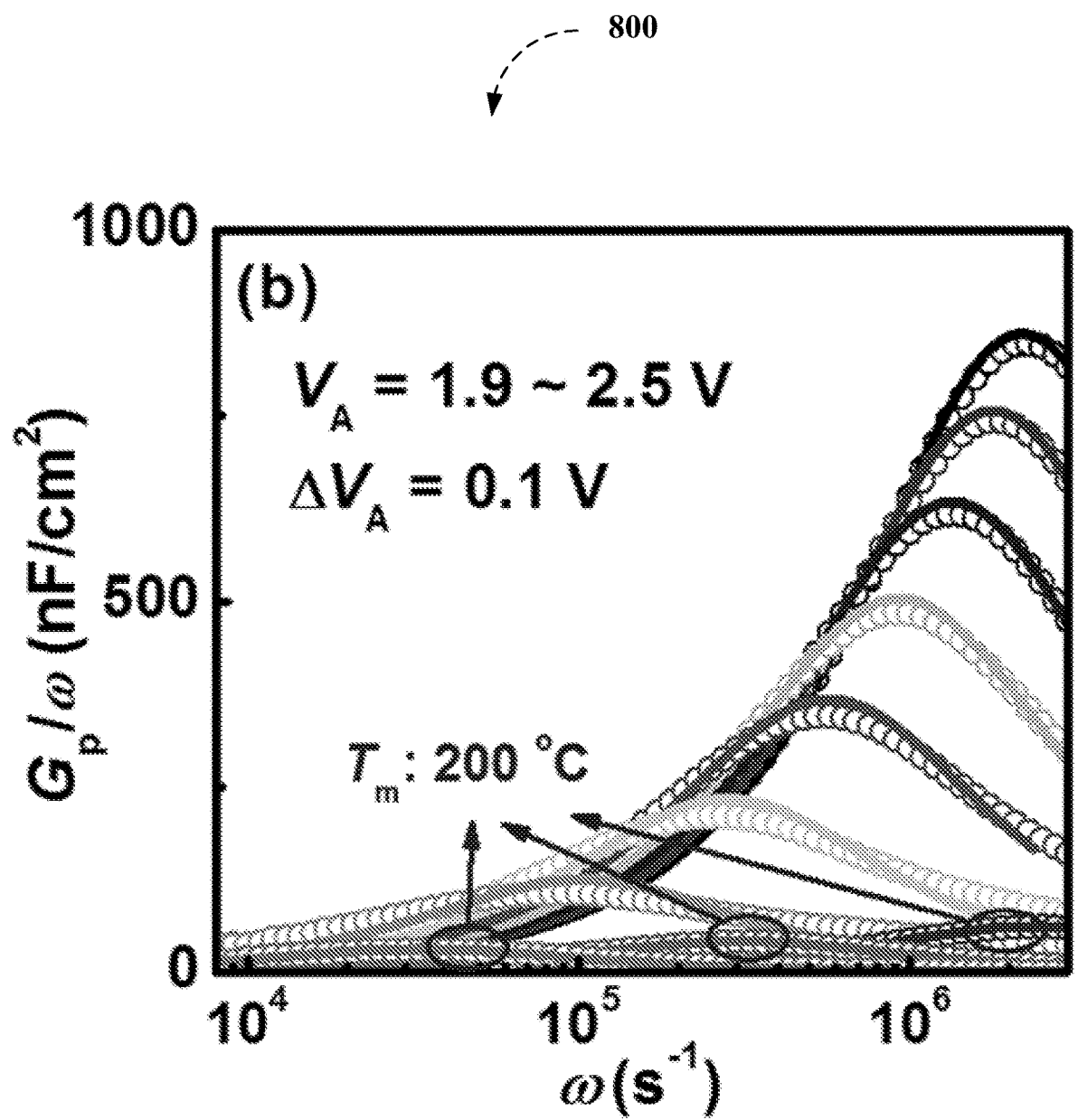
FIG. 8 demonstrates exemplary measured $G_p/\omega$-f characteristics of LPCVD-$SiN_x$ MIS-diodes with an exemplary gate interface protection layer, according to further non-limiting embodiments described herein, at measurement temperature ($T_m$)=25° C. and 200° C.
Figure 9:
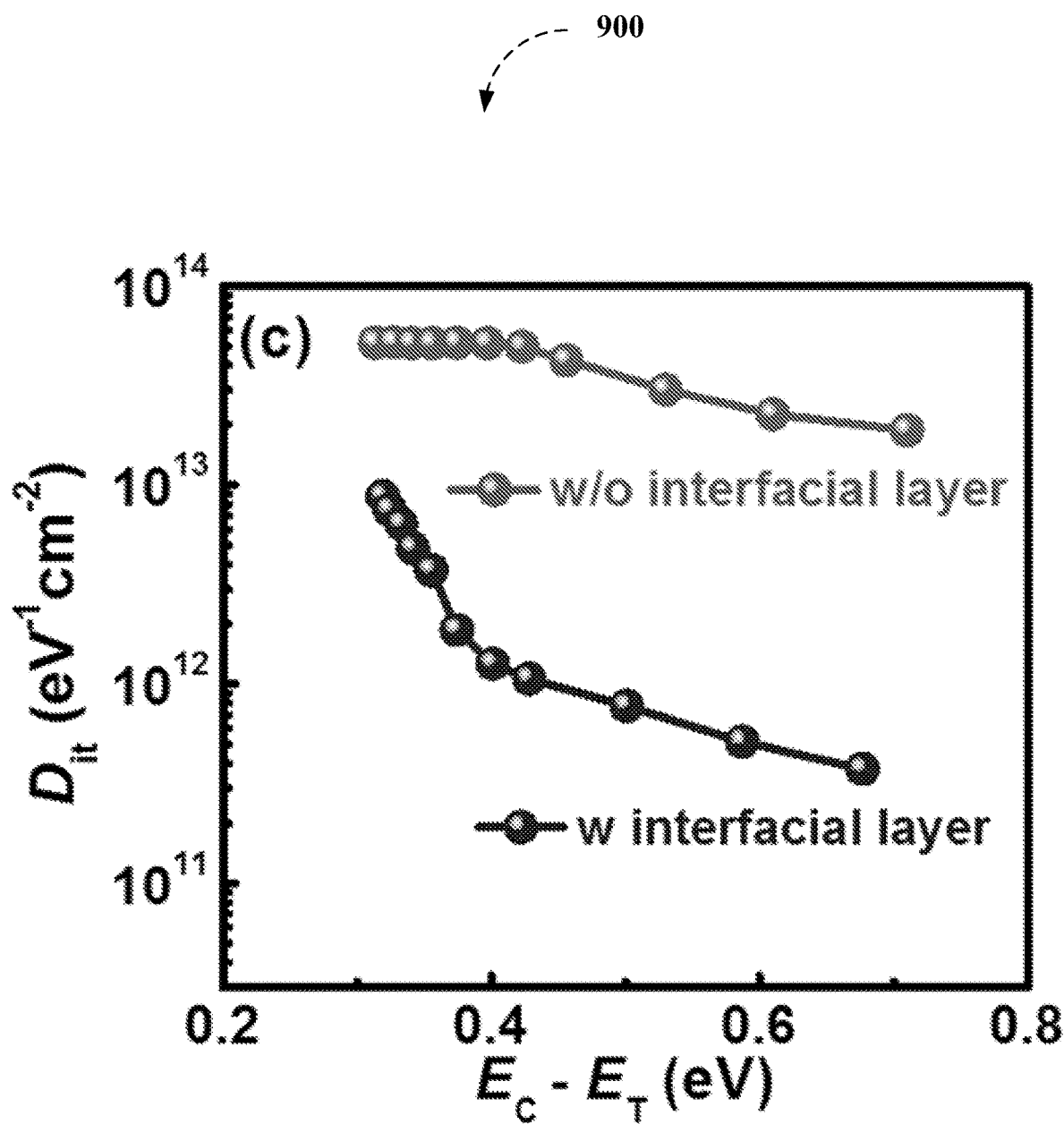
FIG. 9 depicts $D_{it}$-ET mapping of a MIS diode using alternating current (AC)-conductance method, wherein a cross-section $\tau_n$ of $10^{-14}$ per square centimeters ($cm^2$) is used to correlate re to the corresponding ET of the interface traps.

FIG. 6 demonstrates exemplary measured frequency ($f_m$)-dependent current–voltage (C–V) characteristics of LPCVD-SiN$_x$ MIS-diodes with and without an exemplary gate interface protection layer, according to various non-limiting embodiments described herein. FIG. 7 demonstrates exemplary measured $G_p/\omega$-f characteristics of LPCVD-SiN$_x$ MIS-diodes without an exemplary gate interface protection layer, according to various non-limiting embodiments described herein, at measurement temperature ($T_m$)=25 degrees Celsius (° C.) and 200° C. FIG. 8 depicts exemplary measured $G_p/\omega$-f characteristics of LPCVD-SiN$_x$ MIS-diodes with an exemplary gate interface protection layer, according to further non-limiting embodiments described herein, at measurement temperature ($T_m$)=25° C. and 200° C. FIG. 9 depicts $D_{it}$-$E_T$ mapping of MIS diode using alternating current (AC)-conductance method, wherein a cross-section u of $10^{-14}$ per square centimeters (cm$^2$) is used to correlate re to the corresponding ET of the interface traps.

Figure 10:
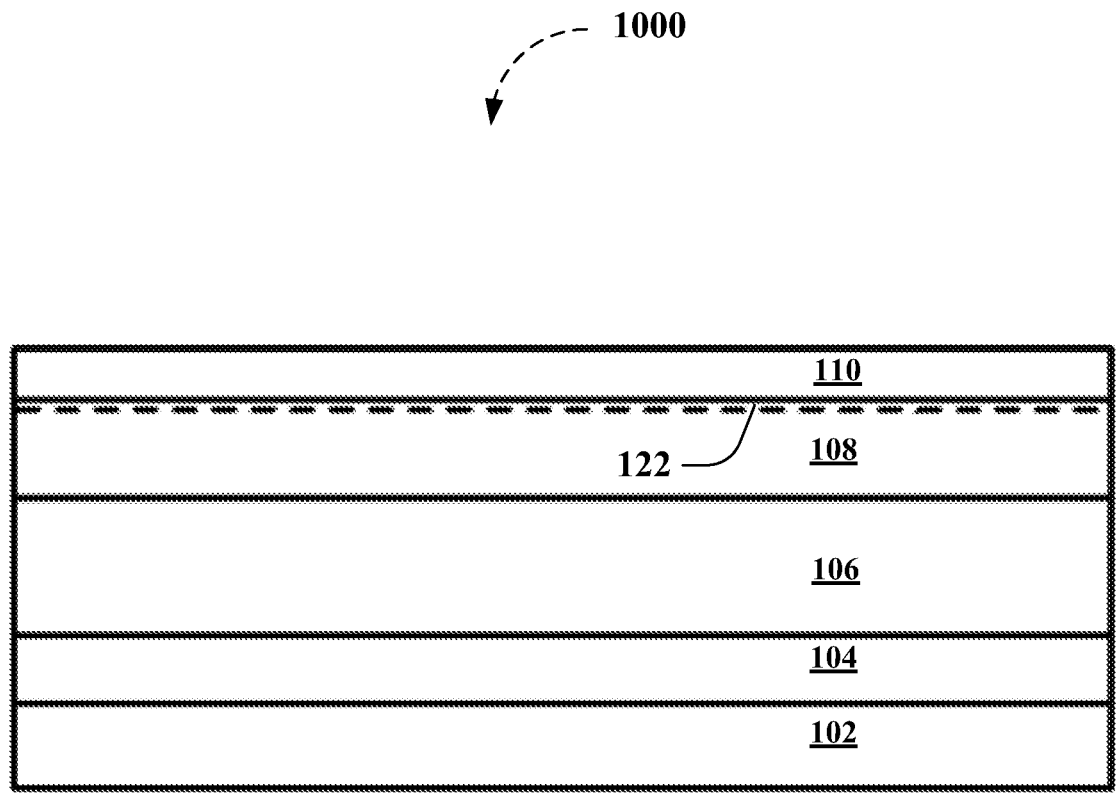
FIG. 10 depicts an exemplary block diagram of non-limiting aspects of exemplary fabrication methods, as described herein.

FIG. 10 depicts an exemplary block diagram 1000 of non-limiting aspects of exemplary fabrication methods, as described herein. For instance, an exemplary heterostructure can comprise a heterostructure prepared by metal-organic chemical vapor deposition (MOCVD), molecular beam epitaxy (MBE), hydride vapor phase epitaxy (HYPE), etc. An exemplary heterostructure can comprise a substrate 102, a nucleation layer 104, a buffer layer 106, a semiconductor or channel layer 108, and a barrier layer 110, as further described above regarding FIGS. 2-3, etc. For example, exemplary substrate 102 can comprise silicon, sapphire, diamond, SiC, GaN, etc., in further non-limiting aspects. In addition, an exemplary nucleation layer 104 can comprise AlN, GaN, InN, and/or their alloys, etc. In further non-limiting aspects, an exemplary buffer layer 106 can comprise AlN, GaN, InN, and/or their alloys, etc. In still other non-limiting aspects, an exemplary semiconductor or channel layer 108 can comprise GaN, AlN, InN, and/or their alloys, etc. In non-limiting embodiments, exemplary barrier layer 110 can comprise one or more layers. For example, the barrier layer 110 can comprise AlN, GaN, InN, and/or their alloys, etc, and exemplary barrier layer 110 can comprise a stack of these layers. In yet another non-limiting aspect, one or more layer in the barrier layer 110 has a bandgap larger than the semiconductor or channel layer 108. In various non-limiting embodiments, an exemplary channel 122 can be formed at an interface between the barrier layer 110 and semiconductor or channel layer 108.

Figure 11:
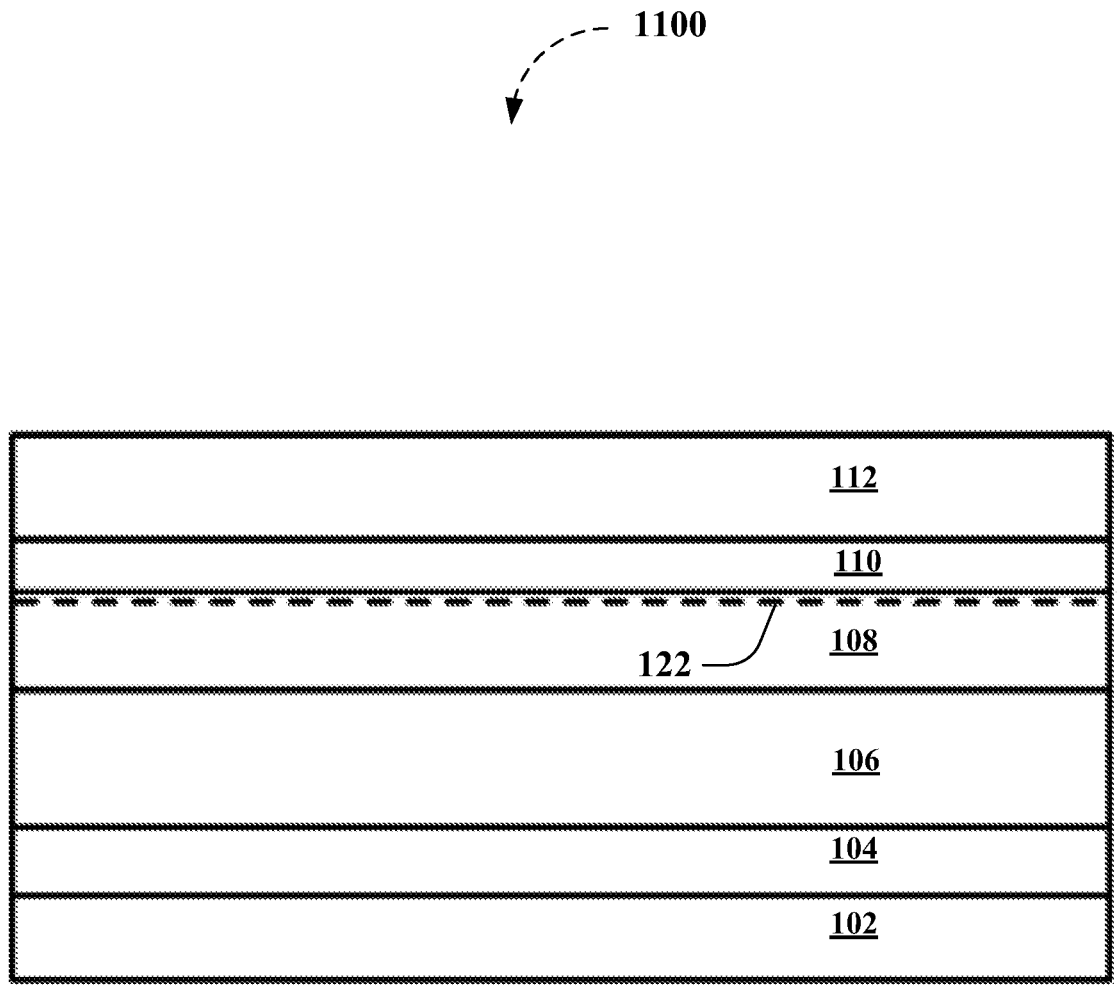
FIG. 11 depicts an exemplary block diagram of further non-limiting aspects of exemplary fabrication methods, as further described herein.

FIG. 11 depicts an exemplary block diagram 1100 of further non-limiting aspects of exemplary fabrication methods, as further described herein. For instance, one or more exemplary passivation layers 112 can be deposited on the exemplary heterostructure, which can facilitate relieving current collapse III-V HEMTs, as further described herein. An exemplary layer 112 can comprise one or a combination of insulating, or semi-conducting layers, such as SiN$_x$, SiO$_2$, Al$_2$O$_3$, AlN, GaN, Si, diamond, etc.

Figure 12:
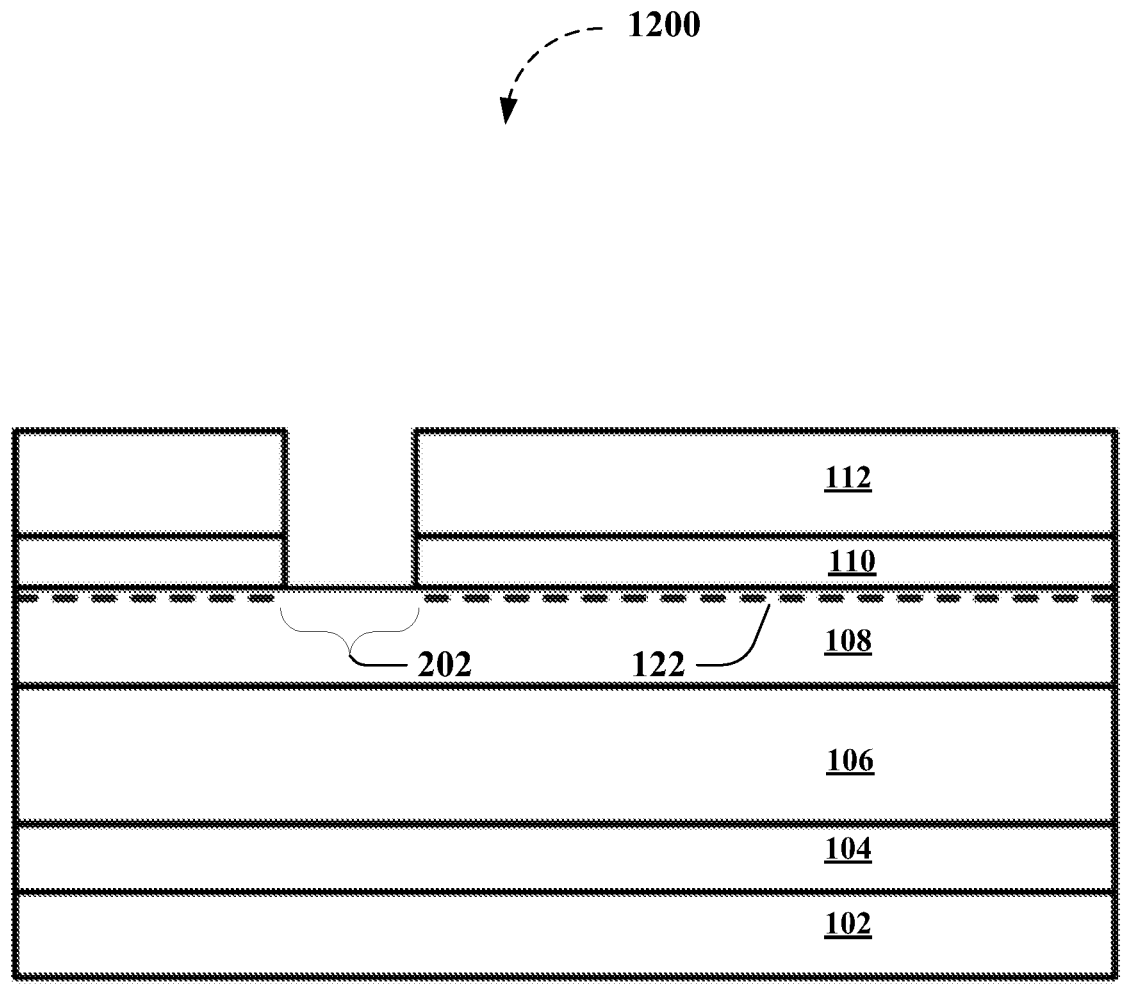
FIG. 12 depicts an exemplary block diagram of still further non-limiting aspects of exemplary fabrication methods, as described herein.

FIG. 12 depicts an exemplary block diagram 1200 of still further non-limiting aspects of exemplary fabrication methods, as described herein. For instance, an exemplary gate recess can be formed at the gate foot area of a recessed gate structure 202 (e.g., fully recessed or partially recessed), in various embodiments as described herein. For example, the one or more exemplary passivation layers 112 at the gate foot area of a recessed gate structure 202 (e.g., fully recessed or partially recessed) can be removed. As a further example, exemplary barrier layer 110 and a portion of semiconductor or channel layer 108 can be removed. In another non-limiting example, a thin layer of exemplary barrier layer 110 can remain to facilitate providing exemplary MIS-HEMT devices. In a non-limiting aspect, etching of the one or more exemplary passivation layers 112 can comprise a wet etch or dry etch depending on which material has been adopted for passivation. In a further non-limiting aspect, etching of exemplary barrier layer 110 and a portion of semiconductor or channel layer 108 can include, but is not limited to, plasma dry etching, digital etching, and/or a combination.

Figure 13:
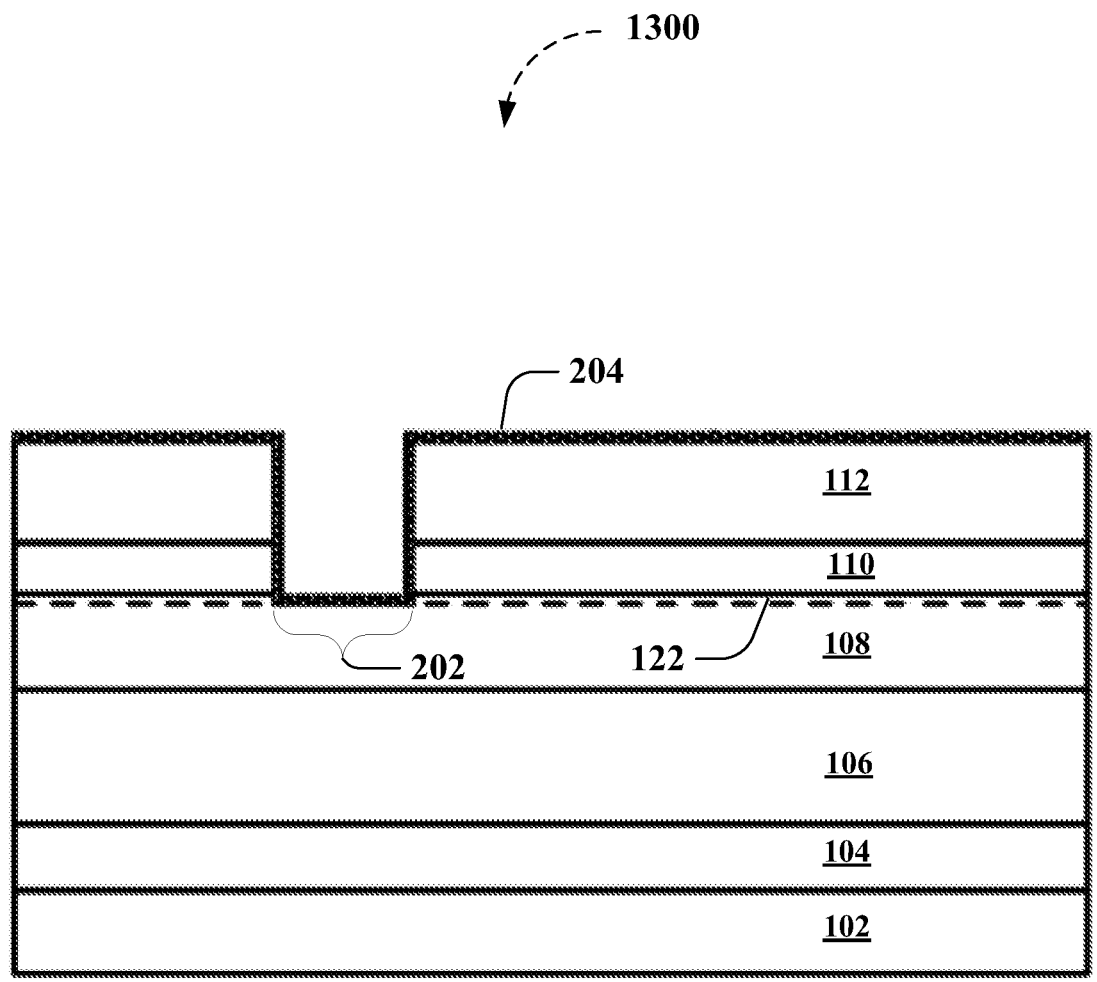
FIG. 13 depicts an exemplary block diagram of non-limiting aspects of exemplary fabrication methods directed to an exemplary first embodiment, as described herein.

FIG. 13 depicts an exemplary block diagram 1300 of non-limiting aspects of exemplary fabrication methods directed to an exemplary first embodiment, as described herein. For instance, an exemplary gate interface protection layer dielectric 204 can be formed comprising a dielectric layer, deposited at a relatively low temperature, such as, for example, 300° C., as further described herein. In a non-limiting aspect, exemplary gate interface protection layer dielectric 204 comprising a dielectric can comprise silicon nitride, silicon oxide or silicon oxynitride, etc., and can be deposited via PECVD, in a further non-limiting aspect.

Figure 14:
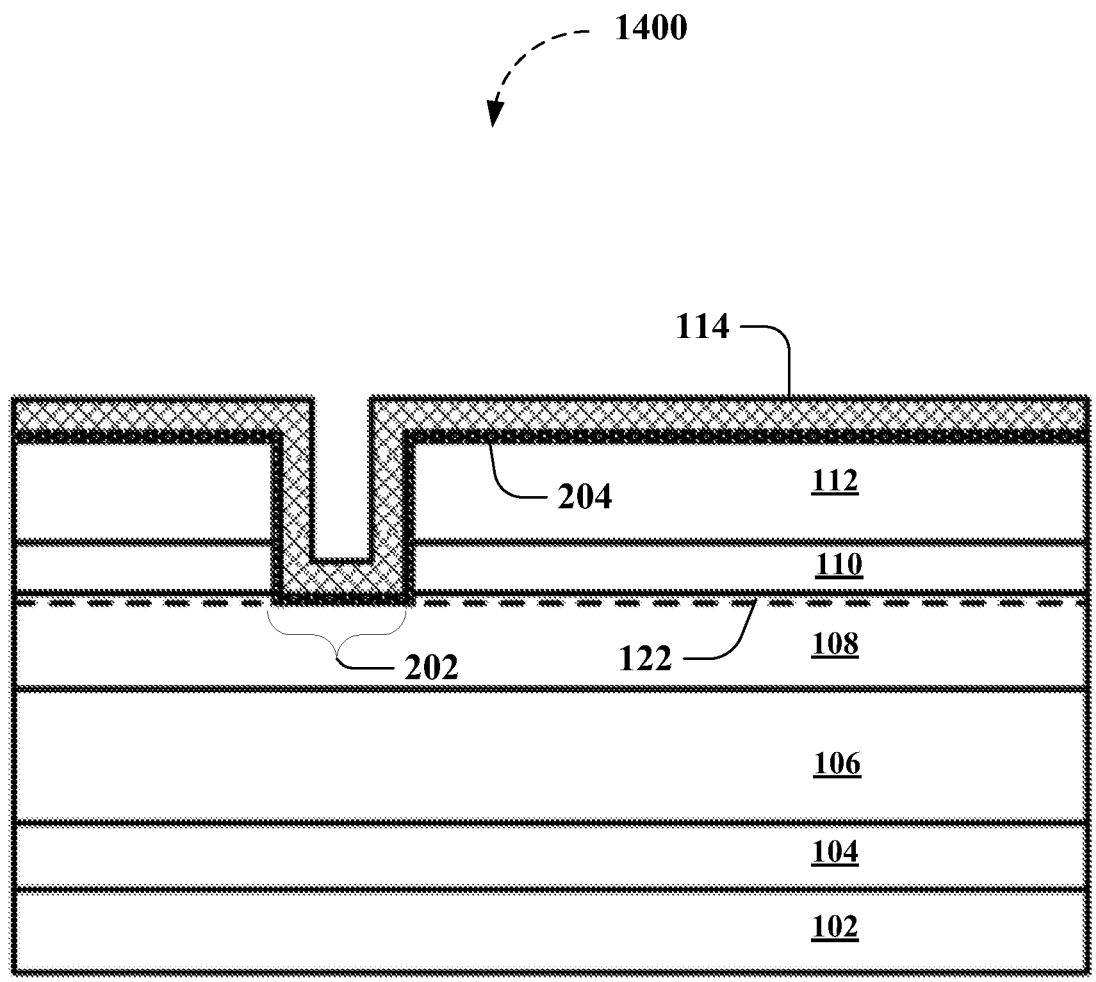
FIG. 14 depicts an exemplary block diagram of other non-limiting aspects of exemplary fabrication methods directed to an exemplary first embodiment, as further described herein.

FIG. 14 depicts an exemplary block diagram 1400 of other non-limiting aspects of exemplary fabrication methods directed to an exemplary first embodiment, as further described herein. For instance, an exemplary gate dielectric 114 can be deposited over exemplary gate interface protection layer dielectric 204, as further described herein. In a non-limiting aspect, exemplary gate dielectric 114 can comprise one layer or a stack of layers comprising SiN$_x$, SiN$_x$O$_y$, SiO$_2$, etc., and/or combinations. In a further non-limiting aspect, exemplary gate dielectric 114 can be deposited via LPCVD.

Figure 15:
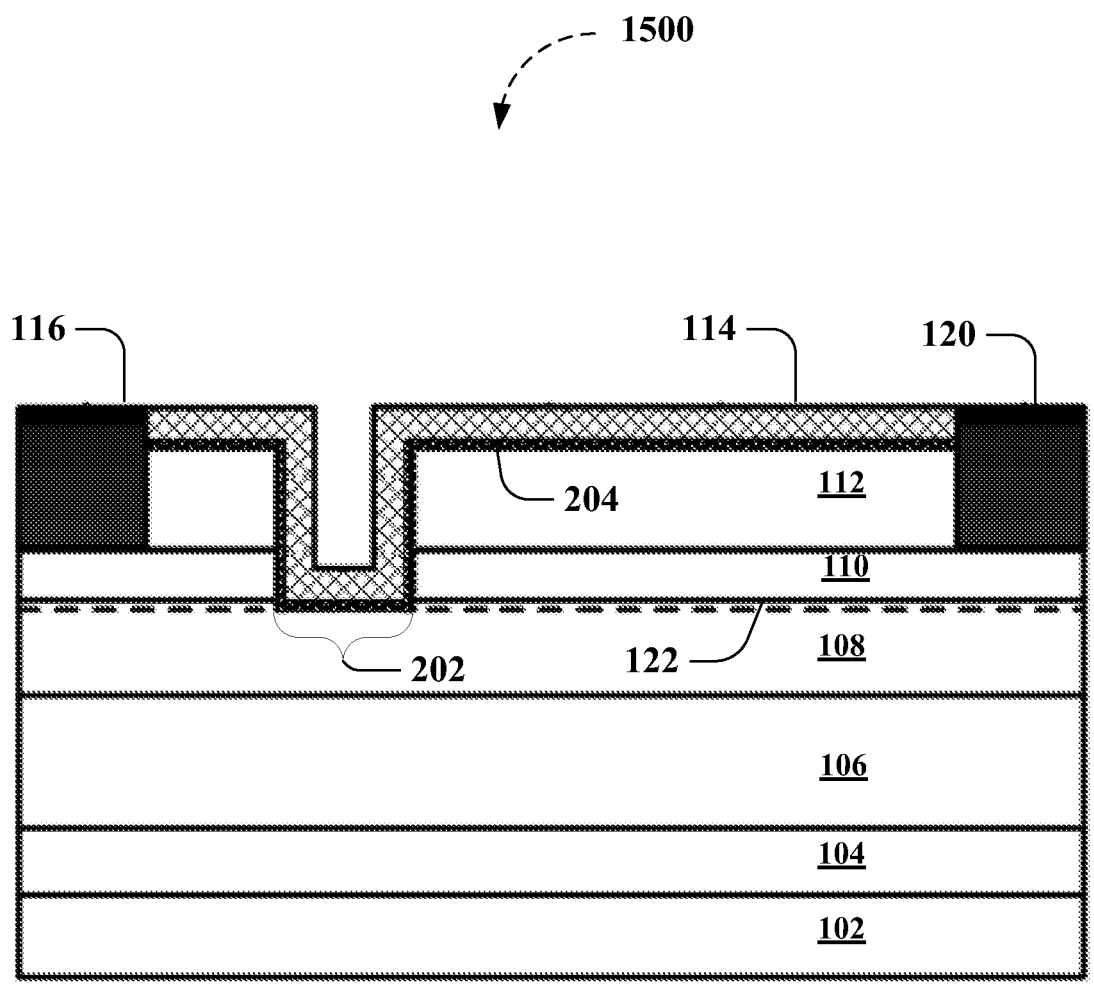
FIG. 15 depicts an exemplary block diagram of still other non-limiting aspects of exemplary fabrication methods directed to an exemplary first embodiment, as described herein.

FIG. 15 depicts an exemplary block diagram 1500 of still other non-limiting aspects of exemplary fabrication methods directed to an exemplary first embodiment, as described herein. For instance, exemplary ohmic contacts can be formed on the heterostructure for source electrode 116 and drain electrode 120, as further described herein. In a non-limiting aspect, exemplary ohmic contacts can comprise a metal comprising one or more Ti, Al, Ni, Au, W, V, Ta, etc. In yet another non-limiting aspect, exemplary ohmic contacts can be subjected to an annealing process to generate the exemplary ohmic contacts.

Figure 16:
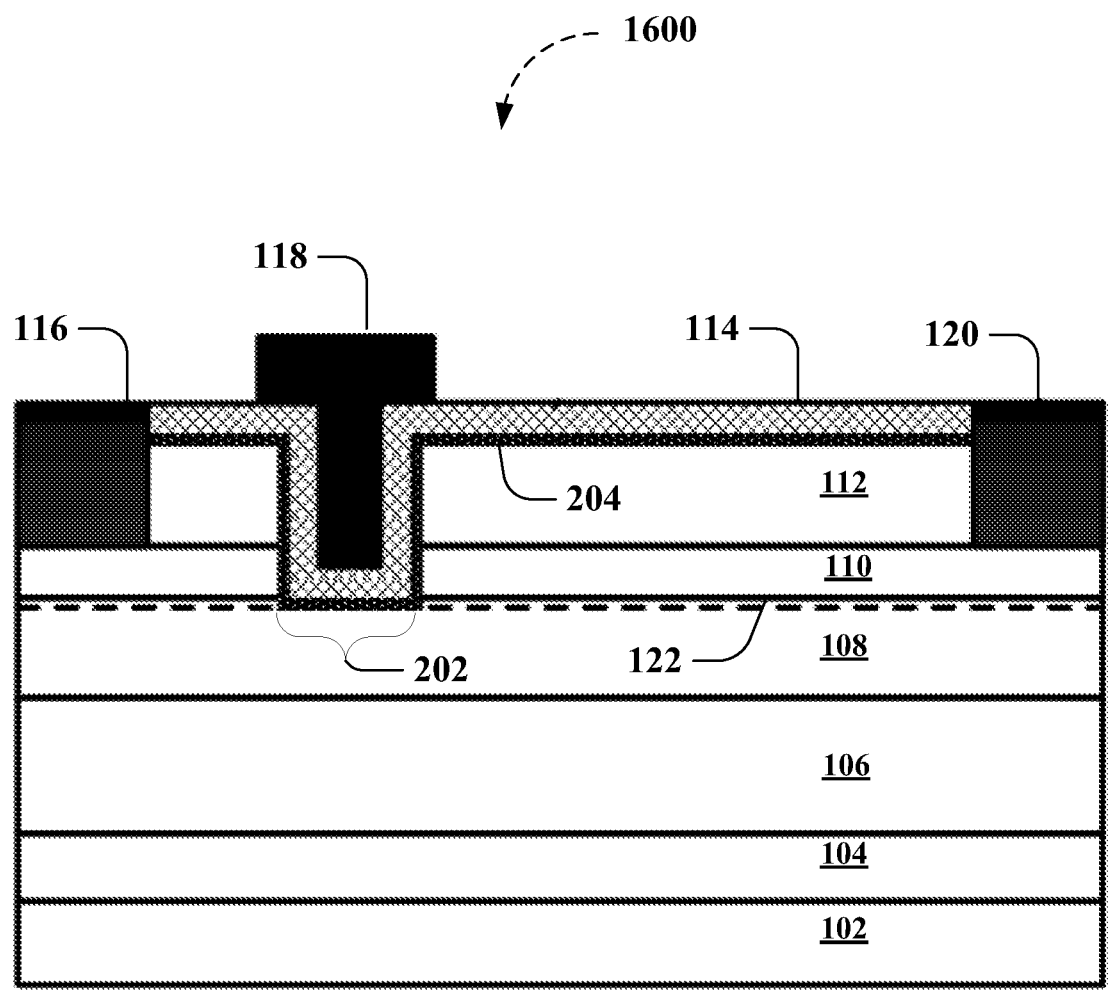
FIG. 16 depicts an exemplary block diagram of further non-limiting aspects of exemplary fabrication methods directed to an exemplary first embodiment, as further described herein.

FIG. 16 depicts an exemplary block diagram 1600 of further non-limiting aspects of exemplary fabrication methods directed to an exemplary first embodiment, as further described herein. For instance, exemplary gate electrode 118 can be formed on the heterostructure, as further described herein. In a non-limiting aspect, exemplary gate electrode 118 can cover at least the recessed gate region (e.g., a gate recess formed at the gate foot area of a recessed gate structure 202 (e.g., fully recessed or partially recessed)), so that the recessed region is modulated by the gate voltage.

Figure 17:
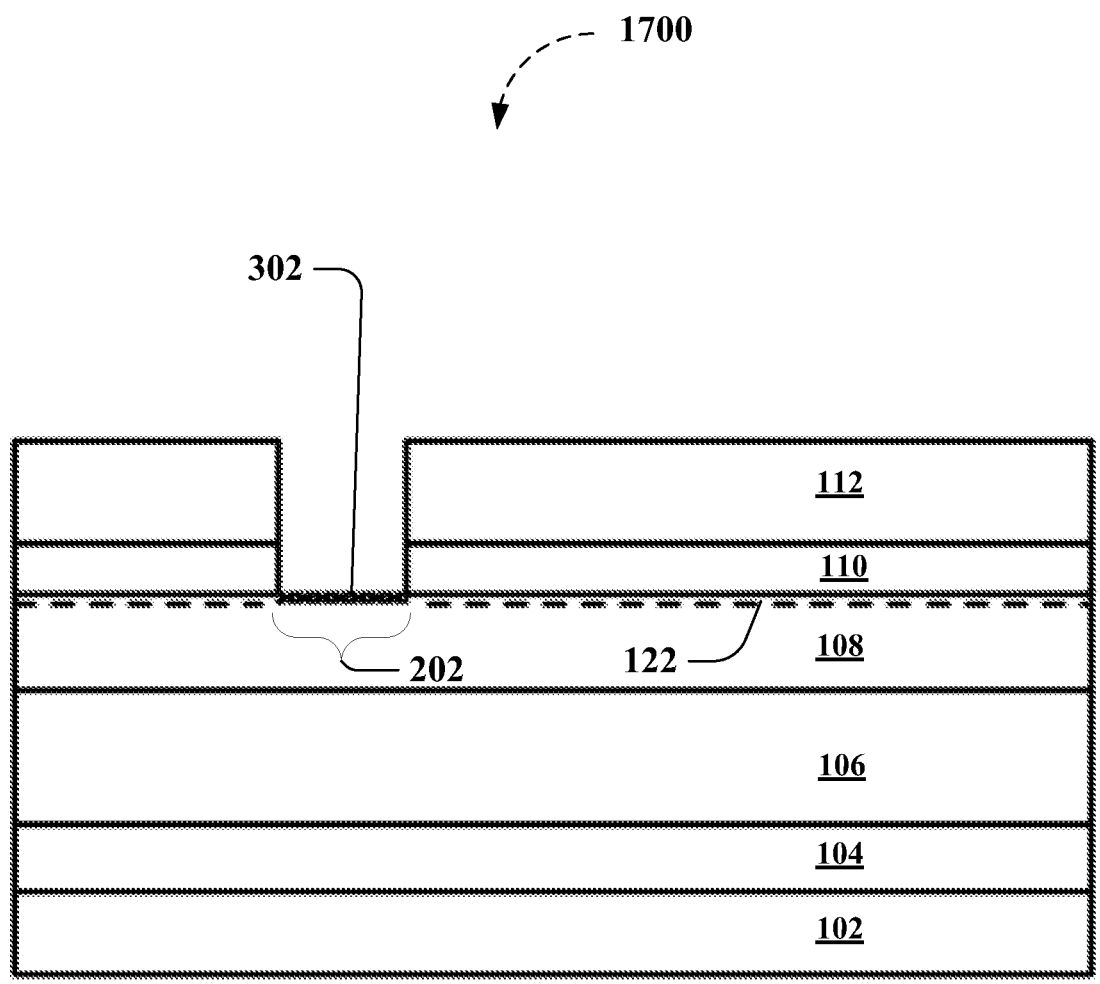
FIG. 17 depicts an exemplary block diagram of non-limiting aspects of exemplary fabrication methods directed to an exemplary second embodiment, as described herein.
Figure 18:
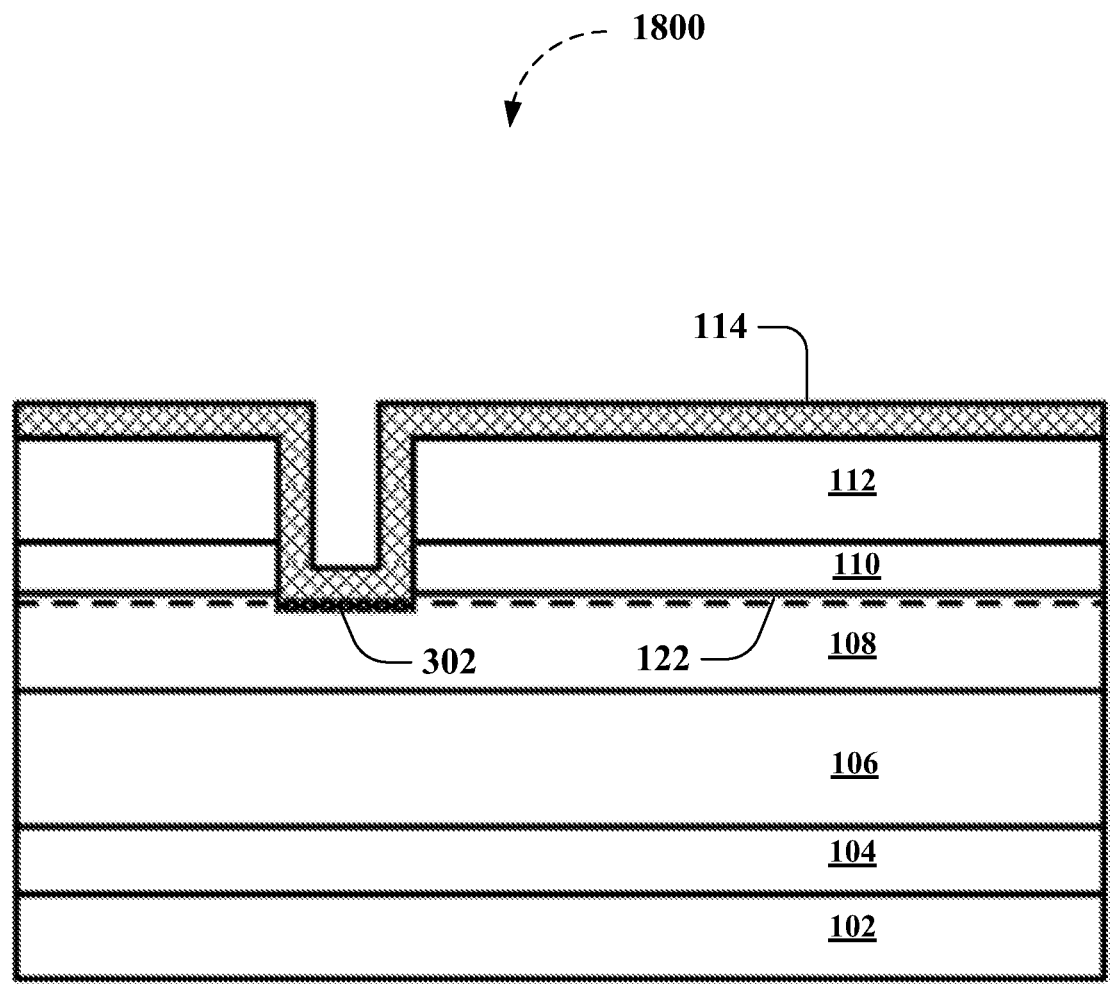
FIG. 18 depicts an exemplary block diagram of other non-limiting aspects of exemplary fabrication methods directed to an exemplary second embodiment, as further described herein.

FIG. 17 depicts an exemplary block diagram 1700 of non-limiting aspects of exemplary fabrication methods directed to an exemplary second embodiment, as described herein. For instance, exemplary fabrication methods directed to an exemplary second embodiment can proceed from heterostructure depicted in exemplary block diagram 1200 of FIG. 12. In further non-limiting aspects, an exemplary gate interface protection layer 302 can be formed by surface treatment of semiconductor or channel layer 108 and/or annealing at high temperature. In non-limiting embodiments, a surface of the semiconductor or channel layer 108 in the gate foot area of a recessed gate structure 202 (e.g., fully recessed or partially recessed) can be oxidized by exposure to an oxygen containing gas plasma, an oxygen containing gas, etc. to form an oxide-based gate interface protection layer 302. In further non-limiting embodiments, after annealing, re-configuration near the surface of semiconductor or channel layer 108 can be facilitated by high temperature. As a result, a stable gate interface protection layer 302 can be formed before deposition of gate dielectric 114, which can protect the semiconductor or channel layer 108 surface from decomposition prior to gate dielectric 114 deposition. In a non-limiting aspect, an exemplary annealing process can be performed in situ, such as, for example, during a process of gate dielectric 114 formation or deposition at high temperature, e.g., 780° C. For example, FIG. 18 depicts an exemplary block diagram 1800 of other non-limiting aspects of exemplary fabrication methods directed to an exemplary second embodiment, as further described herein. For instance, For instance, an exemplary gate dielectric 114 can be deposited over exemplary gate interface protection layer dielectric 204, as further described herein. In a non-limiting aspect, exemplary gate dielectric 114 can comprise one layer or a stack of layers comprising $SiN_x$, $SiN_xO_y$, $SiO_2$, etc., and/or combinations. In a further non-limiting aspect, exemplary gate dielectric 114 can be deposited via LPCVD or other high temperature deposition techniques.

Figure 19:
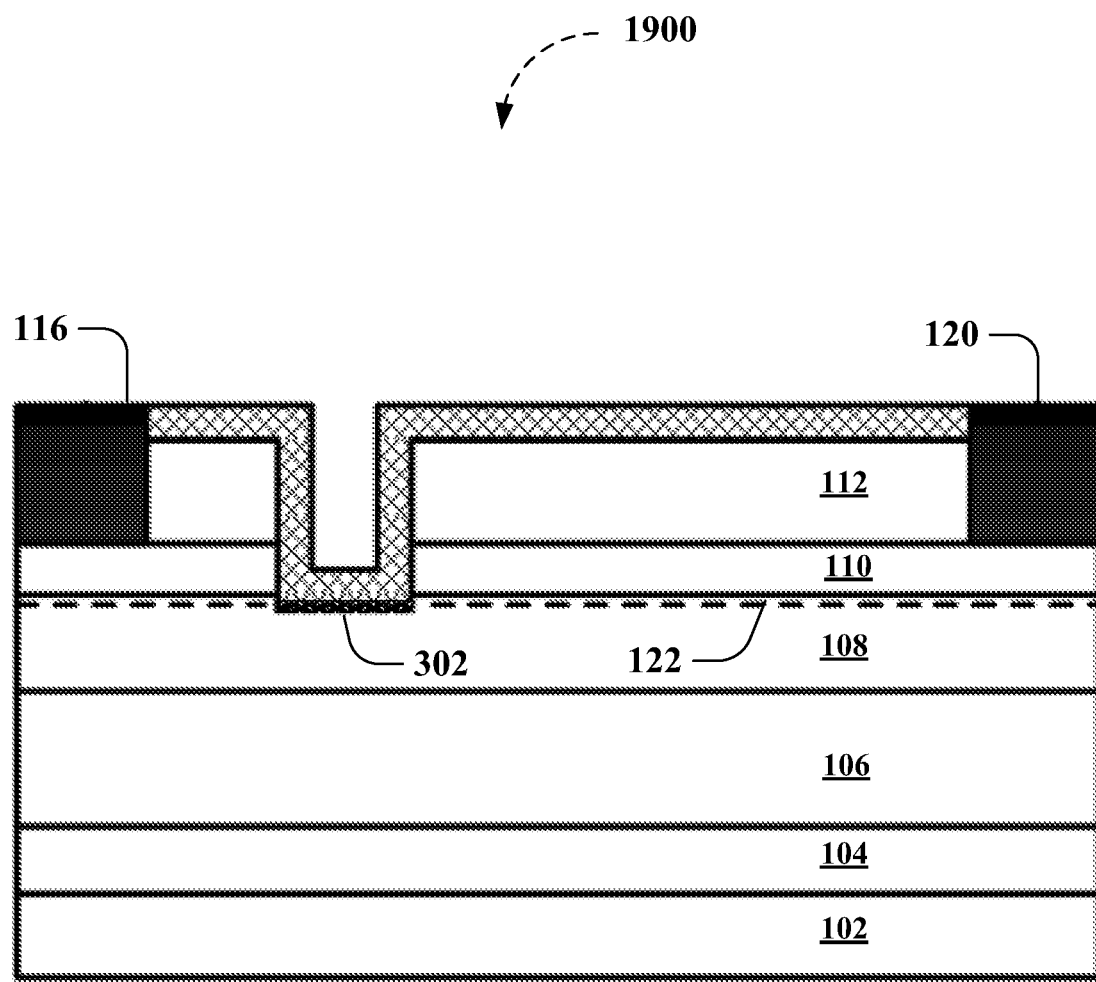
FIG. 19 depicts an exemplary block diagram of still other non-limiting aspects of exemplary fabrication methods directed to an exemplary second embodiment, as described herein.

FIG. 19 depicts an exemplary block diagram 1900 of still other non-limiting aspects of exemplary fabrication methods directed to an exemplary second embodiment, as described herein. For instance, exemplary ohmic contacts can be formed on the heterostructure for source electrode 116 and drain electrode 120, as further described herein. In a non-limiting aspect, exemplary ohmic contacts can comprise a metal comprising one or more Ti, Al, Ni, Au, W, V, Ta, etc. In yet another non-limiting aspect, exemplary ohmic contacts can be subjected to an annealing process to generate the exemplary ohmic contacts.

Figure 20:
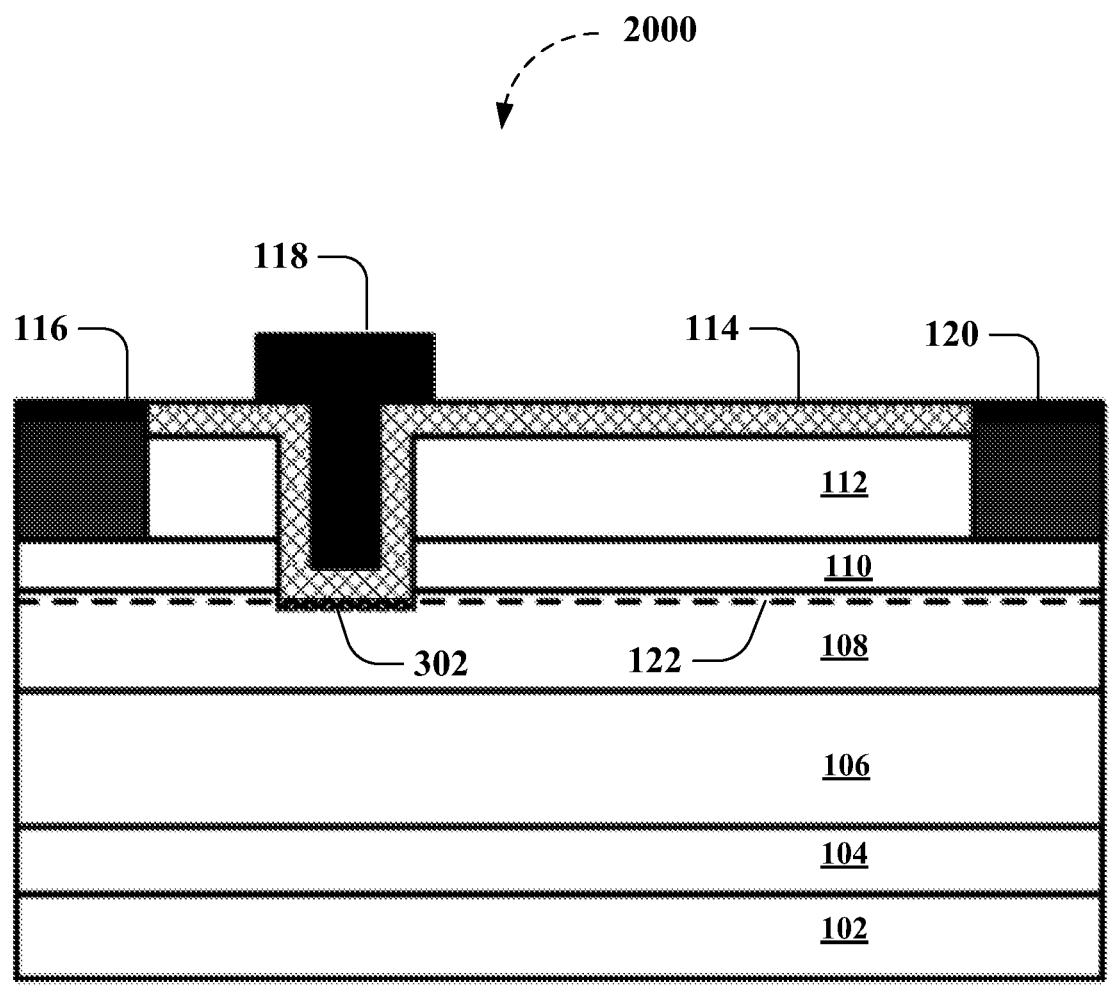
FIG. 20 depicts an exemplary block diagram of further non-limiting aspects of exemplary fabrication methods directed to an exemplary second embodiment, as further described herein.

FIG. 20 depicts an exemplary block diagram 2000 of further non-limiting aspects of exemplary fabrication methods directed to an exemplary second embodiment, as further described herein. For instance, exemplary gate electrode 118 can be formed on the heterostructure, as further described herein. In a non-limiting aspect, exemplary gate electrode 118 can cover at least the recessed gate region (e.g., a gate recess formed at the gate foot area of a recessed gate structure 202 (e.g., fully recessed or partially recessed)), so that the recessed region is modulated by the gate voltage.

Figure 21:
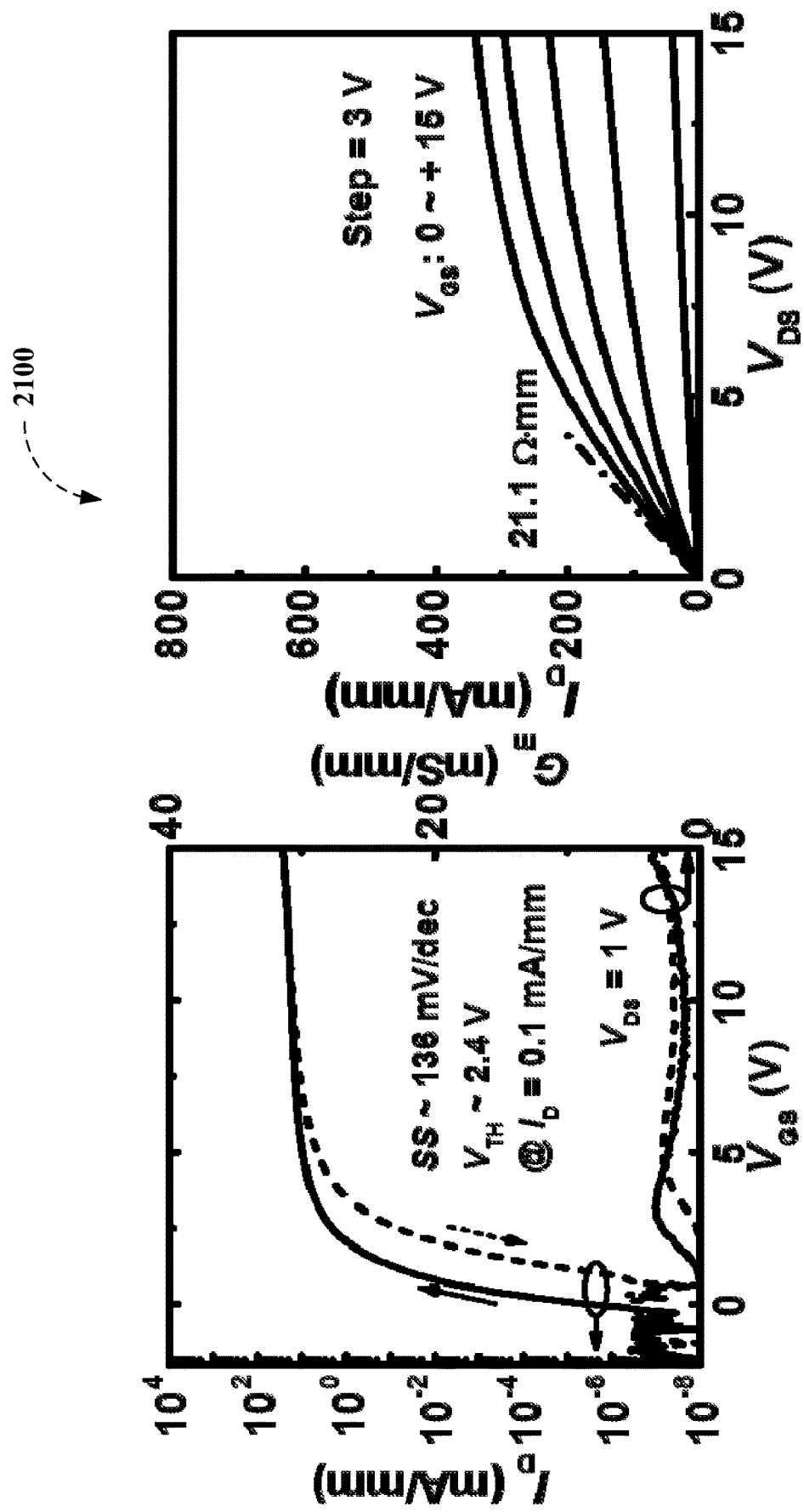
FIG. 21 depicts non-limiting, experimental transfer $I_D$-$V_{GS}$ characteristic and output $I_D$-$V_{GS}$ characteristic of a conventional LPCVD-SiN$_x$/GaN MIS-FET, without exemplary gate interface protection layer, for an exemplary device having dimensions, $L_{GS}/L_G/L_{GD}$=2/1.5/15 micrometers (μm)
Figure 22:
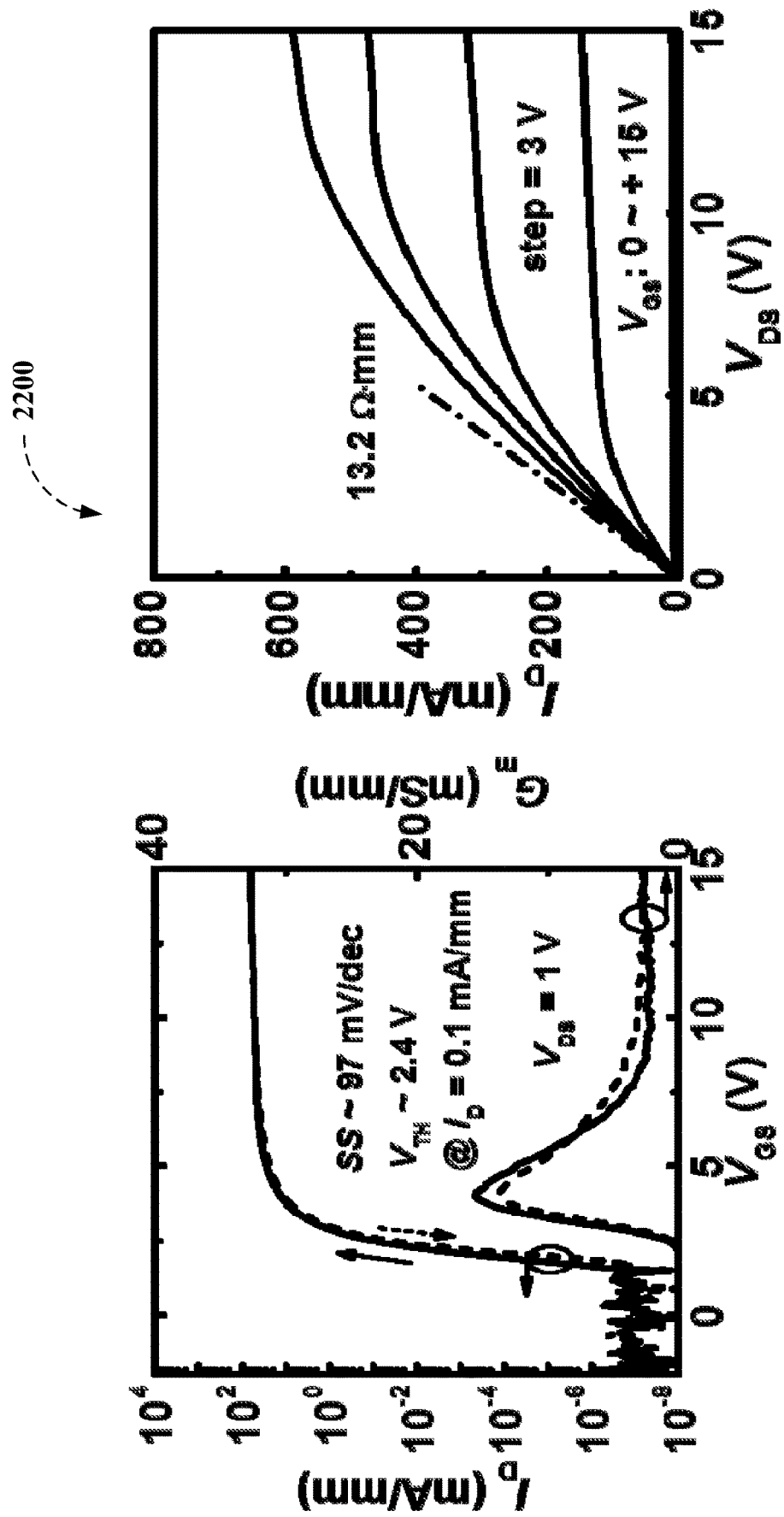
FIG. 22 depicts non-limiting, experimental transfer $I_D$-$V_{GS}$ characteristic and output $I_D$-$V_{GS}$ characteristic of an exemplary first embodiment comprising an exemplary 2-nm PECVD-SiN$_x$ gate interface protection layer, according to non-limiting aspects, for an exemplary device having dimensions, $L_{GS}/L_G/L_{GD}$=2/1.5/15 μm.
Figure 23:
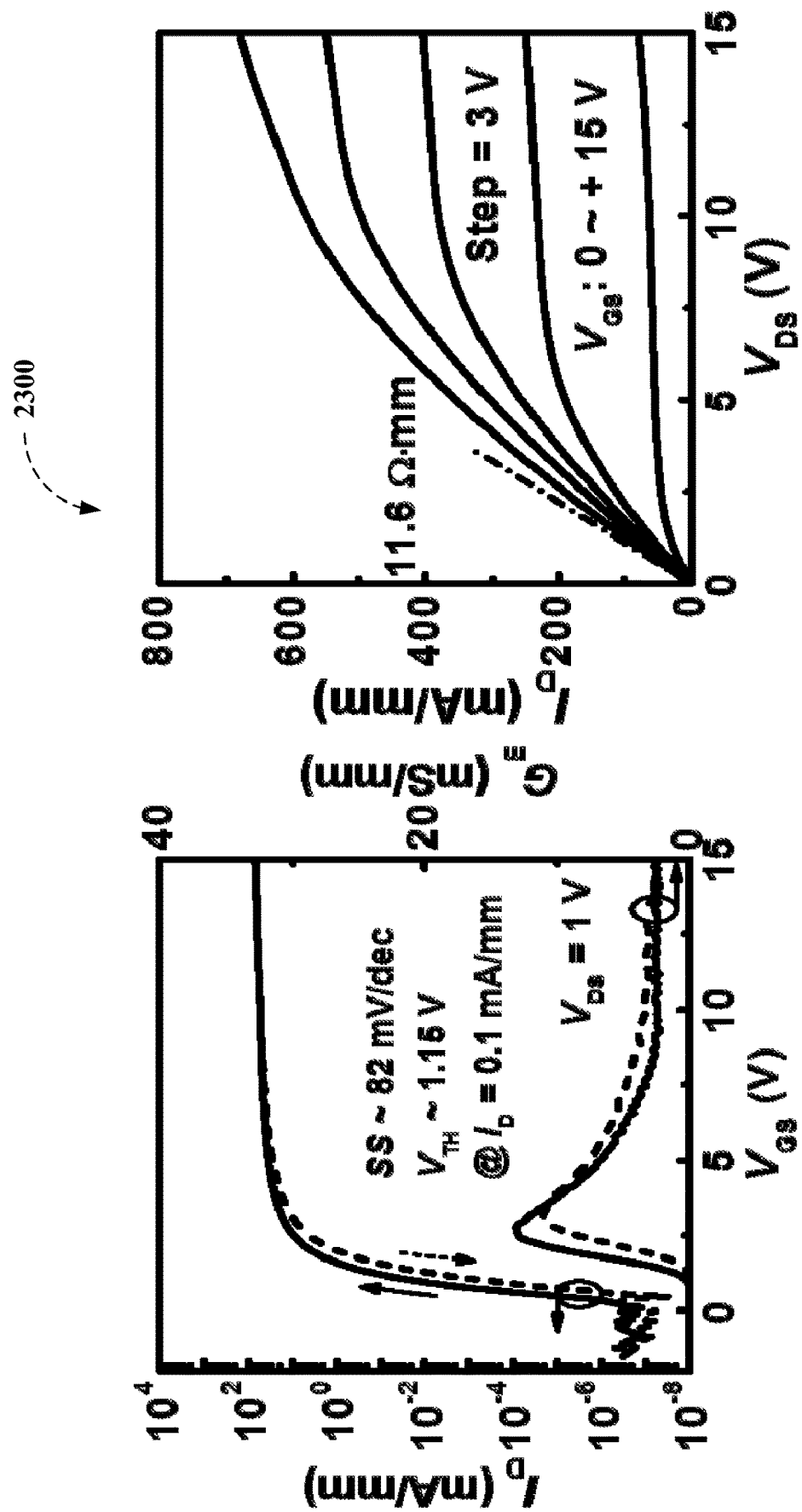
FIG. 23 depicts non-limiting, experimental transfer $I_D$-$V_{GS}$ characteristic and output $I_D$-$V_{GS}$ characteristic of an exemplary second embodiment comprising an exemplary oxide-based gate interface protection layer, according to further non-limiting aspects, for an exemplary device having dimensions, $L_{GS}/L_G/L_{GD}$=2/1.5/15 μm.

FIG. 21 depicts non-limiting, experimental transfer $I_D$-$V_{GS}$ characteristic and output $I_D$-$V_{GS}$ characteristic of a conventional LPCVD-$SiN_x$/GaN MIS-FET, without exemplary gate interface protection layer, for an exemplary device having dimensions, $L_{GS}/L_G/L_{GD}$=2/1.5/15 micrometers (μm). FIG. 22 depicts non-limiting, experimental transfer $I_D$-$V_{GS}$ characteristic and output $I_D$-$V_{GS}$ characteristic of an exemplary first embodiment comprising an exemplary 2-nm PECVD-$SiN_x$ gate interface protection layer 204, according to non-limiting aspects, for an exemplary device having dimensions, $L_{GS}/L_G/L_{GD}$=2/1.5/15 μm. FIG. 23 depicts non-limiting, experimental transfer $I_D$-$V_{GS}$ characteristic and output $I_D$-$V_{GS}$ characteristic of an exemplary second embodiment comprising an exemplary oxide-based gate interface protection layer 302, according to further non-limiting aspects, for an exemplary device having dimensions, $L_{GS}/L_G/L_{GD}$=2/1.5/15 μm. Compared with the conventional LPCVD-$SiN_x$/GaN MIS-FET of FIG. 21, both embodiments of FIGS. 22-23 deliver smaller subthreshold swing, smaller hysteresis, and lower on-resistance for a device with gate-to-drain distance of 15 μm. In particular, the maximum field-effect mobility of the conventional LPCVD-$SiN_x$/GaN MIS-FET of FIG. 21, the first embodiment and the second embodiment is 40 cm$^2$/V·s, 160 cm$^2$/V·s and 145 cm$^2$/V·s, respectively.

Figure 24:
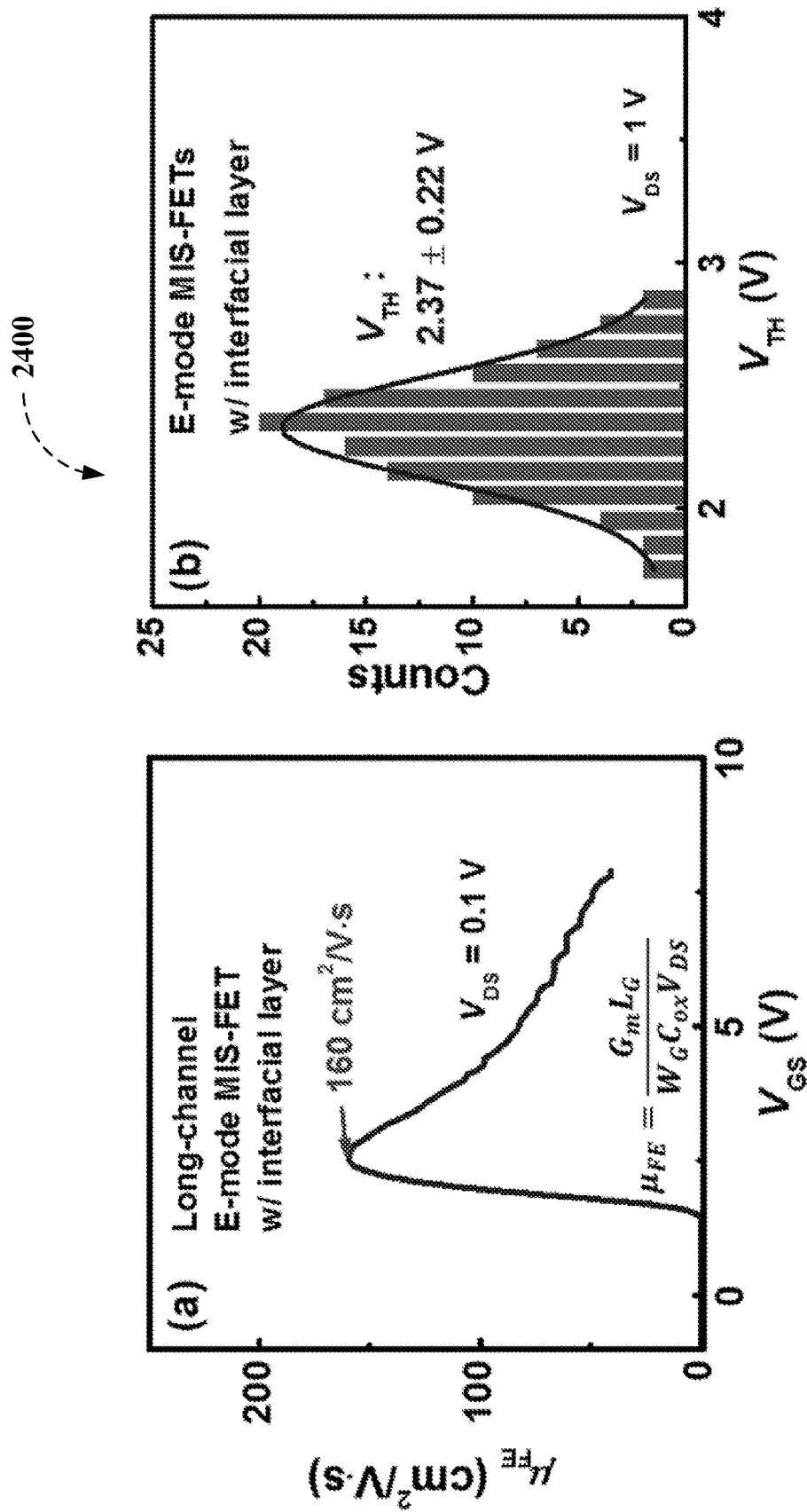
FIG. 24 depicts exemplary extracted field-effect mobility using a long channel, MIS-FET with $L_G/W_G$=44/100 μm, and threshold voltage uniformity of the normally-off LPCVD-SiN$_x$ MIS-FETs according to an exemplary first embodiment comprising a non-limiting gate interface protection layer, as described herein.

FIG. 24 depicts exemplary extracted field-effect mobility using a long channel, MIS-FET with $L_G/W_G$=44/100 μm, and threshold voltage uniformity of the normally-off LPCVD-$SiN_x$ MIS-FETs according to an exemplary first embodiment comprising a non-limiting gate interface protection layer 204, as described herein. The threshold voltage (defined at $I_D$=100 μA/mm) shows a tight distribution of 2.37±0.22 V.

Figure 25:
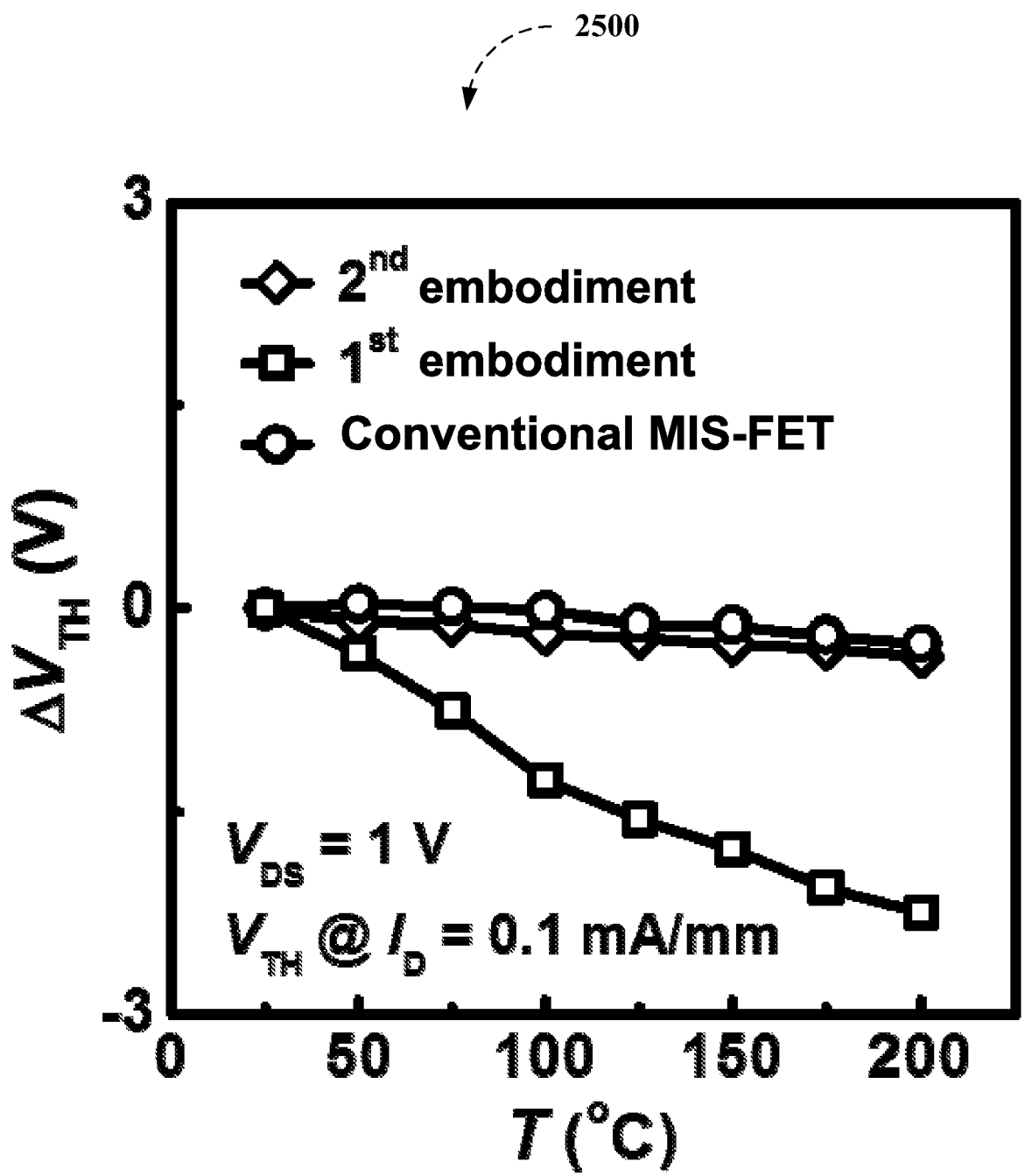
FIG. 25 demonstrates exemplary temperature dependence of threshold voltage in non-limiting conventional LPCVD-SiN$_x$/GaN MIS-FET devices, an exemplary first embodiment, and an exemplary second embodiment, as further described herein.
Figure 26:
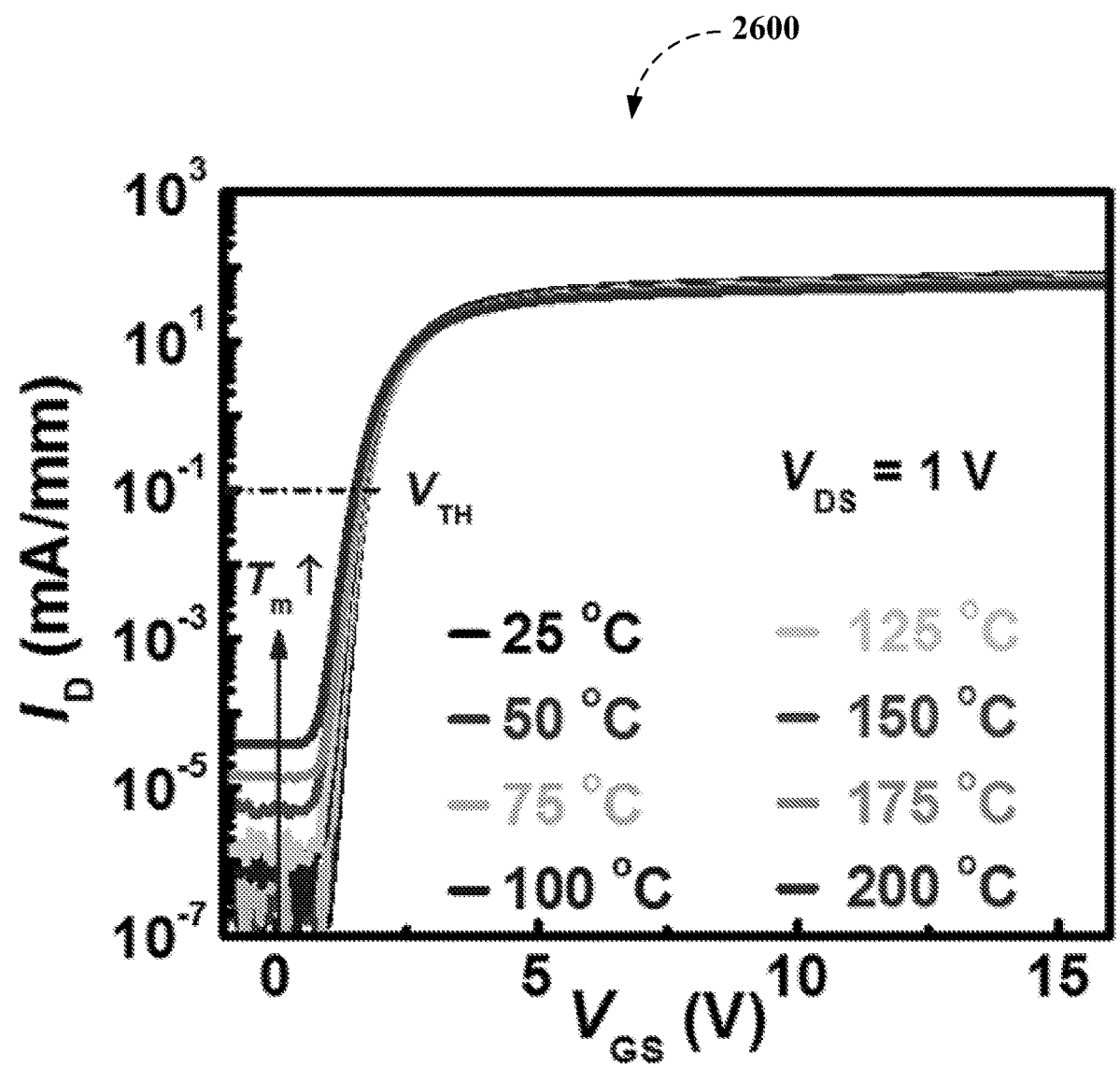
FIG. 26 depicts exemplary T-dependent transfer characteristics of an LPCVD-SiN$_x$ gate interface protection layer in an exemplary GaN MIS-FET with measurement temperature ($T_m$) increasing from 25° C. to 200° C., for an exemplary device having dimensions, $L_{GS}/L_G/L_{GD}$=2/1.5/15 μm.

FIG. 25 demonstrates exemplary temperature dependence of threshold voltage in non-limiting conventional LPCVD-$SiN_x$/GaN MIS-FET devices, an exemplary first embodiment, and an exemplary second embodiment, as further described herein. Both exemplary devices according to the first and the second embodiment show more thermally stable threshold voltage (negative VTH shifts smaller than 0.22 V up to 200° C.) than the conventional LPCVD-$SiN_x$/GaN MIS-FET device. FIG. 26 depicts exemplary T-dependent transfer characteristics of an LPCVD-$SiN_x$ gate interface protection layer in an exemplary GaN MIS-FET with measurement temperature ($T_m$) increasing from 25° C. to 200° C., for an exemplary device having dimensions, $L_{GS}/L_G/L_{GD}$=2/1.5/15 μm.

Figure 27:
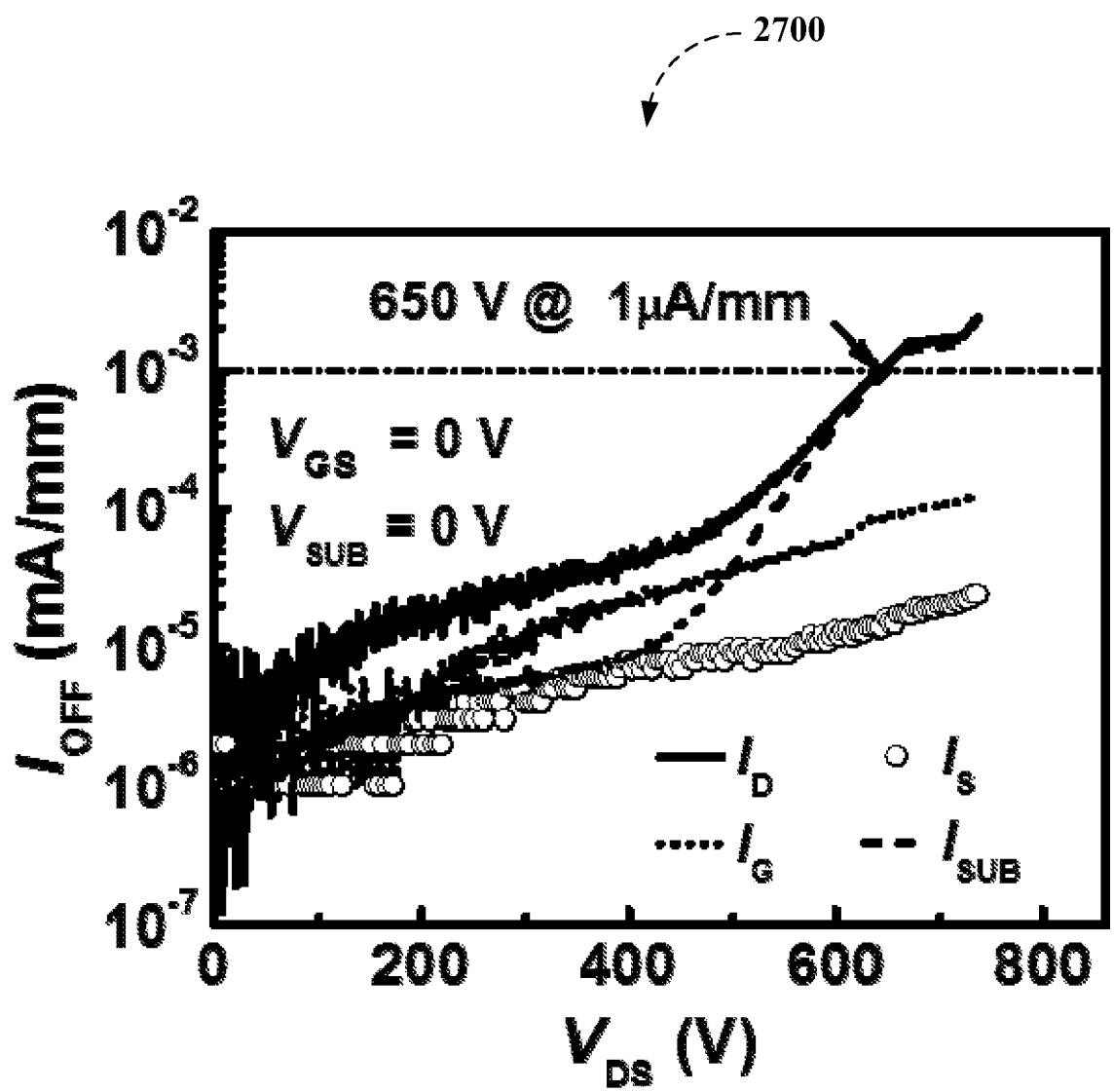
FIG. 27 depicts exemplary experimental off-state breakdown characteristics or leakage current of a non-limiting LPCVD-SiN$_x$ MIS-FET device according to an exemplary first embodiment comprising a gate interface protection layer, with the substrate grounded, for an exemplary device having dimensions, $L_{GS}/L_G/L_{GD}$=2/1.5/15 μm.

FIG. 27 depicts exemplary experimental off-state breakdown characteristics or leakage current of a non-limiting LPCVD-$SiN_x$ MIS-FET device according to an exemplary first embodiment comprising a gate interface protection layer 204, with the substrate grounded, for an exemplary device having dimensions, $L_{GS}/L_G/L_{GD}$=2/1.5/15 μm. The breakdown voltage is 650 V for a device with gate-to-drain distance of 15 μm, which is limited by the drain-to-substrate vertical leakage current. The device according to the second embodiment shows the similar off-state breakdown characteristics (not shown).

Figure 28:
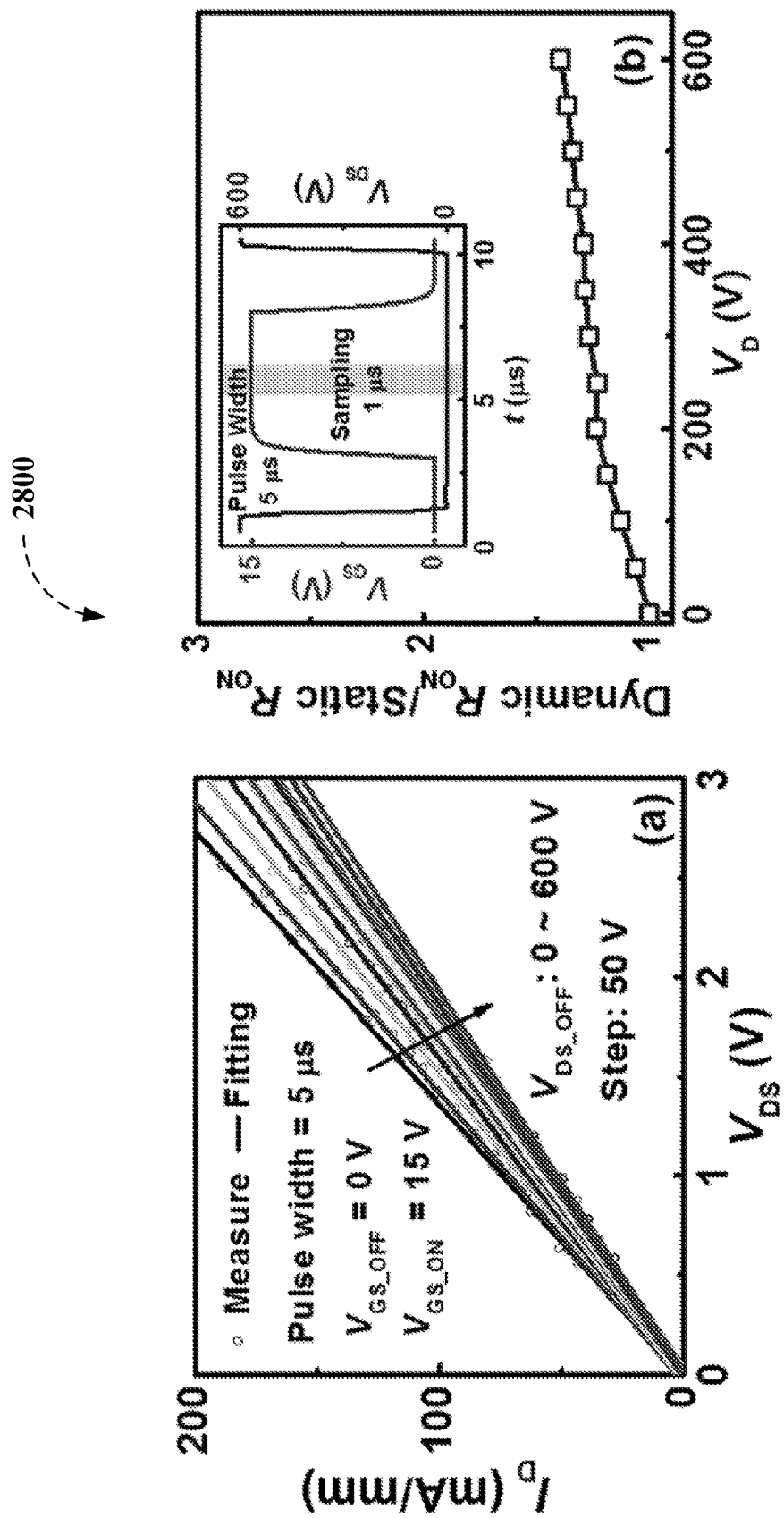
FIG. 28 demonstrates exemplary normalized dynamic on-resistance or $I_D$-$V_{DS}$ characteristics in linear region of an exemplary LPCVD-SiN$_x$ MIS-FET device, with gate-to-drain distance of 15 μm and with an exemplary gate interface protection layer, and normalized dynamic RON extracted from the pulsed $I_D$-VDs with $V_{GS\_ON}$=15 volts (V), wherein waveforms of $V_{GS}$ and $V_{DS}$ during the pulsed $I_D$-$V_{DS}$ test are depicted, for an exemplary device having dimensions, $L_{GS}/L_G/L_{GD}$=2/1.5/15 μm.

FIG. 28 demonstrates exemplary normalized dynamic on-resistance or $I_D$-$V_{DS}$ characteristics in linear region of an exemplary LPCVD-$SiN_x$ MIS-FET device, with gate-to-drain distance of 15 μm and with an exemplary gate interface protection layer 204, and normalized dynamic RON extracted from the pulsed $I_D$-$V_{DS}$ with $V_{GS\_ON}$=15 volts (V), wherein waveforms of $V_{GS}$ and $V_{DS}$ during the pulsed $I_D$-$V_{DS}$ test are depicted, for an exemplary device having dimensions, $L_{GS}/L_G/L_{GD}$=2/1.5/15 μm. The dynamic on-resistance is extracted from the pulsed $I_D$-$V_{DS}$ with $V_{GS\_ON}$=15 V. The ratio dynamic-$R_{ON}$/static-$R_{ON}$ only increases to 1.40 with a switching time of 5 μs and off-state quiescent drain bias ($V_{DS\_OFF}$) up to 600 V.

Figure 29:
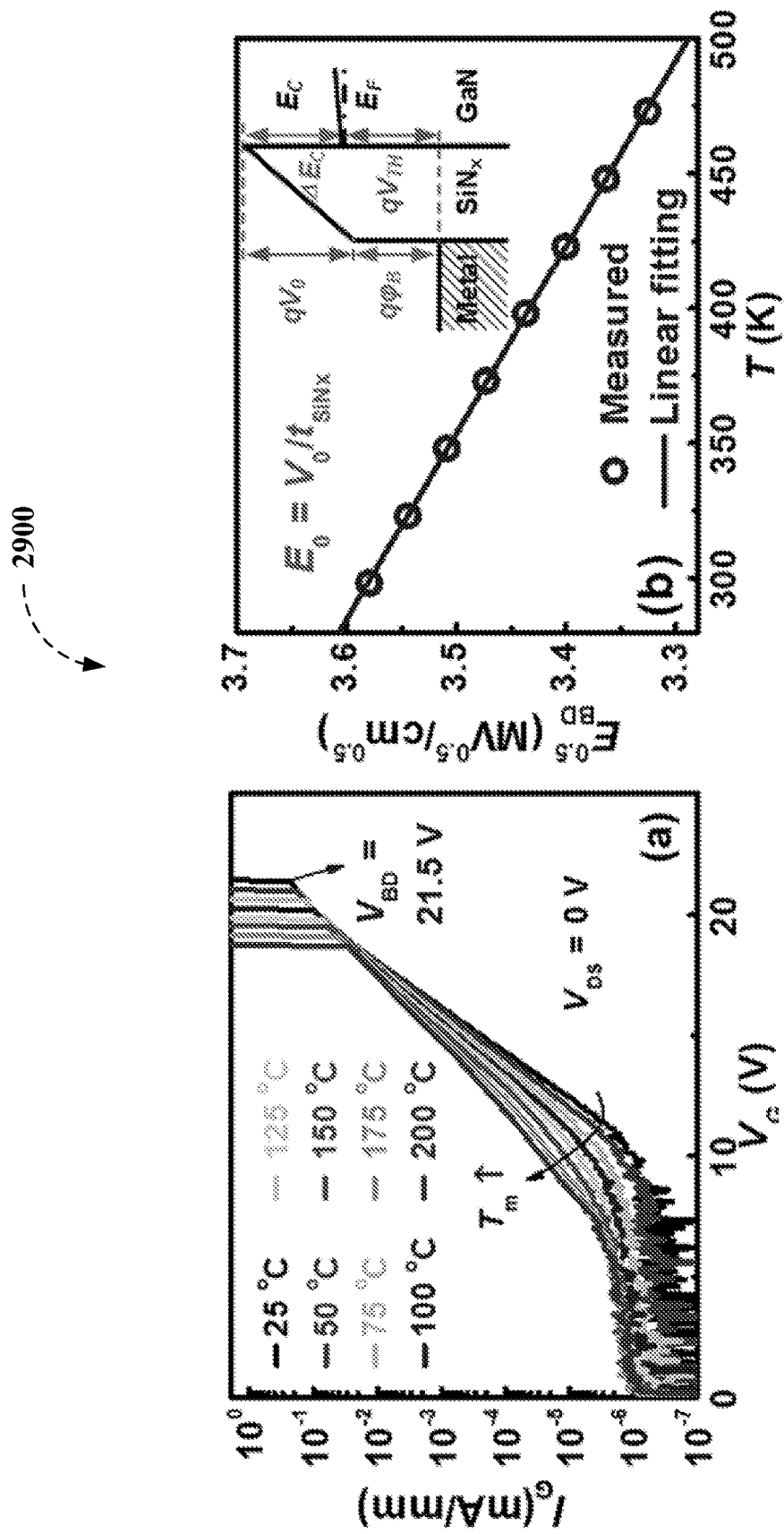
FIG. 29 demonstrates exemplary temperature-dependent gate leakage $I_G$-$V_G$ characteristics of an exemplary LPCVD-SiN$_x$ MIS-FET device, with an exemplary gate interface protection layer and with gate dielectric deposited at high temperature, and with Tm increasing from 25° C. to 200° C., and T-dependence of electric-field strength (EBD), wherein energy band diagram along the vertical direction in the gate region with $V_G$=VTH is depicted, with the electric field in gate dielectric estimated as $E_{SiNx}$=($V_G$-$V_{TH}$)/$t_{SiNx}$+ $E_0$.

FIG. 29 demonstrates exemplary temperature-dependent gate leakage $I_G$-$V_G$ characteristics of an exemplary LPCVD-$SiN_x$ MIS-FET device, with an exemplary gate interface protection layer 204 and with gate dielectric 114 deposited at high temperature, and with $T_m$ increasing from 25° C. to 200° C., and T-dependence of electric-field strength (EBD), wherein energy band diagram along the vertical direction in the gate region with $V_G$=$V_{TH}$ is depicted, with the electric field in gate dielectric estimated as $E_{SiNx}$=($V_G$-$V_{TH}$)/$t_{SiNx}E_0$. The gate dielectric 114 enables a high forward gate breakdown voltage of 21.5 V (electric field ~12 megaVolts (MV)/cm) at 25° C. and effectively suppressed gate leakage even at 200° C.

Figure 30:
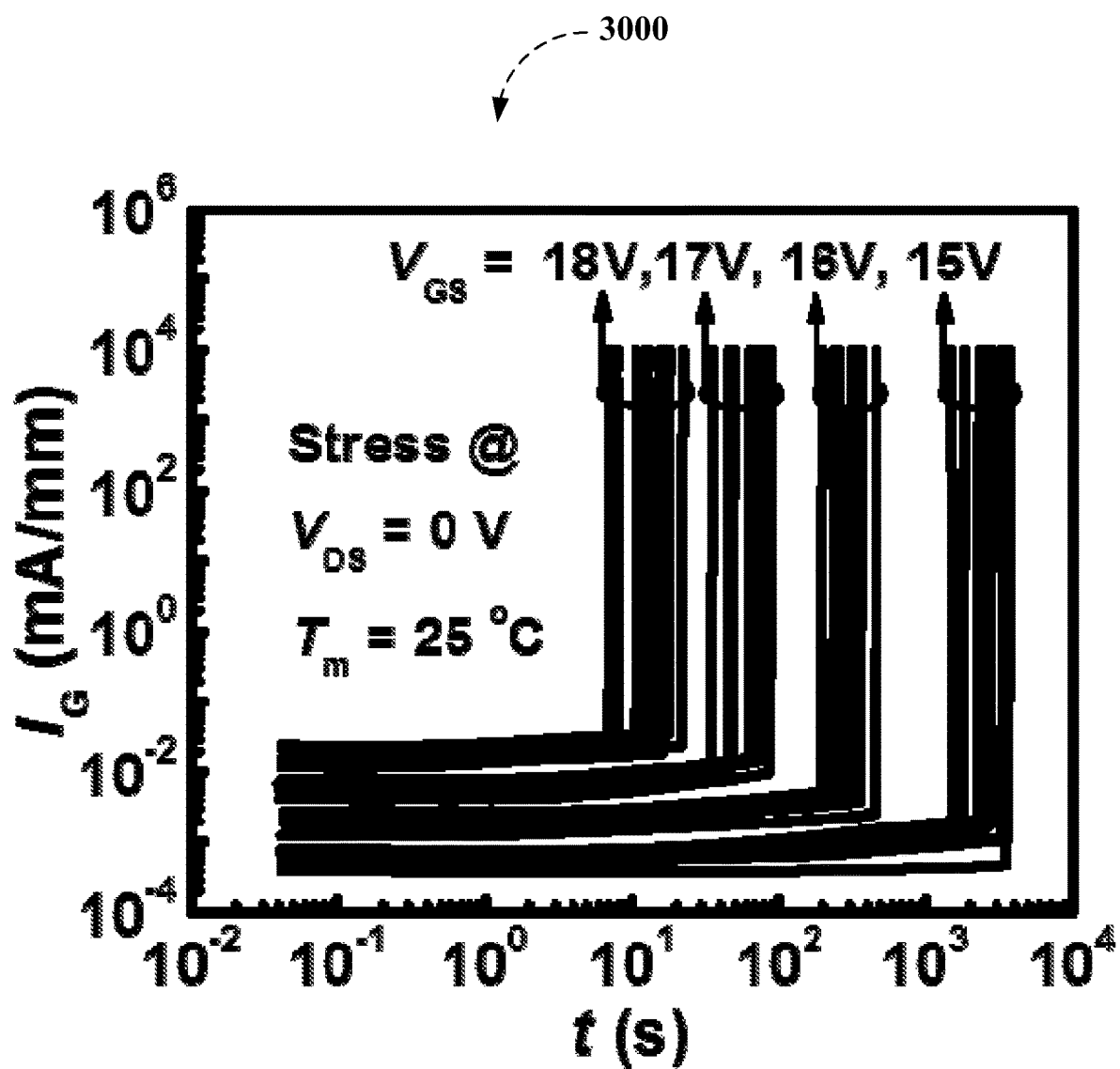
FIG. 30 depicts exemplary time to breakdown ($t_{BD}$) of a non-limiting LPCVD-SiN$_x$ MIS-FETs with gate interface protection layer according to an exemplary first embodiment at forward gate stress of 18, 17, 16 and 15 V at 25° C.
Figure 31:
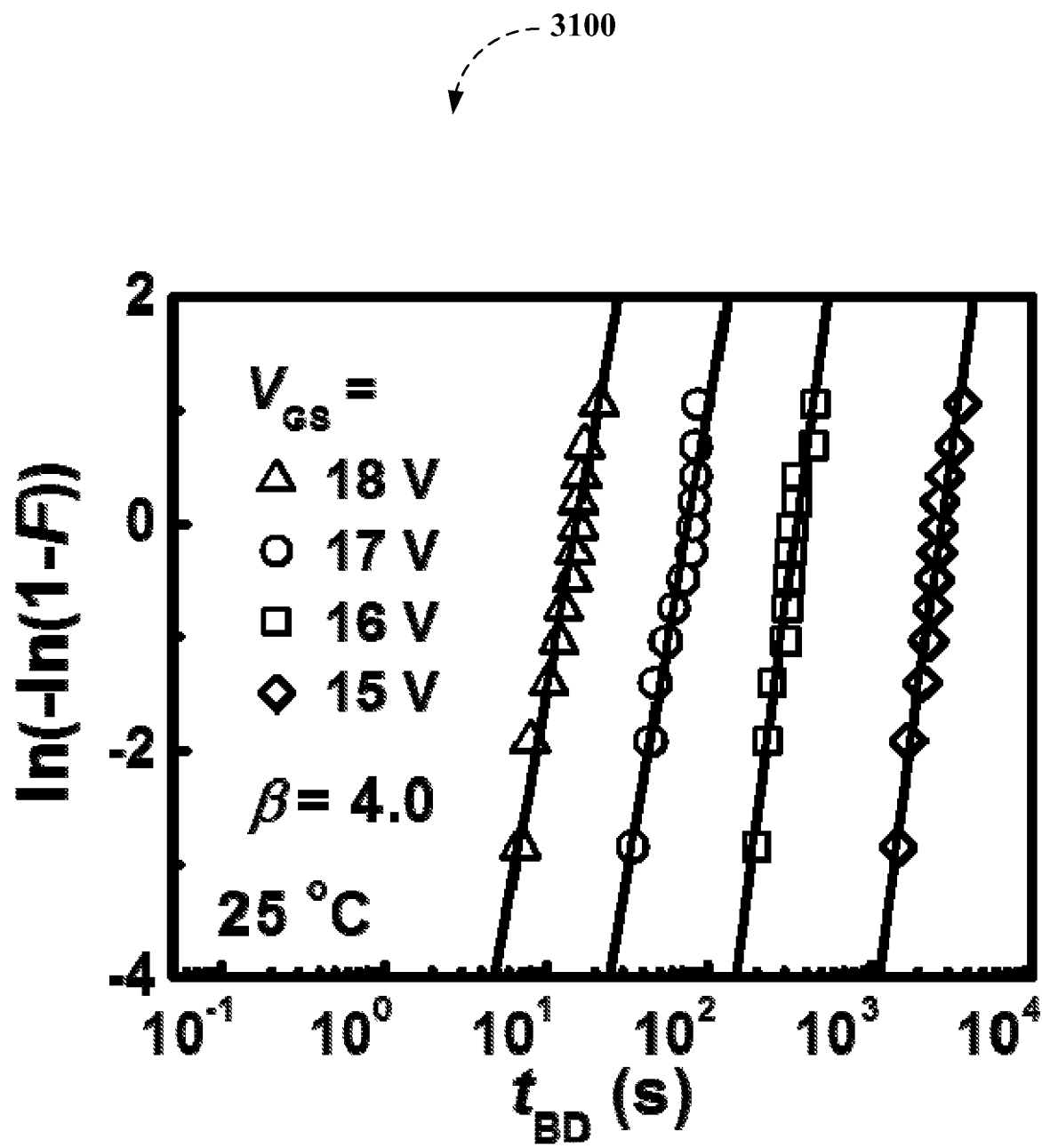
FIG. 31 depicts exemplary Weibull plot of the electric field-dependent $t_{BD}$ distribution for a non-limiting LPCVD-SiN$_x$ MIS-FETs with gate interface protection layer according to an exemplary first embodiment.
Figure 32:
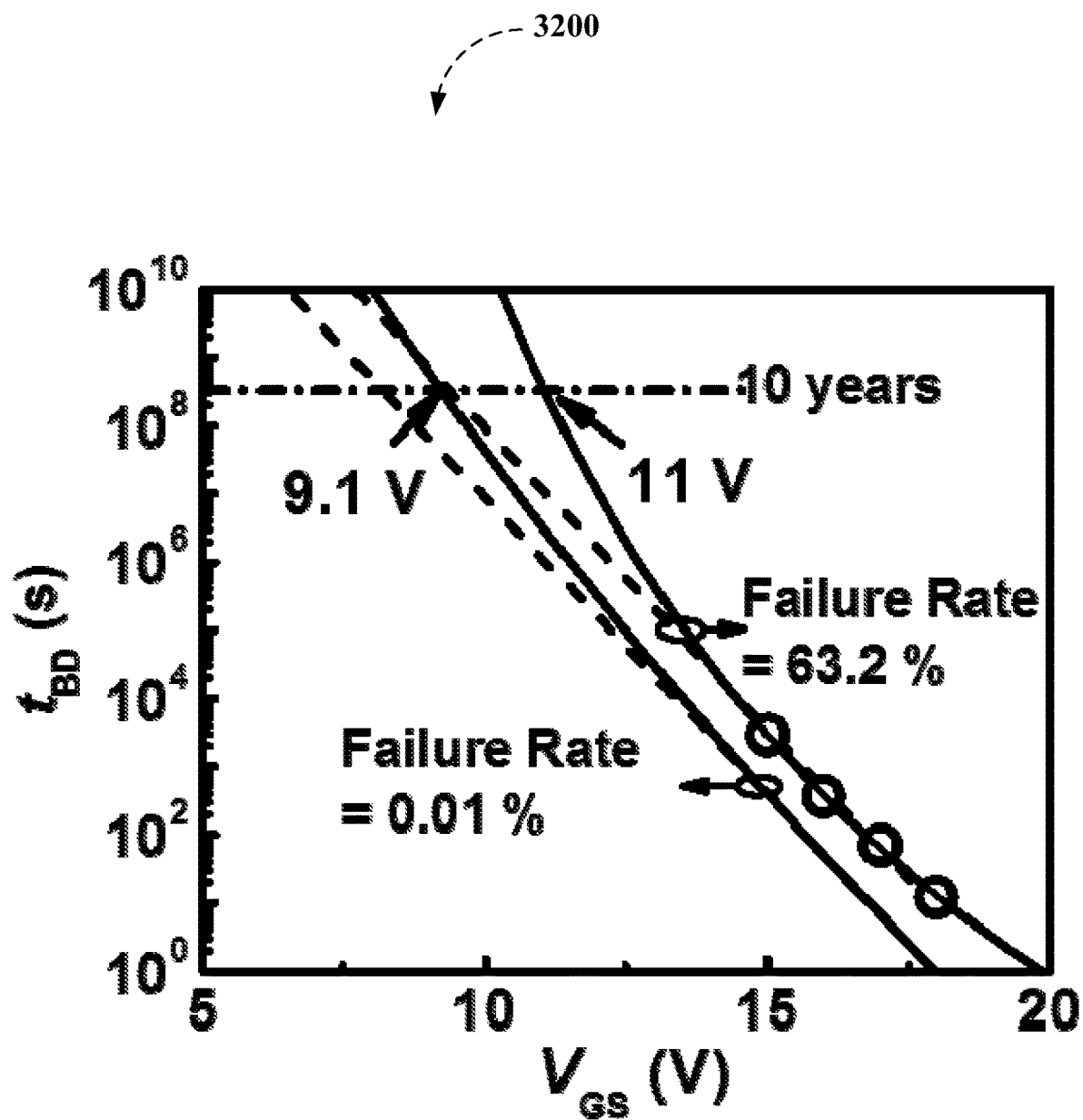
FIG. 32 depicts exemplary lifetime prediction with failure rate of 63.2% and 0.01%, respectively, for a non-limiting LPCVD-SiN$_x$ MIS-FETs with gate interface protection layer according to an exemplary first embodiment.

FIG. 30 depicts exemplary time to breakdown ($t_{BD}$) of a non-limiting LPCVD-$SiN_x$ MIS-FETs with gate interface protection layer 204 according to an exemplary first embodiment at forward gate stress of 18, 17, 16 and 15 V at 25° C. FIG. 31 depicts exemplary Weibull plot of the electric field-dependent $t_{BD}$ distribution for a non-limiting LPCVD-SiN$_x$ MIS-FETs with gate interface protection layer 204 according to an exemplary first embodiment. FIG. 32 depicts exemplary lifetime prediction with failure rate of 63.2% and 0.01%, respectively, for a non-limiting LPCVD-SiN$_x$ MIS-FETs with gate interface protection layer 204 according to an exemplary first embodiment. The lifetime of gate dielectric is predicted to be 11 V at a failure rate of 63.2% and 9.1 V at failure rate of 0.01%, as compared to a reported value for p-GaN devices at lower than 6.5 V for a 10 years lifetime with a failure rate of 63.2%.

Figure 33:
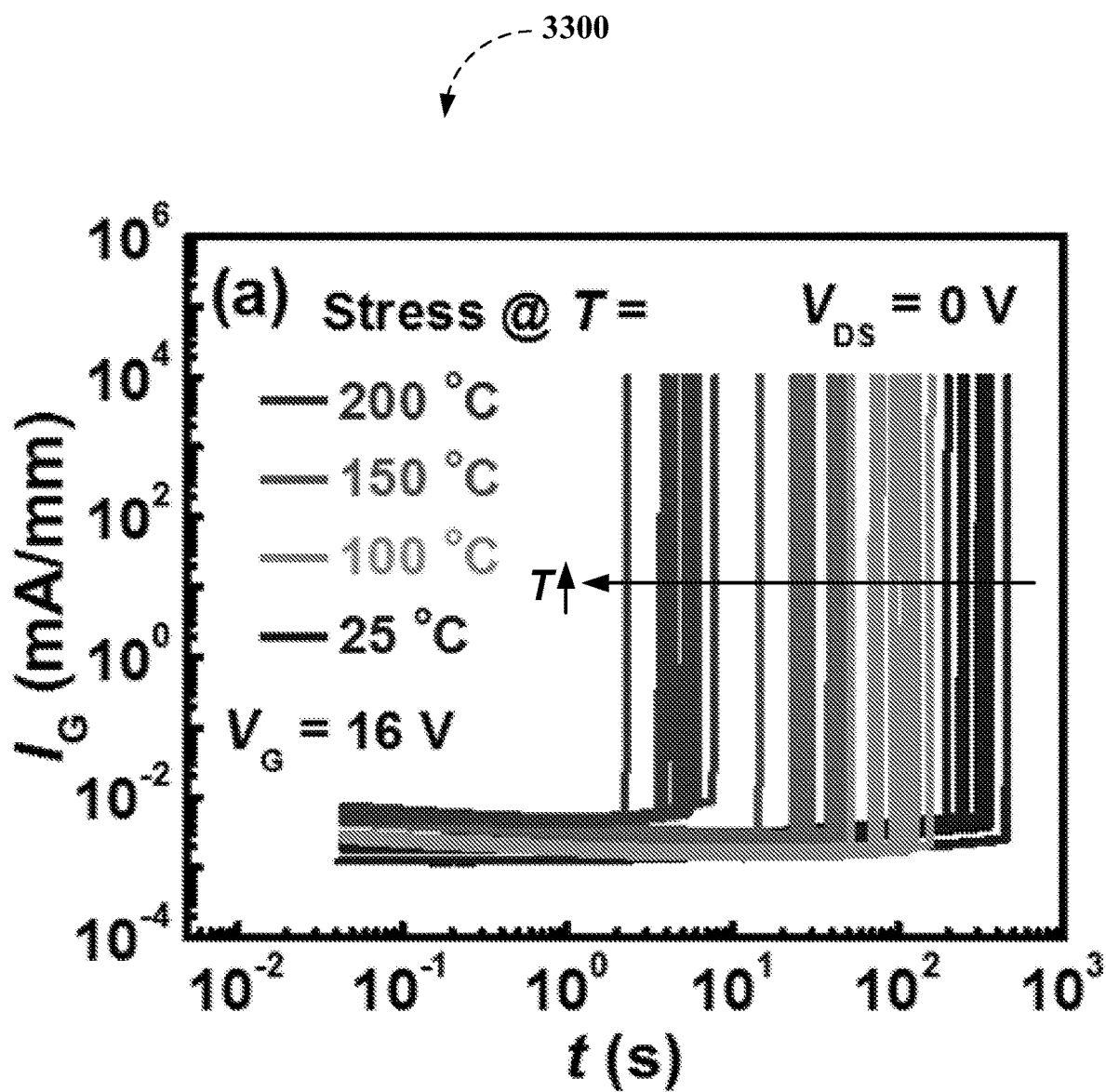
FIG. 33 depicts exemplary time to breakdown ($t_{BD}$) of the LPCVD-SiN$_x$ MIS-FETs with gate interface protection layer at 25° C., 100° C., 150° C., and 200° C. with forward gate stress of 16 V.
Figure 34:
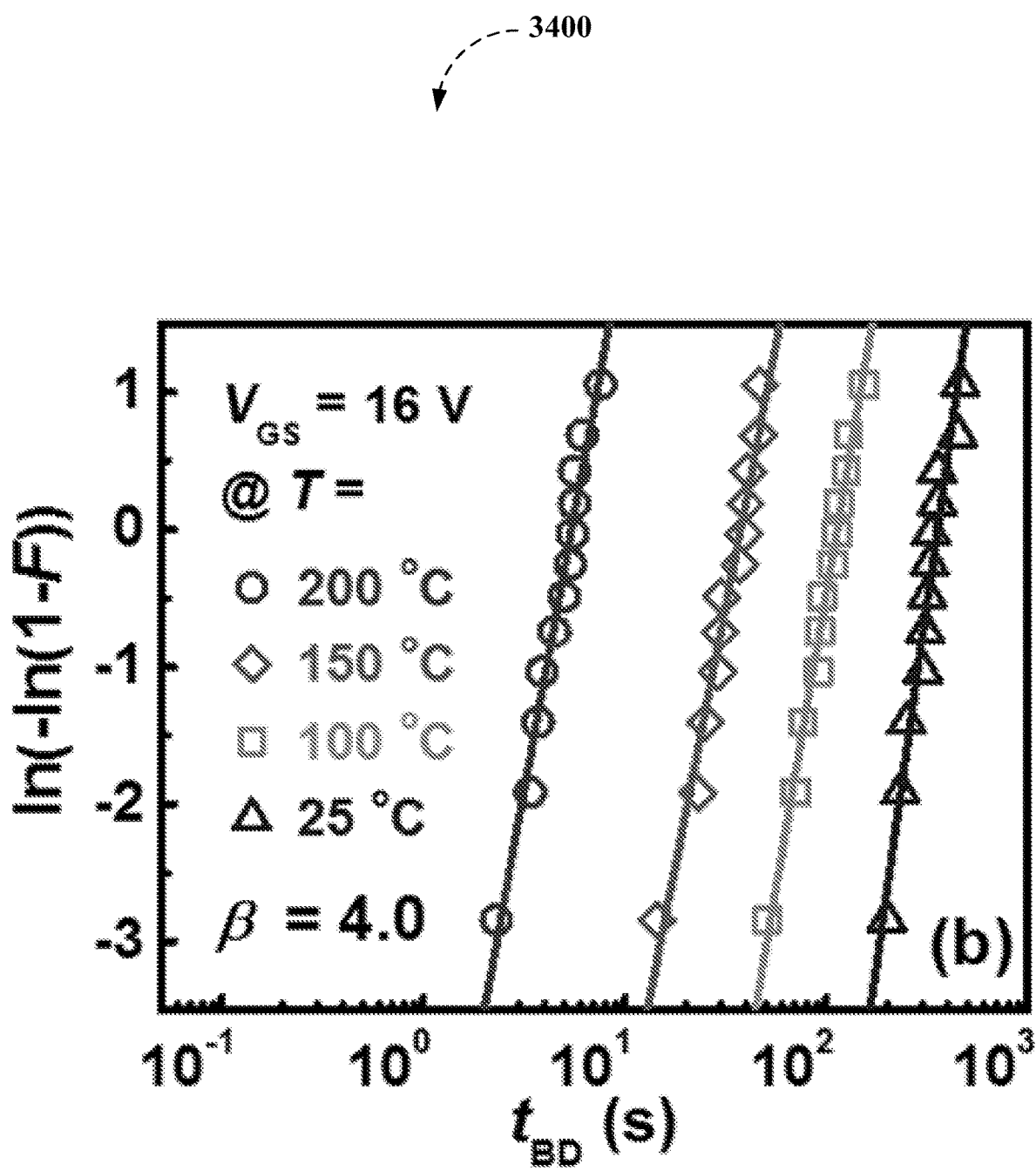
FIG. 34 depicts an exemplary Weibull plot of the temperature-dependent $t_{BD}$ distribution.
Figure 35:
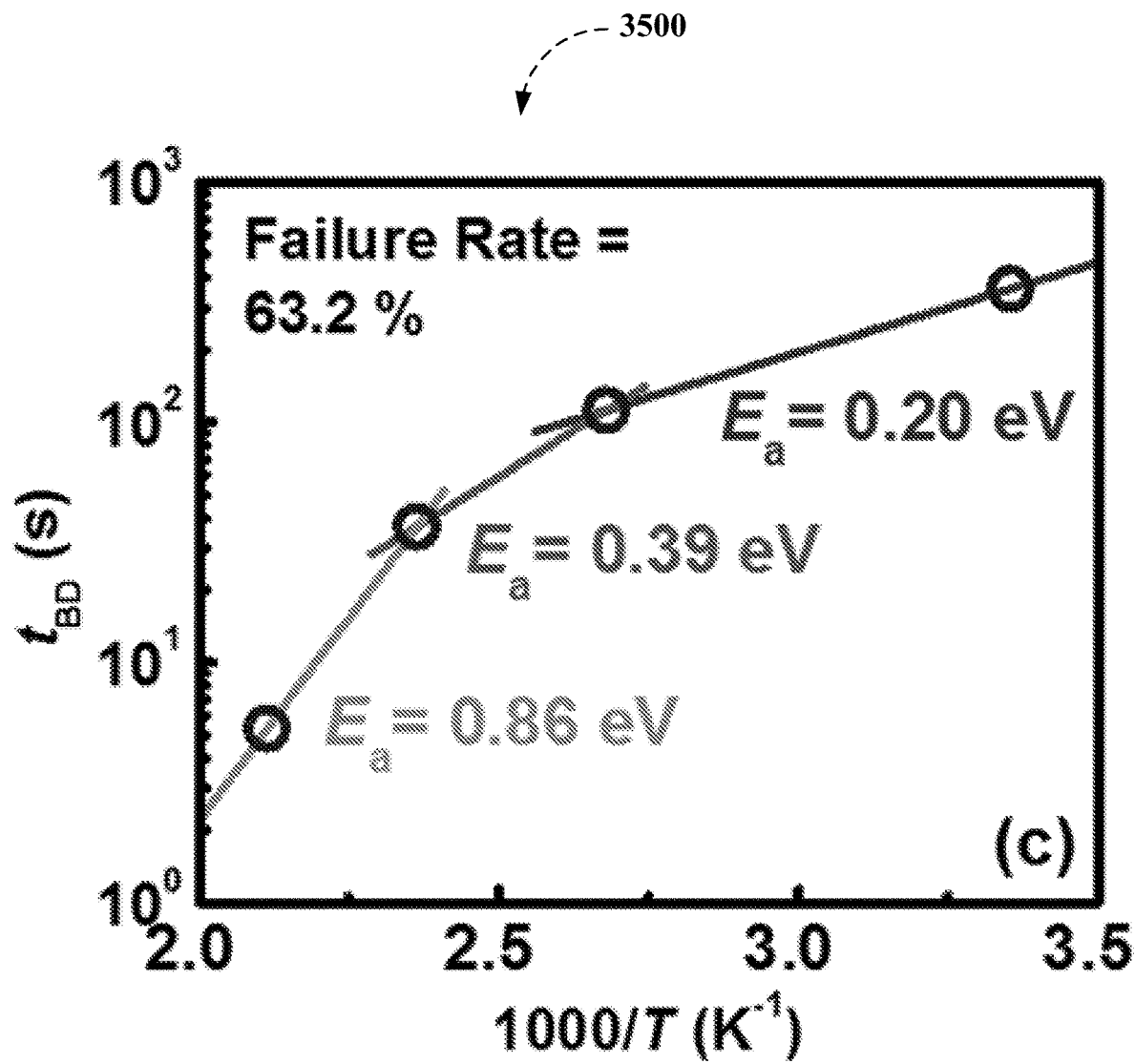
FIG. 35 depicts an exemplary Arrhenius plot of $t_{BD}$ extracted at the failure rate of 63.2%.

FIG. 33 depicts exemplary time to breakdown ($t_{BD}$) of the LPCVD-SiN$_x$ MIS-FETs with gate interface protection layer at 25° C., 100° C., 150° C., and 200° C. with forward gate stress of 16 V. FIG. 34 depicts an exemplary Weibull plot of the temperature-dependent $t_{BD}$ distribution. FIG. 35 depicts an exemplary Arrhenius plot of $t_{BD}$ extracted at the failure rate of 63.2%.

Figure 36:
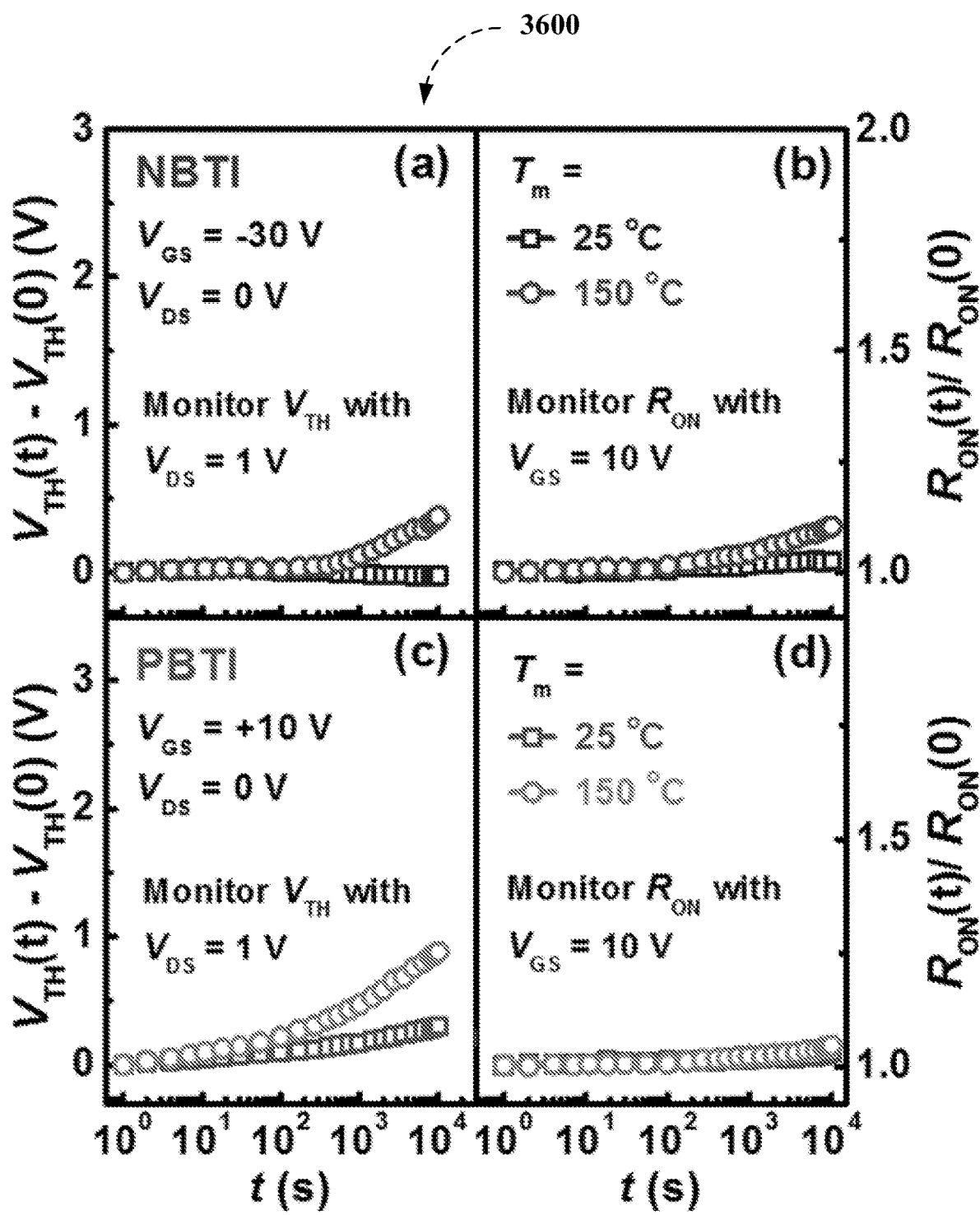
FIG. 36 depicts exemplary monitored $V_{TH}$ and $R_{ON}$ of LPCVD-SiN$_x$ MIS-FET with gate interface protection layer during the gate bias stress with $V_{GS}$=-30 V (negative-bias temperature instability (NBTI), (a) and (b)) and $V_{GS}$=10 V (positive bias temperature instability (PBTI), (c) and (d)) at both 25° C. and 150° C., for an exemplary device having dimensions, $L_{GS}/L_G/L_{GD}$=1.5/2/2 μm.

FIG. 36 depicts exemplary monitored $V_{TH}$ and $R_{ON}$ of LPCVD-SiN$_x$ MIS-FET with gate interface protection layer during the gate bias stress with $V_{GS}$=−30 V (negative-bias temperature instability (NBTI), (a) and (b)) and $V_{GS}$=10 V (positive bias temperature instability (PBTI), (c) and (d)) at both 25° C. and 150° C., for an exemplary device having dimensions, $L_{GS}/L_G/L_{GD}$=1.5/2/2 µm.

Figure 37:
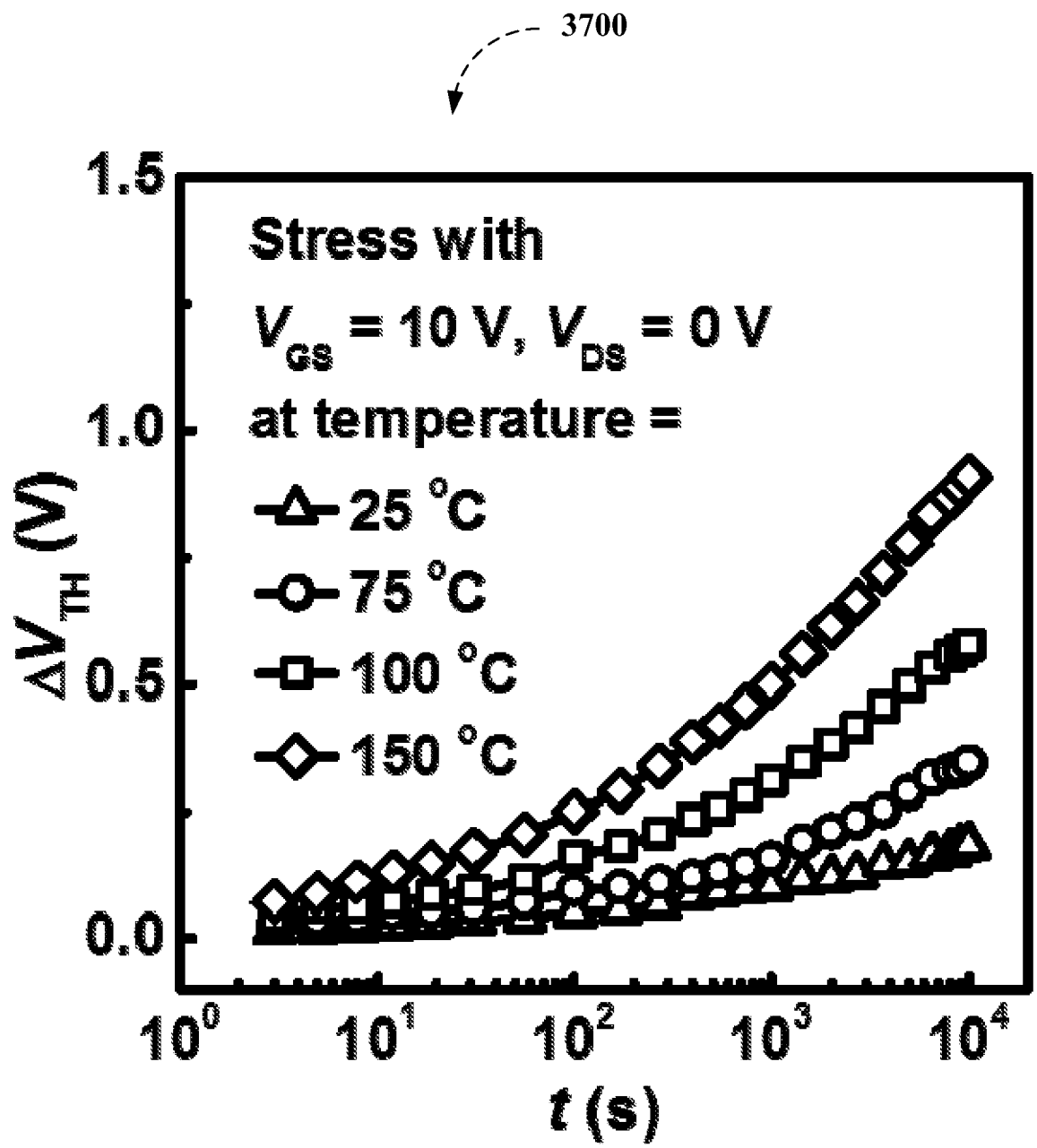
FIG. 37 depicts exemplary monitored threshold voltage of a non-limiting device according to an exemplary first embodiment during the gate bias stress with $V_{GS}$=+10 V.
Figure 38:
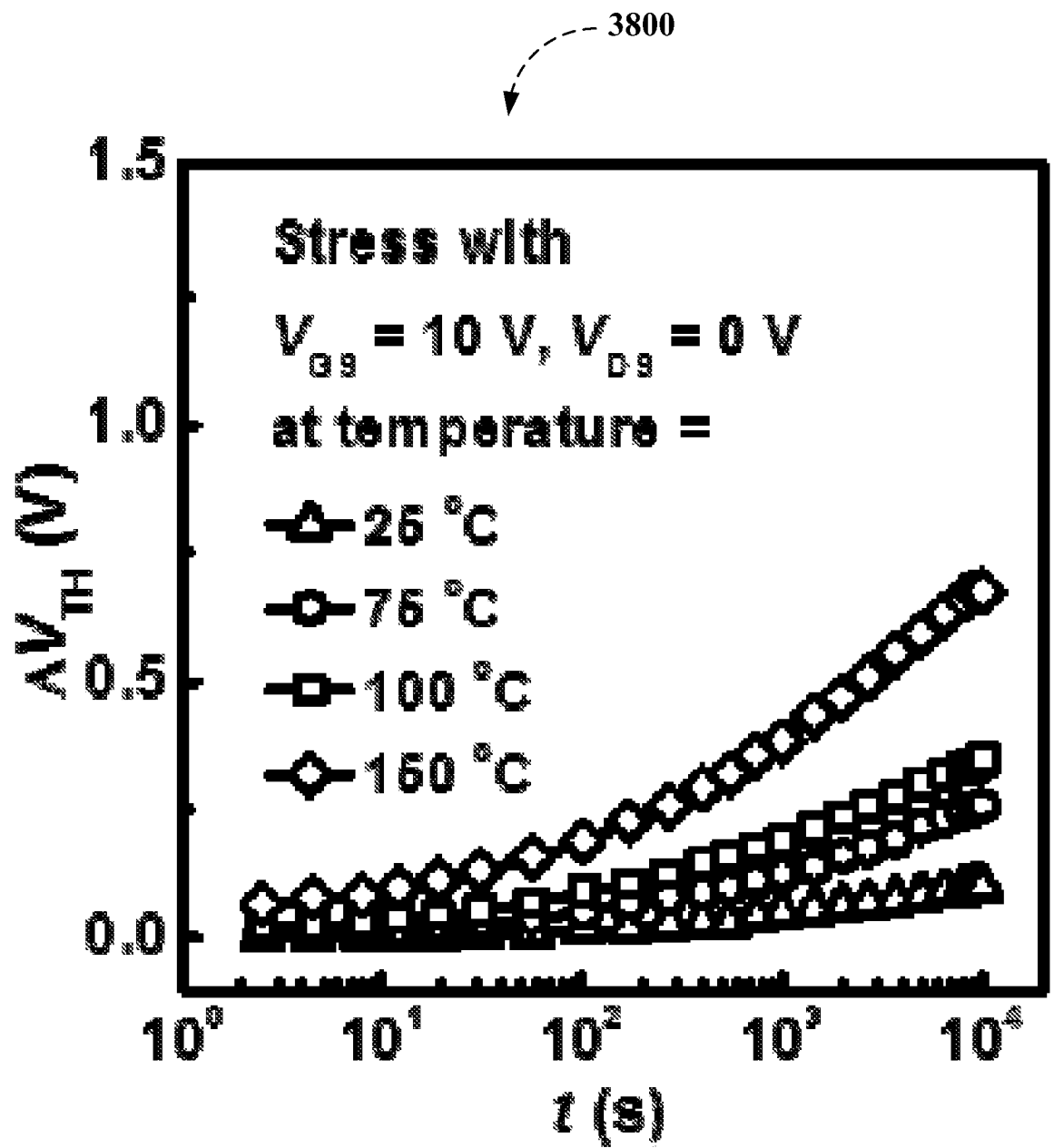
FIG. 38 depicts exemplary monitored threshold voltage of a non-limiting device according to an exemplary second embodiment during the gate bias stress with $V_{GS}$=+10 V.

FIG. 37 depicts exemplary monitored threshold voltage of a non-limiting device according to an exemplary first embodiment during the gate bias stress with $V_{GS}$=+10 V. FIG. 38 depicts exemplary monitored threshold voltage of a non-limiting device according to an exemplary second embodiment during the gate bias stress with $V_{GS}$=+10 V.

Figure 39:
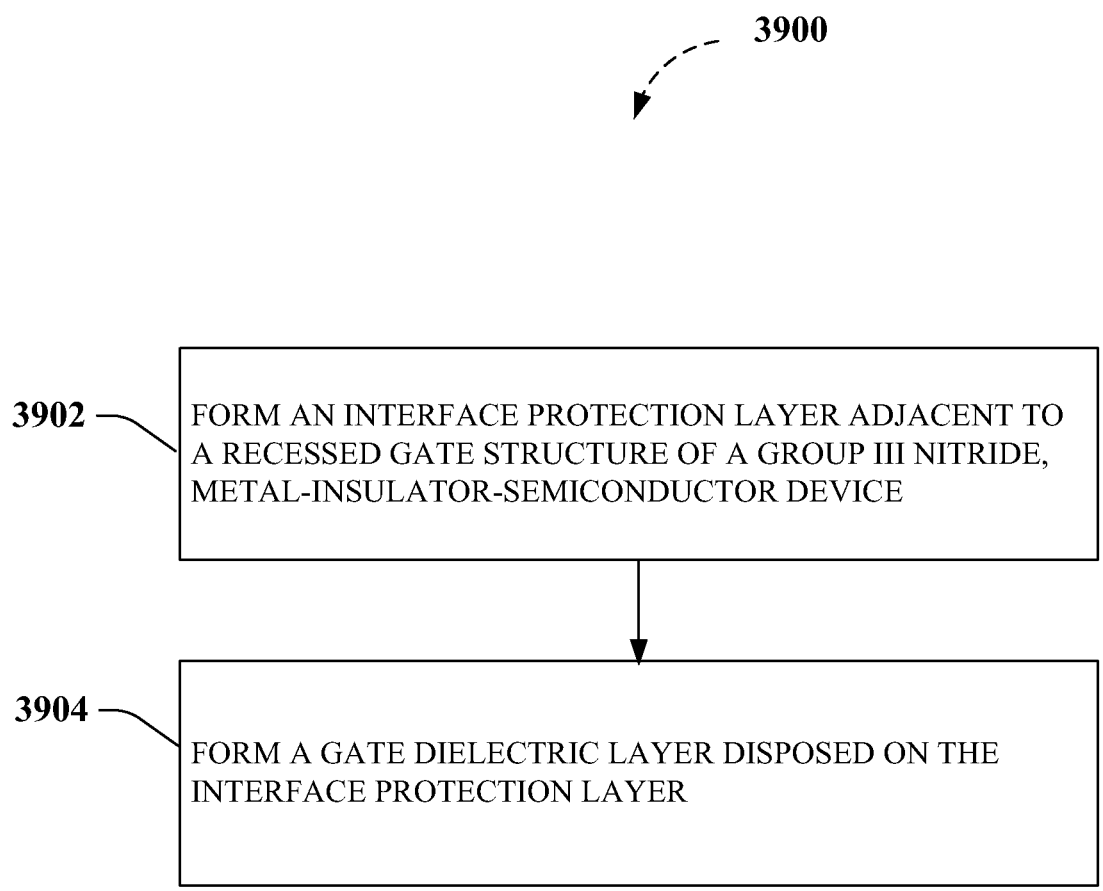
FIG. 39 depicts exemplary non-limiting methods in accordance with aspects of the disclosed subject matter.
Figure 40:
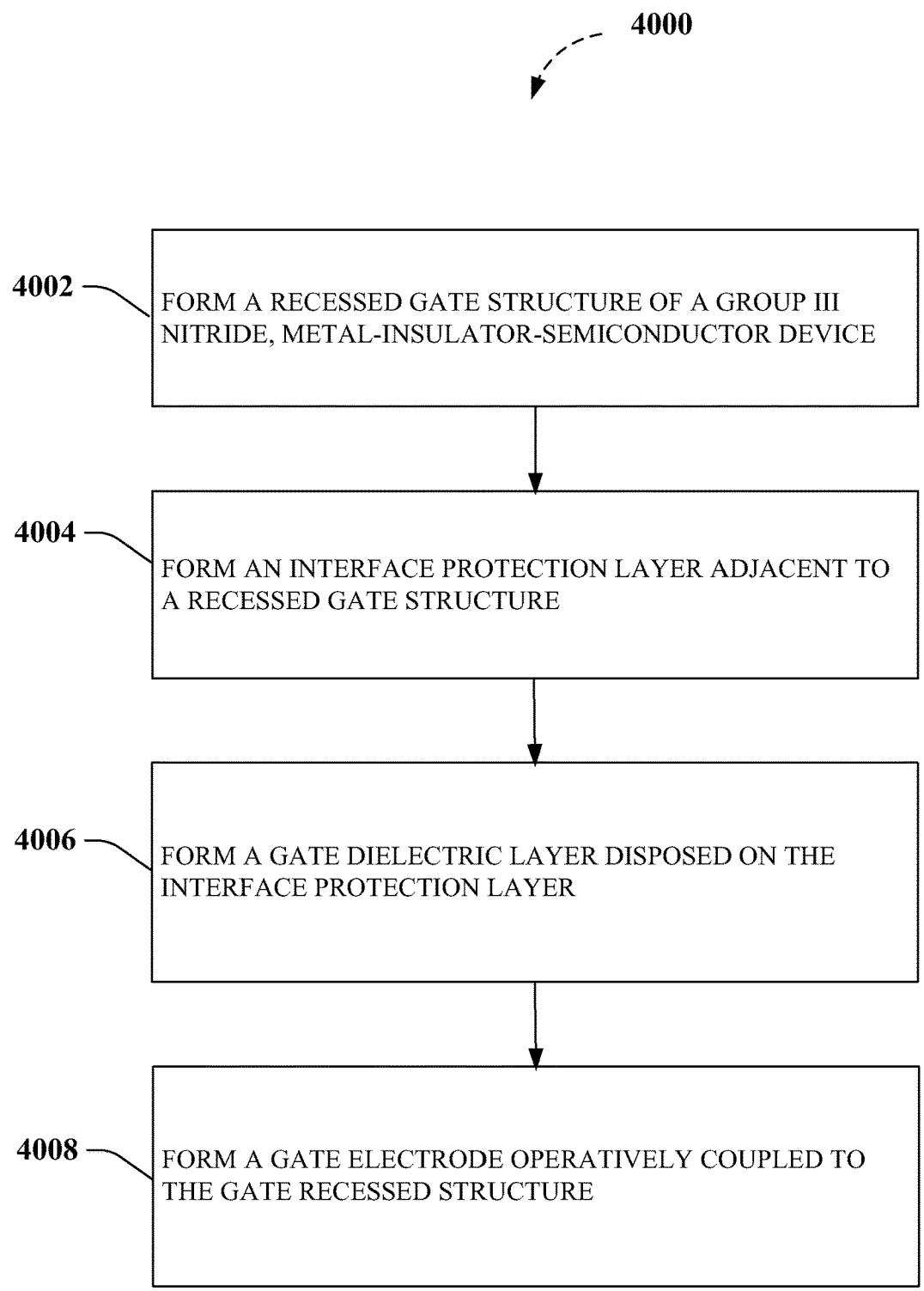
FIG. 40 depicts other exemplary non-limiting methods in accordance with further aspects of the disclosed subject matter.

In view of the structures and devices described supra, methodologies that can be implemented in accordance with the disclosed subject matter will be better appreciated with reference to the flowcharts of FIGS. 39-40. While for purposes of simplicity of explanation, the methodologies are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methodologies described hereinafter.

Exemplary Methodologies

FIG. 39 depicts exemplary non-limiting methods 3900 in accordance with aspects of the disclosed subject matter. As a non-limiting example, exemplary methods 3900 can comprise, at 3902, forming an interface protection layer (e.g., gate interface protection layer 204, 302, etc.) adjacent to a recessed gate structure (e.g., adjacent to a gate recess formed at the gate foot area of a recessed gate structure 202 (e.g., fully recessed or partially recessed), etc.) of a metal-insulator-semiconductor device (e.g., a group III nitride, metal-insulator-semiconductor high-electron-mobility transistor (MIS-HEMT) device, a MIS-FET device, etc.). For instance, in a non-limiting aspect, exemplary methods 3900 can comprise forming the interface protection layer (e.g., gate interface protection layer 302, etc.) comprising exposing a surface of the channel layer to an oxygen-containing plasma or an oxygen-containing gas, as further described herein. In a further non-limiting aspect, exemplary methods 3900 can comprise forming the interface protection layer (e.g., gate interface protection layer 204, etc.) comprises forming one or more layer of one or more of an oxide, silicon oxide, silicon nitride, or silicon oxynitride adjacent to the recessed gate structure (e.g., a gate recess formed at the gate foot area of a recessed gate structure 202 (e.g., fully recessed or partially recessed), etc.). In addition, exemplary methods 3900 can further comprise forming the interface protection layer (e.g., gate interface protection layer 204, etc.) comprising depositing a dielectric material at or below about 300° C. or depositing the dielectric material via PECVD, as further described herein. Exemplary methods 3900 can further forming the interface protection layer (e.g., gate interface protection layer 204, gate interface protection layer 302, etc.) adjacent to a recessed gate structure (e.g., a gate recess formed at the gate foot area of a recessed gate structure 202 (e.g., fully recessed or partially recessed), etc.) of the group III nitride, metal-insulator-semiconductor device comprising forming the interface protection layer (e.g., gate interface protection layer 204, gate interface protection layer 302, etc.) adjacent to a fully recessed gate structure (e.g., a gate recess formed at the gate foot area of a recessed gate structure 202, etc.) of a metal-insulator-semiconductor field-effect-transistor device, to a partially recessed gate structure (e.g., a gate recess formed at the gate foot area of a recessed gate structure 202, etc.) of a high electron mobility transistor device, etc. as further described herein.

In a further non-limiting example, exemplary methods 3900 can comprise, at 3904, forming a gate dielectric layer (e.g., gate dielectric 114, etc.) disposed on the interface protection layer (e.g., gate interface protection layer 204, 302, etc.). As a non-limiting example, exemplary methods 3900 can comprise forming the gate dielectric layer comprises at least one of depositing the gate dielectric layer (e.g., gate dielectric 114, etc.) at or above about 780° C., depositing one or more layer of one or more of silicon nitride, silicon oxide, or silicon oxynitride, or depositing the gate dielectric layer (e.g., gate dielectric 114, etc.) via LPCVD, as further described herein. As a further non-limiting example, depositing the gate dielectric layer (e.g., gate dielectric 114, etc.) can comprise depositing one or more of silicon oxide, silicon nitride, or silicon oxynitride.

Exemplary methods 3900 can further comprise forming the recessed gate structure (e.g., a gate recess formed at the gate foot area of a recessed gate structure 202 (e.g., fully recessed or partially recessed), etc.). As a non-limiting example, forming the recessed gate structure (e.g., a gate recess formed at the gate foot area of a recessed gate structure 202 (e.g., fully recessed or partially recessed)) can comprise etching a portion of a barrier layer (e.g., barrier layer 110, etc.) and a portion of a channel layer (e.g., semiconductor or channel layer 108, etc.) of the metal-insulator-semiconductor device, as further described herein. In addition, exemplary methods 3900 can comprise forming a gate electrode 118 operatively coupled to the gate recessed structure (e.g., a gate recess formed at the gate foot area of a recessed gate structure 202 (e.g., fully recessed or partially recessed), etc.).

FIG. 40 depicts other exemplary non-limiting methods 4000 in accordance with further aspects of the disclosed subject matter. As a non-limiting example, exemplary methods 4000 can comprise, at 4002, forming the recessed gate structure (e.g., a gate recess formed at the gate foot area of a recessed gate structure 202 (e.g., fully recessed or partially recessed), etc.). As a non-limiting example, forming the recessed gate structure (e.g., a gate recess formed at the gate foot area of a recessed gate structure 202 (e.g., fully recessed or partially recessed)) can comprise etching a portion of a barrier layer (e.g., barrier layer 110, etc.) and a portion of a channel layer (e.g., semiconductor or channel layer 108, etc.) of the metal-insulator-semiconductor device, as further described herein.

In a further non-limiting example, exemplary methods 4000 can comprise, at 4004, forming an interface protection layer (e.g., gate interface protection layer 204, 302, etc.) adjacent to a recessed gate structure (e.g., adjacent to a gate recess formed at the gate foot area of a recessed gate structure 202 (e.g., fully recessed or partially recessed), etc.) of a metal-insulator-semiconductor device (e.g., a group III nitride, metal-insulator-semiconductor high-electron-mobility transistor (MIS-HEMT) device, a MIS-FET device, etc.). For instance, in a non-limiting aspect, exemplary methods 4000 can comprise forming the interface protection layer (e.g., gate interface protection layer 302, etc.) comprising exposing a surface of the channel layer to an oxygen-containing plasma or an oxygen-containing gas, as further described herein. In a further non-limiting aspect, exemplary methods 4000 can comprise forming the interface protection layer (e.g., gate interface protection layer 204, etc.) comprises forming one or more layer of one or more of an oxide, silicon oxide, silicon nitride, or silicon oxynitride adjacent to the recessed gate structure (e.g., a gate recess formed at the gate foot area of a recessed gate structure 202 (e.g., fully recessed or partially recessed), etc.). In addition, exemplary methods 4000 can further comprise forming the interface protection layer (e.g., gate interface protection layer 204, etc.) comprising depositing a dielectric material at or below about 300° C. or depositing the dielectric material via PECVD, as further described herein. Exemplary methods 4000 can further forming the interface protection layer (e.g., gate interface protection layer 204, gate interface protection layer 302, etc.) adjacent to a recessed gate structure (e.g., a gate recess formed at the gate foot area of a recessed gate structure 202 (e.g., fully recessed or partially recessed), etc.) of the group III nitride, metal-insulator-semiconductor device comprising forming the interface protection layer (e.g., gate interface protection layer 204, gate interface protection layer 302, etc.) adjacent to a fully recessed gate structure (e.g., a gate recess formed at the gate foot area of a recessed gate structure 202, etc.) of a metal-insulator-semiconductor field-effect-transistor device, to a partially recessed gate structure (e.g., a gate recess formed at the gate foot area of a recessed gate structure 202, etc.) of a high electron mobility transistor device, etc. as further described herein.

In a further non-limiting example, methods 4000 can comprise, at 4006, forming a gate dielectric layer (e.g., gate dielectric 114, etc.) disposed on the interface protection layer (e.g., gate interface protection layer 204, 302, etc.). As a non-limiting example, exemplary methods 4000 can comprise forming the gate dielectric layer comprises at least one of depositing the gate dielectric layer (e.g., gate dielectric 114, etc.) at or above about 780° C., depositing one or more layer of one or more of silicon nitride, silicon oxide, or silicon oxynitride, or depositing the gate dielectric layer (e.g., gate dielectric 114, etc.) via LPCVD, as further described herein. As a further non-limiting example, depositing the gate dielectric layer (e.g., gate dielectric 114, etc.) can comprise depositing one or more of silicon oxide, silicon nitride, or silicon oxynitride. In addition, exemplary methods 4000 can comprise forming a gate electrode 118 operatively coupled to the gate recessed structure (e.g., a gate recess formed at the gate foot area of a recessed gate structure 202 (e.g., fully recessed or partially recessed), etc.), at 4008.

While the disclosed subject matter has been described in connection with the preferred embodiments of the various figures, it is to be understood that other similar embodiments may be used or modifications and additions may be made to the described embodiments for performing the same function of the disclosed subject matter without deviating therefrom. For example, one skilled in the art will recognize that aspects of the disclosed subject matter as described in the various embodiments of the present application may apply to other Group III-Nitride heterostructures, other insulating or semiconducting materials or substrates, etc.

As a further example, for simplicity and clarity of illustration, the drawing figures illustrate the general manner of construction, and description, details, and techniques may be omitted to avoid unnecessarily obscuring the disclosed concepts. Additionally, elements in the drawing figures are not necessarily drawn to scale, and some areas or elements may be expanded to help improve understanding of embodiments of the disclosed embodiments.

In other instances, variations of process parameters (e.g., dimensions, configuration, process step timing and order, addition and/or deletion of process steps, addition of pre-processing and/or post-processing steps, etc.) may be made to further optimize the provided structures, devices and methodologies, as shown and described herein. In any event, the structures and devices, as well as the associated methodologies described herein have many applications in metal-insulator-semiconductor transistor heterostructures. For instance, it is contemplated and intended that various aspects of the disclosed subject can be applied to other heterostructures, for example, other than single simple AlGaN/GaN heterostructures. However, an ordinary person in the art would know the variations to modify the design to make other combinations and forms of designs.

Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements or combinations not expressly listed or combinations, whether inherent to such process, method, article, apparatus, or composition, or otherwise.

Therefore, the disclosed subject matter should not be limited to any single embodiment described herein, but rather should be construed in breadth and scope in accordance with the appended claims.

What is claimed is:

1. A metal-insulator-semiconductor device, comprising:
a recessed gate structure that is recessed into a portion of a barrier layer and a channel layer of the metal-insulator-semiconductor device;
an interface protection layer adjacent to the recessed gate structure, wherein the interface protection layer is located at a gate foot area of the recessed gate structure; and
a gate dielectric layer disposed on the interface protection layer, wherein the gate dielectric layer is located between a gate electrode and the channel layer, wherein the gate dielectric layer comprises a low-pressure chemical vapor deposited silicon nitride formation that was deposited at or above about 780 degrees Celsius, wherein the interface protection layer is located between the gate dielectric layer and the channel layer and comprises an oxidized portion of the channel layer at the gate foot area of the recessed gate that was oxidized at or below about 300 degrees Celsius, wherein the interface protection layer comprises a uniform surface morphology at an interface between the channel layer and the gate dielectric layer, and wherein the interface protection layer is adapted to protect the channel layer from surface decomposition associated with gate dielectric deposition.

2. The metal-insulator-semiconductor device of claim 1, wherein the recessed gate structure comprises at least one of a fully recessed gate region or a partially recessed gate region, and wherein the portion of the barrier layer of the device is removed.

3. The metal-insulator-semiconductor device of claim 2, further comprising:
a passivation layer disposed on the barrier layer.

4. The metal-insulator-semiconductor device of claim 1, wherein the gate electrode is operatively coupled to the recessed gate structure.

5. The metal-insulator-semiconductor device of claim 4, further comprising:
a source electrode and a drain electrode operatively coupled to each other via the gate electrode.

6. The metal-insulator-semiconductor device of claim 4, wherein the interface protection layer comprises an oxide-based gate interface protection layer.

7. The metal-insulator-semiconductor device of claim 6, wherein the oxide-based gate interface protection layer comprises the oxidized portion of the channel layer that was annealed at or above about 780 degrees Celsius.

8. The metal-insulator-semiconductor device of claim 1, wherein at least one of the barrier layer or the channel layer comprises at least one of aluminum nitride (AlN), gallium nitride (GaN), or indium nitride (InN).

9. The metal-insulator-semiconductor device of claim 1, wherein the barrier layer comprises a group of layers comprising at least one of aluminum nitride (AlN), gallium nitride (GaN), or indium nitride (InN), and wherein at least one layer of the group of layers has a larger band gap than a bandgap of the channel layer.

10. The metal-insulator-semiconductor device of claim 1, further comprising:
a substrate of the metal-insulator-semiconductor device comprising at least one of a nucleation layer, silicon, sapphire, diamond, silicon carbide (SiC), aluminum nitride (AlN), or gallium nitride (GaN).

11. The metal-insulator-semiconductor device of claim 1, wherein the metal-insulator-semiconductor device comprises at least one of a metal-insulator semiconductor field-effect-transistor device comprising a fully recessed gate structure or a high electron mobility transistor device comprising a partially recessed gate structure.

12. A semiconductor device, comprising:
a substrate;
a buffer layer comprising a channel layer;
a recessed gate that is recessed into a portion of a barrier layer and the channel layer of the semiconductor device;
a gate interface protection layer adjacent to the channel layer, wherein the gate interface protection layer is located at a gate foot area of the recessed gate structure; and
a gate dielectric layer disposed between the gate interface protection layer and a gate electrode formed in the recessed gate, wherein the gate dielectric layer comprises a low-pressure chemical vapor deposited silicon nitride formation that was deposited at or above about 780 degrees Celsius, wherein an interface of the gate interface protection layer has a uniform surface morphology between the channel layer and the gate dielectric layer, wherein the gate interface protection layer comprises a plasma-enhanced chemical vapor silicon nitride deposition that was formed at the gate foot area of the recessed gate, and wherein the gate interface protection layer protects the channel layer from surface decomposition associated with gate dielectric deposition.

13. The semiconductor device of claim 12, wherein the substrate comprises at least one of a nucleation layer, silicon, sapphire, diamond, silicon carbide (SiC), aluminum nitride (AlN), or gallium nitride (GaN).

14. The semiconductor device of claim 12, wherein at least one of the buffer layer, the barrier layer, or the channel layer comprises at least one of aluminum nitride (AlN), gallium nitride (GaN), or indium nitride (InN).

15. The semiconductor device of claim 14, wherein the barrier layer comprises a group of layers comprising at least one of aluminum nitride (AlN), gallium nitride (GaN), or indium nitride (InN), and wherein at least one layer of the group of layers has a larger band gap than a bandgap of the channel layer.

16. The semiconductor device of claim 12, wherein the interface is a first interface, and wherein the channel layer comprises a channel at a region of the recessed gate comprising a metal-insulator-semiconductor at a second interface between the gate dielectric layer and the buffer layer.

17. The semiconductor device of claim 16, wherein the recessed gate comprises a region of the barrier layer that is removed to expose the channel.

18. The semiconductor device of claim 12, wherein the silicon nitride deposition comprises a low temperature deposition of a silicon oxynitride at or below about 300 degrees Celsius.

19. The semiconductor device of claim 12, wherein the recessed gate comprises at least one of a fully recessed gate region or a partially recessed gate region, and wherein the portion of the barrier layer is removed.

20. The semiconductor device of claim 12, further comprising:
a passivation layer disposed on the barrier layer.

21. The semiconductor device of claim 12, wherein the silicon nitride deposition comprises a nitride-based dielectric layer prepared at or below about 300 degrees Celsius.

22. A semiconductor device, comprising:
a recessed gate that is recessed into a portion of a barrier layer and a channel layer of the semiconductor device;
a gate interface protection layer adjacent to the channel layer, wherein the gate interface protection layer is located at a gate foot area of the recessed gate; and
a gate dielectric layer disposed between the gate interface protection layer and a gate electrode formed in the recessed gate, wherein the gate dielectric layer comprises a low-pressure chemical vapor deposited silicon nitride formation that was deposited at or above about 780 degrees Celsius, wherein an interface of the gate interface protection layer exhibits a uniform surface morphology between the channel layer and the gate dielectric layer, and wherein the gate interface protection layer comprises a plasma-enhanced chemical vapor silicon nitride deposition that was formed at the gate foot area of the recessed gate and that protects the channel layer from surface decomposition associated with gate dielectric deposition.

23. The semiconductor device of claim 22, wherein the recessed gate comprises at least one of a fully recessed gate region or a partially recessed gate region, and wherein the portion of the barrier layer of the device is removed.

24. The semiconductor device of claim 23, further comprising:
a passivation layer disposed on the barrier layer.

25. The semiconductor device of claim 24, wherein the gate electrode is operatively coupled to the recessed gate.

26. The semiconductor device of claim 22, further comprising:
a substrate of the semiconductor device comprising at least one of a nucleation layer, silicon, sapphire, diamond, silicon carbide (SiC), aluminum nitride (AlN), or gallium nitride GaN).

27. The semiconductor device of claim 22, wherein at least one of the barrier layer or the channel layer comprises at least one of aluminum nitride (AlN), gallium nitride (GaN), or indium nitride (InN).

28. The semiconductor device of claim 22, wherein the barrier layer comprises a group of layers comprising at least one of aluminum nitride (AlN), gallium nitride (GaN), or indium nitride (InN), and wherein at least one layer of the group of layers has a larger band gap than a bandgap of the channel layer.

29. The semiconductor device of claim 22, wherein the gate interface protection layer comprises the plasma-enhanced chemical vapor silicon nitride deposition that was formed at or below about 300 degrees Celsius.

* * * * *